(12) United States Patent
Kanchiku et al.

(10) Patent No.: US 7,955,781 B2
(45) Date of Patent: Jun. 7, 2011

(54) NEGATIVE-WORKING PHOTOSENSITIVE MATERIAL AND NEGATIVE-WORKING PLANOGRAPHIC PRINTING PLATE PRECURSOR

(75) Inventors: Shigefumi Kanchiku, Shizuoka-ken (JP); Toyohisa Oya, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 451 days.

(21) Appl. No.: 12/236,525

(22) Filed: Sep. 24, 2008

(65) Prior Publication Data
US 2009/0087780 A1     Apr. 2, 2009

(30) Foreign Application Priority Data
Sep. 28, 2007   (JP) ................................. 2007-256346

(51) Int. Cl.
*G03F 7/004*   (2006.01)
(52) U.S. Cl. ..................... 430/271.1; 430/302; 101/465; 101/467
(58) Field of Classification Search ............... 430/271.1, 430/302; 101/465, 467
See application file for complete search history.

(56) References Cited

U.S. PATENT DOCUMENTS

| | | | | |
|---|---|---|---|---|
| 6,811,950 B2 * | 11/2004 | Kondo et al. | ............... | 430/271.1 |
| 6,830,874 B2 * | 12/2004 | Kondo et al. | ................. | 430/302 |

FOREIGN PATENT DOCUMENTS

| | | |
|---|---|---|
| EP | 1170149 A2 | 1/2002 |
| EP | 1231074 A2 | 8/2002 |
| EP | 1276013 A2 | 1/2003 |
| EP | 1696268 A2 | 8/2006 |
| EP | 1832928 A2 | 9/2007 |
| JP | 11-109641 A | 4/1999 |
| JP | 2001-272787 A | 10/2001 |

* cited by examiner

*Primary Examiner* — John S Chu
(74) *Attorney, Agent, or Firm* — Sughrue Mion, PLLC

(57) ABSTRACT

A negative-working photosensitive material is provided which includes: a support; an undercoat layer; and a photosensitive layer including a polymerization initiator, a polymerizable compound, and a binder polymer, wherein the support, the undercoat layer, and the photosensitive layer are sequentially layered, the undercoat layer includes a polymer including a structural unit (a) including at least one of a carboxylic acid or a carboxylic acid salt and a structural unit (b) including at least one carboxylic acid ester; and the content of the structural unit (a) in the polymer is from 30% to 90% by mole. Also, a negative-working planographic printing plate precursor including the negative-working photosensitive material is provided.

15 Claims, No Drawings

NEGATIVE-WORKING PHOTOSENSITIVE MATERIAL AND NEGATIVE-WORKING PLANOGRAPHIC PRINTING PLATE PRECURSOR

CROSS-REFERENCE TO RELATED APPLICATION

This application claims priority under 35 USC 119 from Japanese Patent Application (JP-A) No. 2007-256346, the disclosure of which is incorporated by reference herein.

BACKGROUND OF THE INVENTION

1. Technical Field

The present invention relates to a negative-working photosensitive material and a negative-working planographic printing plate precursor including the material. In particular, the invention relates to a negative-working photosensitive material which allows direct drawing by infrared laser light, and a negative-working planographic printing plate precursor including the material.

2. Related Art

Conventionally, a PS plate having a lipophilic photosensitive resin layer provided on a hydrophilic support has been widely used as a planographic printing plate precursor, and a desired printing plate is obtained by a plate-making method which usually involves mask exposure (surface exposure) via a lithographic film and then removal of non-image regions by dissolving. In recent years, digitalization techniques which involve electronic processing, accumulation and output of image information using computers have been spreading. A wide variety of new image output systems compatible with such digitalization techniques have come to be used in practical applications. As a result, there has been demand for computer-to-plate (CTP) techniques of producing a printing plate directly by scanning a highly directional light, such as laser light, according to digitalized image information, without employing a lithographic film. A critical technical issue has been the provision of a planographic printing plate precursor suitable for these techniques.

As a planographic printing plate precursor capable of such scanning exposure to light, a planographic printing plate precursor has been proposed which includes, on a hydrophilic support, a lipophilic photosensitive resin layer (hereinafter also referred to simply as a photosensitive layer) including a photosensitive compound capable of generating active species such as radicals or Bronsted acids by laser exposure, and has already been put on the market. When the planographic printing plate precursor is scanned with laser based on digital information, active species are generated. The action of the active species causes physical or chemical changes at the photosensitive layer, making the photosensitive layer insoluble, and by then developing the photosensitive layer, a negative planographic printing plate is obtained. A specific example thereof is a negative-working planographic printing plate precursor having, on a hydrophilic support, a photopolymerizable photosensitive layer including a photopolymerization initiator excellent in photosensitive speed, an ethylenically unsaturated compound capable of addition polymerization, and a binder polymer soluble in an alkali developer. The planographic printing plate precursor has the advantages of being excellent in productivity, convenient for development processing and having favorable resolution and ink affinity and, therefore, has a desirable printing performance.

In this kind of negative-working planographic printing plate precursor, in order to improve the adhesion between the photosensitive layer and the support, and the development removability of an unexposed portion of a photosensitive layer, an undercoat layer is usually provided between the support and the photosensitive layer (see for example, JP-A No. 2001-272787). However, depending on the state of the support, particularly when a support surface is roughened to improve the printing durability, the development removability of an unexposed portion of a photosensitive layer has been insufficient.

SUMMARY OF THE INVENTION

The invention provides a negative-working photosensitive material which provides improved developability of a non-image portion and has improved adhesion with a substrate, whereby both of stain resistance during printing and printing durability are secured, and also provides a negative-working planographic printing plate precursor including the negative-working photosensitive material.

According to an aspect of the invention, a negative-working photosensitive material includes:
a support;
an undercoat layer; and
a photosensitive layer including a polymerization initiator, a polymerizable compound, and a binder polymer, wherein:
the support, the undercoat layer, and the photosensitive layer are sequentially layered;
the undercoat layer includes a polymer including a structural unit (a) including at least one of a carboxylic acid or a carboxylic acid salt and a structural unit (b) including at least one carboxylic acid ester; and
the content of the structural unit (a) in the polymer is from 30% to 90% by mole.

According to another aspect of the invention, a negative-working planographic printing plate precursor includes the negative-working photosensitive material.

DETAILED DESCRIPTION OF THE INVENTION

According to the invention, a negative-working photosensitive material is provided which provides improved developability of a non-image portion and has improved adhesion with a substrate, whereby both of the stain resistance during printing and printing durability are secured. Moreover, a negative-working planographic printing plate precursor that includes the negative-working photosensitive material is provided.

Negative-Working Photosensitive Material

A negative-working photosensitive material of the invention will be described in detail.

A negative-working photosensitive material of the invention includes:
a support;
an undercoat layer; and
a photosensitive layer including a polymerization initiator, a polymerizable compound, and a binder polymer, wherein:
the support, the undercoat layer, and the photosensitive layer are sequentially layered;
the undercoat layer includes a polymer including a structural unit (a) containing at least one of a carboxylic acid or a carboxylic acid salt and a structural unit (b) containing at least one carboxylic acid ester; and
the content of the structural unit (a) in the polymer is from 30% to 90% by mole.

Herein, the phrase "sequentially layered" means that an undercoat layer and a photosensitive layer are disposed on a support in this order. The phrase does not exclude the presence of another layer (such as an intermediate layer, a backcoat layer, or an overcoat layer) which may be disposed depending on the purpose.

Undercoat Layer

In the beginning, an undercoat layer will be described.

An undercoat layer in a negative-working photosensitive material of the invention includes a polymer (which may be hereinafter referred to as a "specified polymer") including a structural unit (a) containing at least one of a carboxylic acid or a carboxylic acid salt (which may be hereinafter referred to as a "structural unit (a)") and a structural unit (b) containing at least one carboxylic acid ester (which may be hereinafter referred to as a "structural unit (b)"), the content of the structural unit (a) in the specified polymer being from 30% to 90% by mole.

Structural Unit (a) Containing at Least One of Carboxylic Acid or Carboxylic Acid Salt The structural unit (a) is preferably a structural unit represented by the following formula (a).

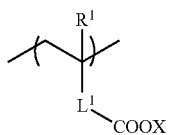

Formula (a)

In the formula (a), $R^1$ represents a hydrogen atom, a substituent having 1 to 30 carbon atoms, or a halogen atom, X represents a hydrogen atom or a counter cation that is necessary to neutralize a charge, and $L^1$ represents a single bond or a divalent linking group.

Examples of the substituent which is represented by $R^1$ and has 1 to 30 carbon atoms include a methyl group, an ethyl group, a propyl group, a butyl group, a pentyl group, a hexyl group, a cyclohexyl group, a methoxy group, an ethoxy group, a butoxy group, an acetoxy group, a propionyloxy group, a methoxycarbonyl group, an ethoxycarbonyl group, and a cyano group. Examples of the halogen atom represented by $R^1$ include a fluorine atom, a chlorine atom, a bromine atom, and an iodine atom.

$R^1$ in the formula (a) more preferably represents a hydrogen atom, a methyl group, a fluorine atom, or a chlorine atom, and particularly preferably represents a hydrogen atom or a methyl group.

Examples of the divalent linking group represented by $L^1$ include an arylene group, a carbonyl group, —$CR_2$—, —O—, —C=O—, —S—, —S=O—, —S(=O)$_2$—, —NR—, a vinylene group, a phenylene group, a cycloalkylene group, a naphthylene group, a biphenylene group and a combination of these structural units, wherein R represents a hydrogen atom or a substituent. More preferable examples of $L^1$ include a single bond, —O(CH$_2$)$_p$—, NH(CH$_2$)$_q$—, —COO—, —CONH— (wherein p and q each represent an integer of from 0 to 20), and a phenylene group. Particularly preferable examples of $L^1$ include a single bond, —COO—, —CONH—, and a phenylene group, and a single bond is most preferred.

When X is a hydrogen atom, the structural unit (a) becomes a structural unit containing carboxylic acid and, when X is a counter cation necessary to neutralize the charge, the structural unit (a) becomes a structural unit containing a carboxylic acid salt. Examples of the counter cation represented by X include known counter cations, and preferable examples thereof include alkali metal ions (such as ions of lithium, sodium, potassium, or the like), metal ions of group-II metals (such as magnesium, calcium, strontium, and barium), other metal ions (such as ions of aluminum, titanium, iron, zinc, or the like), an ammonium ion, and organic ammonium ions (such as ions of methylammonium, ethylammonium, diethylammonium, dimethylammonium, trimethylammonium, triethylammonium, tetraethylammonium, tetramethylammonium, tetrabutylammonium, pyridinium, morpholium, guanidium, or the like). More preferable examples thereof include alkali metal ions, metal ions of group-II metals, an ammonium ion, and organic ammonium ions, and particularly preferable examples thereof include a sodium ion, a potassium ion, and a lithium ion.

Hereinafter, specific examples of the structural unit (a) will be shown. However, the invention is not limited thereto.

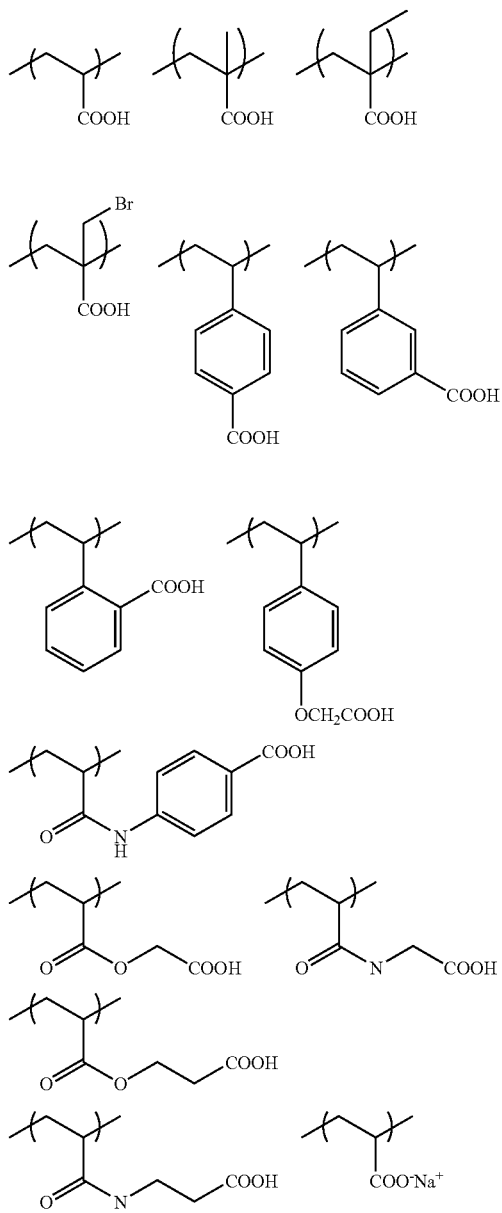

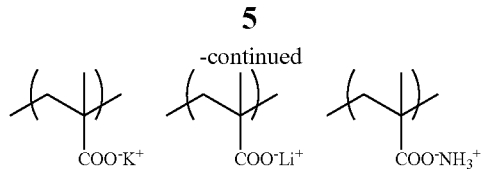

Structural Unit (b) Containing at Least One Carboxylic Acid Ester

The structural unit (b) preferably has a structure represented by the following formula (b).

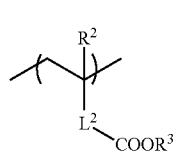

Formula (b)

In the formula (b), $R^2$ represents a hydrogen atom, a substituent having 1 to 30 carbon atoms, or a halogen atom; $R^3$ represents a substituent having 1 to 30 carbon atoms; and $L^2$ represents a single bond or a divalent linking group. Examples of the divalent linking groups represented by $L^2$ include an arylene group, a carbonyl group, $-CR_2-$, $-O-$, $-C=O-$, $-S-$, $-S=O-$, $-S(=O)_2-$, $-NR-$, a vinylene group, a phenylene group, a cycloalkylene group, a naphthylene group, a biphenylene group (wherein R represents a hydrogen atom or a substituent), and a combination of these structural units. $L^2$ most preferably represents a single bond.

Examples of the substituent which is represented by $R^2$ and has 1 to 30 carbon atoms include a methyl group, an ethyl group, a propyl group, a butyl group, a pentyl group, a hexyl group, a cyclohexyl group, a methoxy group, an ethoxy group, a butoxy group, an acetoxy group, a propionyloxy group, a methoxycarbonyl group, an ethoxycarbonyl group, and a cyano group. Examples of the halogen atom include a fluorine atom, a chlorine atom, a bromine atom, and an iodine atom. $R^2$ more preferably represents a hydrogen atom, a methyl group, an ethyl group, a fluorine atom, or a chlorine atom, and particularly preferably represents a hydrogen atom or a methyl group.

Furthermore, examples of the substituent which is represented by $R^3$ and has 1 to 30 carbon atoms include alkyl groups (such as a methyl group, an ethyl group, a propyl group, an isopropyl group, a butyl group, a hexyl group, an octyl group, a cyclohexyl group, a 2-ethylhexyl group, a benzyl group, a 2-hydroxyethyl group, and a 2-methoxyethyl group) and aryl groups (such as a phenyl group, a 4-methoxyphenyl group, and a naphthalenyl group). More preferable examples thereof include a methyl group, an ethyl group, a propyl group, an isopropyl group, a butyl group, a hexyl group, an octyl group, a cyclohexyl group, a 2-ethylhexyl group, a benzyl group, a 2-hydroxyethyl group, and a 2-methoxyethyl group. Particularly preferable examples thereof include a methyl group, an ethyl group, a propyl group, an isopropyl group, a butyl group, a hexyl group, a 2-ethylhexyl group, a 2-hydroxyethyl group, and a 2-methoxyethyl group, and most preferable examples thereof include an alkyl group having 1 to 30 carbon atoms.

Hereinafter, specific examples of the structural units (b) will be shown. However, the invention is not limited thereto.

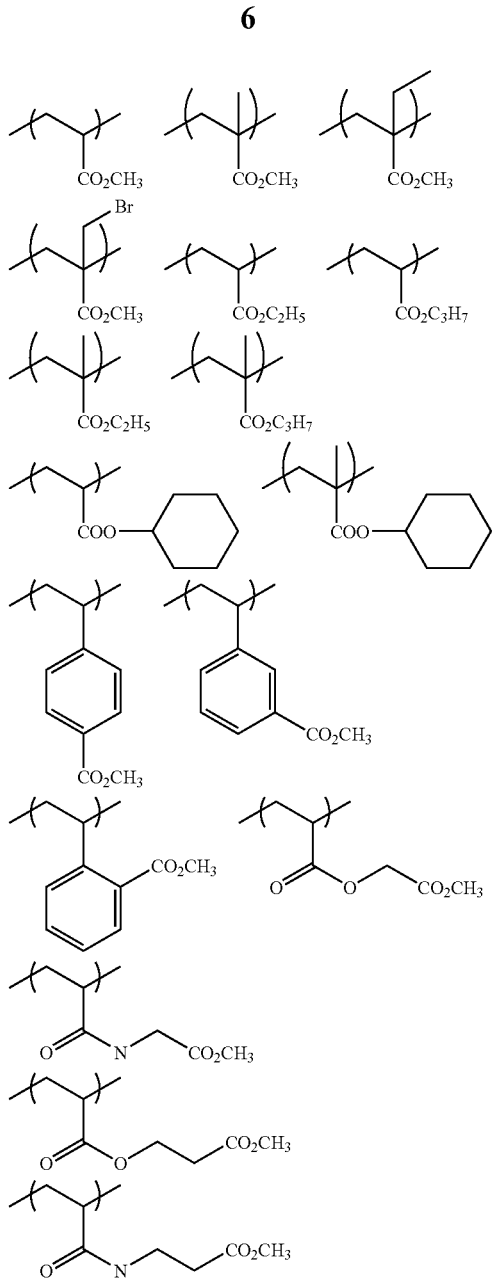

The content of the structural units (a) to the total structural units in the specified polymer is preferably from 30% to 90% by mole, more preferably from 30% to 80% by mole, and still more preferably from 35% to 70% by mole. When the content of the structural unit (a) is less than 30% by mole, the effect of stain resistance during printing may not be obtained. Furthermore, when the content exceeds 90% by mole, printing durability may not be obtained.

On the other hand, the content of the structural units (b) with respect to the total structural units in the polymer is preferably from 1% to 70% by mole, more preferably from 20% to 70% by mole, and still more preferably from 30% to 65% by mole.

Furthermore, the carboxylic acid of the structural unit (a) may be neutralized and the degree of neutralization in this case is preferably from 0% to 100%, more preferably from 20% to 80%, and still more preferably from 30% to 60%.

When the carboxylic acid of the structural unit (a) is neutralized, the carboxylic acid may be inhibited from eluting to a solvent (i.e. a solvent of a photosensitive layer coating solution) used when a photosensitive layer as described below is applied.

On the other hand, it is preferable that the specified polymer is substantially free from acid other than carboxylic acid. Herein, the phrase "substantially free from acid other than carboxylic acid" means that the polymer units do not contain 5% by mole or more of acid other than carboxylic acid. In the specified polymer, the content of acid other than carboxylic acid is preferably 3% by mole or less and more preferably 2% by mole or less. When the specified polymer is substantially free from acid other than carboxylic acid, the effect of stain resistance during printing becomes pronounced.

The weight average molecular weight of the specified polymer is preferably from 5,000 to 200,000, more preferably from 8,000 to 150,000, and still more preferably 10,000 to 100,000.

Hereinafter, exemplary compounds (a-1) to (a-10) will be shown as specific examples of the specified polymers. However, the invention is not limited thereto. In the specific examples shown below, Mw represents a weight average molecular weight of the specified polymer and a numerical value adjacent to a bracket represents a mole ratio (mol %).

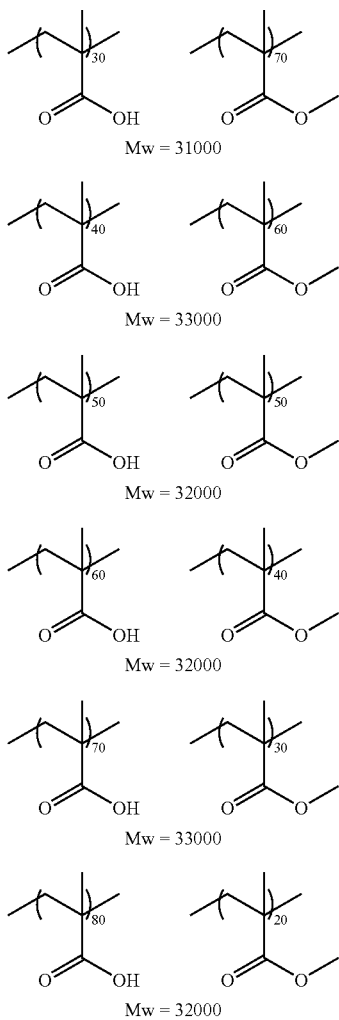

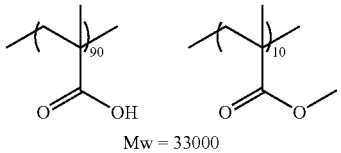

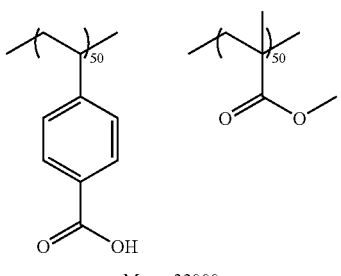

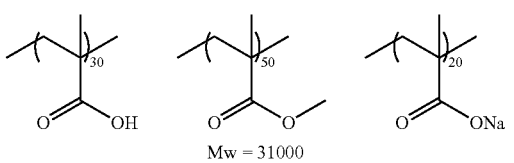

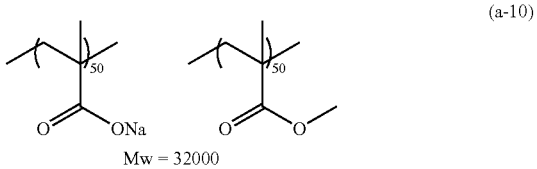

An undercoat layer may be formed by applying an undercoat layer coating solution including the specified polymer for an undercoat layer on a support. A coating amount of the undercoat layer coating solution is from 1 to 1,000 mg/m$^2$, preferably from 1 to 50 mg/m$^2$, and more preferably from 5 to 20 mg/m$^2$. When the coating amount is less than 1 mg/m$^2$, the effect of inhibiting a substrate from being stained may be deteriorated. On the other hand, when the coating amount is more than 1,000 mg/m$^2$, the printing durability may be adversely affected.

Furthermore, the undercoat layer coating solution may also include, within a range that does not damage the effect of the invention, an optional component such as a pH adjusting agent (such as phosphoric acid, phosphonic acid, hydrochloric acid, and a low molecular organic sulfonic acid) or a wetting agent such as saponin.

Support

The support to be used in the negative-working photosensitive material of the invention may be a support that has been subjected to hydrophilicity-imparting treatment as will be described later. Examples of the support include paper, a polyester film, and an aluminum plate. Of these, an aluminum plate is preferable since the plate has excellent dimensional stability, is relatively inexpensive, and can be provided with excellent surface hydrophilicity and strength by an optional surface treatment. A composite sheet in which an aluminum sheet is bonded onto a polyethylene terephthalate film as described in JP-B No. 48-18327 may also be used as the support.

An example of the aluminum plate as the most preferable support in the invention is a metal plate made mainly of aluminum, which is dimensionally stable. Specific examples thereof include a pure aluminum plate, an alloy plate including aluminum as a main component and a trace amount of a different element, and a plastic film or paper piece on which aluminum (or aluminum alloy) is laminated or deposited. Hereinafter, supports including aluminum or an aluminum alloy are generally called aluminum supports. Examples of the different element included in the aluminum alloy include silicon, iron, manganese, copper, magnesium, chromium, zinc, bismuth, nickel, and titanium. The amount of the different element(s) in the alloy is 10% or less by mass. In an exemplary embodiment of the invention, a pure aluminum plate is preferable. However, it is difficult to produce absolutely pure aluminum from the viewpoint of refining technique. Thus, an aluminum plate may include a slight amount of the different element(s). As described above, the composition of aluminum plate to be used in the invention is not limited, and the material of the aluminum plate may be appropriately selected from materials known or used in the technical field, such as JIS A 1050, JIS A 1100, JIS A 3103, and JIS A 3005 materials.

The thickness of the aluminum support used in the invention is from about 0.1 to about 0.6 mm. The thickness may be appropriately changed in accordance with the size of the printing machine, the size of the printing plate, and user's request.

The aluminum support may be subjected to a surface treatment described below, so as to be made hydrophilic.

Surface-Roughening Treatment

The surface-roughening treatment may be a mechanical treatment as disclosed in JP-A No. 56-28893, chemical etching, electrolytic graining, or the like. The surface-roughening treatment may also be an electrochemical surface-roughening method of roughening the support surface electrochemically in a hydrochloric acid or nitric acid electrolyte, or a mechanical surface-roughening method such as a wire brush graining method of brushing the surface of aluminum with a metallic wire, a ball graining method of polishing the surface of aluminum with polishing beads and a polishing agent or a brush graining method of roughening the surface with a nylon brush and a polishing agent. One of these surface-roughening methods may be used alone, or two or more of them may be used in combination. Of these methods, a method useful for the surface-roughening is the electrochemical surface-roughening method of roughening the support surface electrochemically in a hydrochloric acid or nitric acid electrolyte. The electric quantity suitable for the method is from 50 to 400 $C/dm^2$, when the support serves as an anode. More specifically, alternate and/or direct current electrolysis is preferably carried out in an electrolyte having hydrochloric acid or nitric acid content of 0.1 to 50% by mass at a temperature of from 20 to 80° C. and an electric current density of 100 to 400 $C/dm^2$ for 1 second to 30 minutes.

The aluminum support thus surface-roughened may be chemically etched in an acid or alkaline solution. Preferable examples of the etching agent include sodium hydroxide, sodium carbonate, sodium aluminate, sodium metasilicate, sodium phosphate, potassium hydroxide, and lithium hydroxide. The concentration of the etching agent is preferably from 1 to 50% by mass, and the temperature of the etching agent is preferably from 20 to 100° C. In order to remove stains (smuts) that remain on the etched surface, the substrate may be washed with acid. Typical examples of the acid to be used include nitric acid, sulfuric acid, phosphoric acid, chromic acid, hydrofluoric acid, and fluoroboric acid. A method for removing smuts on an electrochemically roughened surface is preferably a method described in JP-A No. 53-12739 in which a surface is brought into contact with 15 to 65% by mass of sulfuric acid at a temperature in the range of from 50 to 90° C., or a method described in JP-B 48-28123 in which a surface is etched with alkali. The method and conditions are not particularly limited, as long as the surface roughness Ra of the roughened surface is about 0.2 µm to 0.5 µm after the treatment.

Anodizing Treatment

The aluminum support thus treated, on which an oxide layer is formed, may be subjected to an anodizing treatment.

In the anodizing treatment, an aqueous solution of any one of sulfuric acid, phosphoric acid, oxalic acid, boric acid, or sodium borate may be used alone as the major component in an electrolytic bath, or an aqueous solution of a combination of two or more of such substances may be used. In this case, the electrolytic solution may, of course, include at least components normally included in the Al alloy plate, the electrodes, tap water and underground water. A second component, or second and third components may also be included. Examples of the second component or second and third components described above include: cations of metals such as Na, K, Mg, Li, Ca, Ti, Al, V, Cr, Mn, Fe, Co, Ni, Cu or Zn, and ammonium ions; and anions such as a nitrate ion, a carbonate ion, a chlorine ion, a phosphate ion, a fluorine ion, a sulfite ion, a titanate ion, a silicate ion or a borate ion. The concentration of the cation or the anion in the electrolytic solution may be from about 0 to 10000 ppm. Although the conditions for the anodizing treatment are not particularly limited, the plate is preferably treated at a temperature of 10 to 70° C. by direct current or alternating current electrolysis in a range of an electric current density of 0.1 to 40 $A/m^2$. The thickness of the anodized layer thus formed may be in the range of from 0.5 µm to 1.5 µm, preferably in the range of from 0.5 µm to 1.0 µm. Conditions for the anodizing treatment are preferably selected so that the resultant support has a pore diameter of micropores present in the anodized layer thereof of from 5 to 10 nm and a pore density thereof of from $8\times10^{15}$ to $2\times10^{16}$ per square meter.

The treatment for imparting hydrophilicity to the surface of the support may be selected from various known methods. The treatment is particularly preferably hydrophilicity-imparting treatment with a silicate, polyvinylphosphonic acid, or the like. The resultant layer may have a Si or P element content of from 2 to 40 $mg/m^2$, preferably from 4 to 30 $mg/m^2$. The coating amount can be measured by fluorescence X ray analysis.

In the hydrophilicity-imparting treatment, the aluminum support having an anodized layer formed thereon is dipped in an aqueous solution at pH 10 to 13 (determined at 25° C.) including an alkali metal silicate or polyvinylphosphonic acid in an amount of from 1 to 30 mass %, and more preferably from 2 to 15 mass %, for example at from 15 to 80° C. for from 0.5 to 120 seconds.

Examples of the alkali metal silicate used in the hydrophilicity-imparting treatment include sodium silicate, potassium silicate, and lithium silicate. Examples of a hydroxide used to increase the pH of the aqueous solution of the alkali metal silicate include sodium hydroxide, potassium hydroxide, and lithium hydroxide. An alkaline earth metal salt or a salt of a metal in the group IVB may be incorporated into the treating solution. Examples of the alkaline earth metal salt include nitrates such as calcium nitrate, strontium nitrate, magnesium nitrate, and barium nitrate, sulfates, hydrochlorides, phosphates, acetates, oxalates, borates, and other water-soluble salts. Examples of the salt of a metal in the group IVB include titanium tetrachloride, titanium trichloride, titanium potassium fluoride, titanium potassium oxalate, titanium sulfate, titanium tetraiodide, zirconium chlorooxide, zirconium dioxide, zirconium oxychloride, and zirconium tetrachloride.

One of the alkaline earth metal salts or the salts of a metal in the group IVB may be used alone, or two or more thereof may be used in combination. The amount of the metal salt(s) in the treating solution is preferably from 0.01 to 10% by mass, more preferably from 0.05 to 5.0% by mass. Also, it is effective to use silicate electrodeposition as described in U.S. Pat. No. 3,658,662. Furthermore, it is preferable to subject a support which has been subjected to electrolytic graining, as disclosed in JP-B No. 46-27481, and JP-A Nos. 52-58602 and 52-30503, to a surface treatment that is a combination of the anodizing treatment with the hydrophilicity-imparting treatment.

Photosensitive Layer

A photosensitive layer in the negative-working photosensitive material of the invention includes a polymerization initiator, a polymerizable compound, and a binder polymer. Such negative photosensitive layer has a mechanism in which, when energy is applied by exposure to light or the like, initiation species such as radicals are generated from the polymerization initiator, and the initiation species causes the polymerization reaction of the polymerizable compound.

Polymerization Initiator (C)

The photosensitive layer in the negative-working photosensitive material of the invention includes at least on polymerization initiator. The polymerization initiator used in the invention may be a compound which generates radicals upon heat and/or light energy to initiate and promote the polymerization of a compound having a polymerizable unsaturated group. Specific examples thereof include known radical generators. The radical generator used in the invention may be a known thermal polymerization initiator, a compound with smaller dissociation energy, or a photopolymerization initiator.

In the invention, from the viewpoint of the photosensitivity of the negative-working photosensitive material, the polymerization initiator is preferably a photopolymerization initiator, and it is more preferred that the polymerization initiator is a photopolymerization initiator and the photosensitive layer further includes a sensitizer that sensitizes the photopolymerization initiator.

Only one polymerization initiator (or a radical polymerization initiator) that generates radicals when energy is applied thereto may be used alone, or a combination of at least two thereof may be used in the negative-working photosensitive material.

Examples of the radical generator include (A) an organic halogenated compound, (B) a carbonyl compound, (C) an organic peroxide compound, (D) an azo polymerization initiator, (E) an azido compound, (F) a metallocene compound, (G) a hexaarylbiimidazole compound, (H) an organic boric acid compound, (I) a disulfonic acid compound, (J) an oxime ester compound, and (K) an onium salt compound.

The respective compounds will be described hereinafter.

Examples of the organic halogenated compound (A) include compounds described in Wakabayashi et al., "Bull Chem. Soc. Japan" 42, 2924 (1969), U.S. Pat. No. 3,905,815, JP-B No. 46-4605, JP-A Nos. 48-36281, 55-32070, 60-239736, 61-169835, 61-169837, 62-58241, 62-212401, 63-70243 and 63-298339, and M. P. Hutt, "Journal of Heterocyclic Chemistry" 1 (No. 3), (1970), and the like. In particular, preferable are oxazole compounds and s-triazine compounds, each of which is substituted by a trihalomethyl group.

The organic halogenated compound is more preferably an s-triazine derivative wherein at least one mono-, di- or tri-halogen-substituted methyl group is bonded to an s-triazine ring, and specific examples thereof include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-($\alpha,\alpha,\beta$-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-1-propyloxystyryl)-4,6-bis(trichloromethyl)-s-triazine, 2-(p-tolyl)-4,6-bis(trichloromethyl)-s-triazine, 2-(4-naphthoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, and 2-methoxy-4,6-bis(tribromomethyl)-s-triazine.

Examples of the carbonyl compound (B) include benzophenone, benzophenone derivatives such as Michler's ketone, 2-methyl benzophenone, 3-methyl benzophenone, 4-methyl benzophenone, 2-chlorobenzophenone, 4-bromobenzophenone, and 2-carboxybenzophenone, acetophenone derivatives such as 2,2-dimethoxy-2-phenyl acetophenone, 2,2-diethoxy acetophenone, 1-hydroxycyclohexylphenyl ketone, $\alpha$-hydroxy-2-methyl phenyl propanone, 1-hydroxy-1-methylethyl-(p-isopropylphenyl) ketone, 1-hydroxy-1-(p-dodecylphenyl) ketone, 2-methyl-(4'-(methylthio) phenyl)-2-morpholino-1-propanone, and 1,1,1-trichloromethyl-(p-butylphenyl) ketone, thioxanthone, thioxanthone derivatives such as 2-ethyl thioxanthone, 2-isopropyl thioxanthone, 2-chlorothioxanthone, 2,4-dimethyl thioxanthone, 2,4-diethyl thioxanthone, and 2,4-diisopropyl thioxanthone, and benzoate esters such as ethyl p-dimethylaminobenzoate or ethyl p-diethylaminobenzoate.

Examples of the organic peroxide compound (C) include trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy) butane, tert-butylhydroperoxide, cumenehydroperoxide, diisopropylbenzenehydroperoxide, 2,5-dimethylhexane-2,5-dihydroperoxide, 1,1,3,3-tetramethylbutylhydroperoxide, tert-butylcumylperoxide, dicumylperoxide, 2,5-dimethyl-2,5-di(tert-butylperoxy)hexane, 2,5-oxanoylperoxide, succinic acid peroxide, benzoyl peroxide, 2,4-dichlorobenzoyl peroxide, diisopropylperoxy dicarbonate, di-2-ethylhexylperoxy dicarbonate, di-2-ethoxyethylperoxy dicarbonate, dimethoxyisopropylperoxy carbonate, di(3-methyl-3-methoxybutyl)peroxy dicarbonate, tert-butylperoxy acetate, tert-butylperoxy pivalate, tert-butylperoxyneodecanoate, tert-butylperoxy octanoate, tert-butylperoxy laurate, tertiary carbonate, 3,3',4,4'-tetra-(t-butylperoxycarbonyl)benzophenone, 3,3',4,4'-tetra-(t-hexylperoxycarbonyl)benzophenone, 3,3',4,4'-tetra-(p-isopropylcumylperoxycarbonyl)benzophenone, carbonyldi(t-butylperoxydihydrogen diphthalate), and carbonyldi(t-hexylperoxydihydrogen diphthalate).

Examples of the azo polymerization initiator (D) include azo compounds described in JP-A No. 8-108621.

Examples of the azido compound (E) include 2,6-bis(4-azidobenzylidene)-4-methylcyclohexanone.

Examples of the metallocene compound (F) include various titanocene compounds described in JP-A Nos.

59-152396, 61-151197, 63-41484, 2-249, 2-4705, and 5-83588, such as di-cyclopentadienyl-Ti-bis-phenyl, di-cyclopentadienyl-Ti-bis-2,6-difluorophen-1-yl, di-cyclopentadienyl-Ti-bis-2,4-di-fluorophen-1-yl, di-cyclopentadienyl-Ti-bis-2,4,6-trifluorophen-1-yl, di-cyclopentadienyl-Ti-bis-2,3,5,6-tetrafluorophen-1-yl, di-cyclopentadienyl-Ti-bis-2,3,4,5,6-pentafluorophen-1-yl, di-methylcyclopentadienyl-Ti-bis-2,6-difluorophen-1-yl, di-methylcyclopentadienyl-Ti-bis-2,4,6-trifluorophen-1-yl, di-methylcyclopentadienyl-Ti-bis-2,3,5,6-tetrafluorophen-1-yl, and di-methylcyclopentadienyl-Ti-bis-2,3,4,5,6-pentafluorophen-1-yl, and iron-allene complexes described in JP-A Nos. 1-304453 and 1-152109.

Examples of the hexaarylbiimidazole compound (G) include various compounds described in JP-B No. 6-29285, U.S. Pat. Nos. 3,479,185, 4,311,783, and 4,622,286, such as 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methyl phenyl)-4,4',5,5'-tetraphenylbiimidazole, and 2,2'-bis(o-trifluorophenyl)-4,4', 5,5'-tetraphenyl biimidazole.

Examples of the organic boric aid compound (H) include organic borates described in, for example, JP-A No. 62-143044, JP-A No. 62-150242, JP-A No. 9-188685, JP-A No. 9-188686, JP-A No. 9-188710. JP-A No. 2000-131837, JP-A No. 2002-107916, Japanese Patent No. 2764769, JP-A No. 2002-116539, and Kunz, Martin 'Rad Tech' 98. Proceeding Apr. 19-22, 1998, Chicago", organic boron sulfonium complexes or organic boron oxosulfonium complexes described in JP-A No. 6-157623, JP-A No. 6-175564, and JP-A No. 6-175561, organic boron iodonium complexes described in JP-A No. 6-175554 and JP-A No. 6-175553, organic boron phosphonium complexes described in JP-A No. 9-188710, and organic boron transition metal coordination complexes described in JP-A No. 6-348011, JP-A No. 7-128785, JP-A No. 7-140589, JP-A No. 7-306527, and JP-A No. 7-292014.

Examples of the disulfone compound (I) include compounds described in JP-A Nos. 61-166544 and 2002-328465.

Examples of the oxime ester compound (J) include the compounds described in J.C.S. Perkin II (1979) P 1653-1660, J.C.S. Perkin II (1979) P 156-162, Journal of Photopolymer Science and Technology (1995) P 202-232, JP-A Nos. 2000-66385 and 2000-80068, and specific examples thereof include the compounds represented by the following structural formulae.

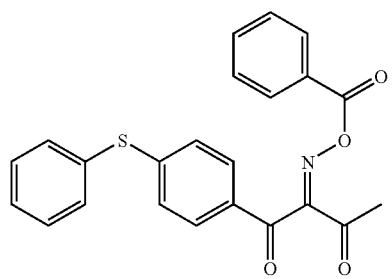

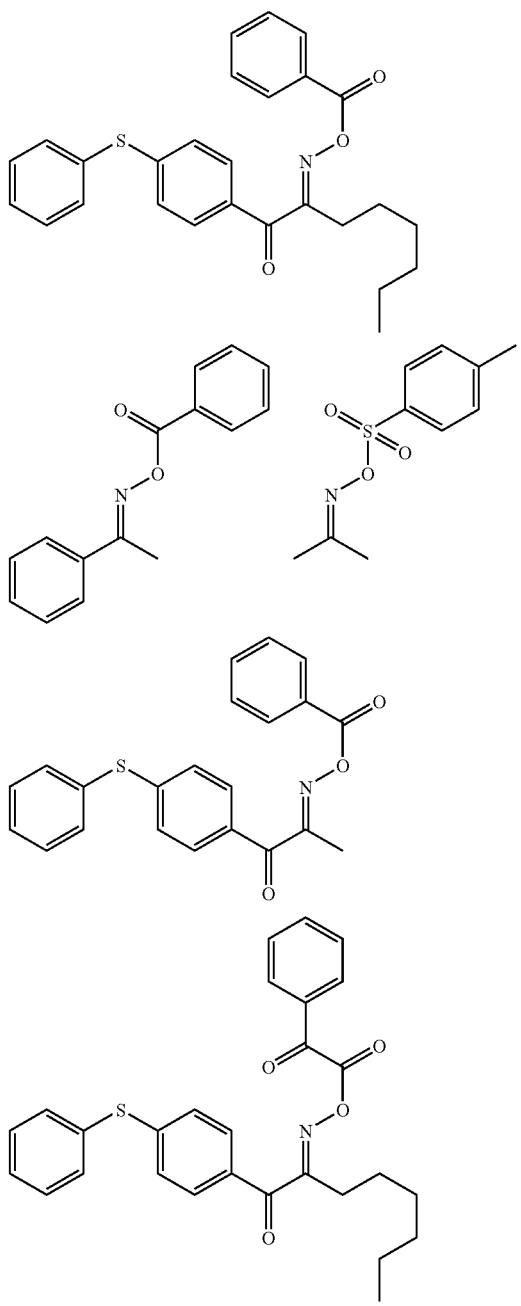

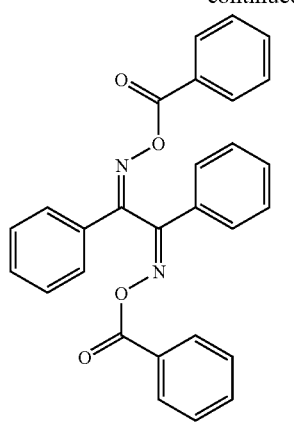
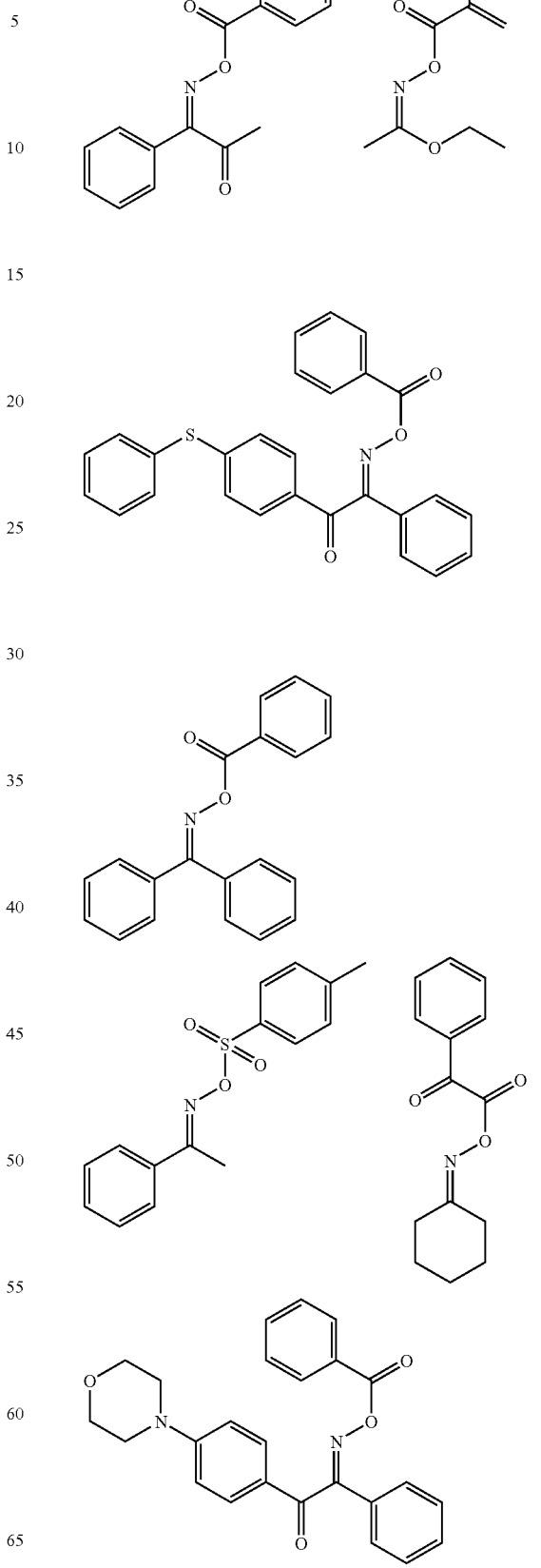

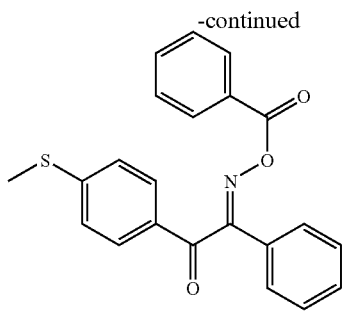

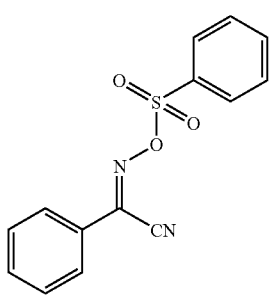

Examples of the onium salt compound (K) include diazonium salts described in S. I. Schlesinger, Photogr, Sci, Eng., 18, 387 (1974), T. S. Bal et al, Polymer, 21, 423 (1980), ammonium salts described in U.S. Pat. No. 4,069,055 and JP-A No. 4-365049, phosphonium salts described in U.S. Pat. Nos. 4,069,055 and 4,069,056, iodonium salts described in European Patent Application No. 104,143, JP-A No. 2-150848 and JP-A No. 2-296514, sulfonium salts described in European Patent Application No. 370,693, European Patent Application No. 390,214, European Patent Application No. 233,567, European Patent Application No. 297,443, European Patent Application No. 297,442, U.S. Pat. Nos. 4,933,377, 4,760,013, 4,734,444, 2,833,827, German Patent No. 2,904,626, German Patent No. 3,604,580, and German Patent No. 3,604,581, selenonium salts described in J. V. Crivello et al, Macromolecules, 10 (6), 1307 (1977), J. V. Crivello et al, J. Polymer Sci., Polymer Chem, Ed., 17, 1047 (1979), and arsonium salts described in C. S. Wen et al, Teh, Proc. Conf. Rad, Curing ASIA, p. 478, Tokyo, October (1988).

From the viewpoints of the reactivity and stability, the above-described oxime ester compounds and diazonium salts, iodonium salts, and sulfonium salts, which will be further described later, are particularly preferable examples of the polymerization initiator. In the invention, the onium salt functions not as an acid generator, but as an ionic radical polymerization initiator.

In the invention, the onium salts represented by the following formulae (RI-I) to (RI-III) are preferable.

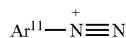
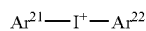

$Ar^{11}-\overset{+}{N}\equiv N$     Formula (RI-I)
$Z_{11}^{-}$ $Ar^{21}-I^{+}-Ar^{22}$     Formula (RI-II)
$Z_{21}^{-}$

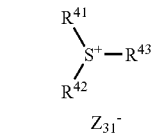

Formula (RI-III)

In the formula (RI-I), $Ar^{11}$ represents an aryl group having 20 or less carbon atoms, which may have 1 to 6 substituents, and the substituents are preferably selected from alkyl groups having 1 to 12 carbon atoms, alkenyl groups having 1 to 12 carbon atoms, alkynyl groups having 1 to 12 carbon atoms, aryl groups having 1 to 12 carbon atoms, alkoxy groups having 1 to 12 carbon atoms, aryloxy groups having 1 to 12 carbon atoms, halogen atoms, alkylamino groups having 1 to 12 carbon atoms, dialkylamino groups having 1 to 12 carbon atoms, alkyl amide groups having 1 to 12 carbon atoms, aryl amide groups having 1 to 12 carbon atoms, carbonyl groups, carboxyl groups, cyano groups, sulfonyl groups, thioalkyl groups having 1 to 12 carbon atoms, and thioaryl groups having 1 to 12 carbon atoms.

$Z_{11}^{-}$ represents a monovalent anion which may be selected from a halogen ion, a perchlorate ion, a hexafluorophosphate ion, a tetrafluoroborate ion, a sulfonate ion, a sulfinate ion, a thiosulfonate ion and a sulfate ion. $Z_{11}^{-}$ preferably represents a perchlorate ion, a hexafluorophosphate ion, a tetrafluoroborate ion, a sulfonate ion, a sulfinate ion, or a carboxylate ion from the viewpoint of stability and reactivity.

In the formula (RI-II), $Ar^{21}$ and $Ar^{22}$ each independently represent an aryl group having 20 or less carbon atoms, which may have 1 to 6 substituents, and the substituents are preferably selected from alkyl groups having 1 to 12 carbon atoms, alkenyl groups having 1 to 12 carbon atoms, alkynyl groups having 1 to 12 carbon atoms, aryl groups having 1 to 12 carbon atoms, alkoxy groups having 1 to 12 carbon atoms, aryloxy groups having 1 to 12 carbon atoms, halogen atoms, alkylamino groups having 1 to 12 carbon atoms, dialkylamino groups having 1 to 12 carbon atoms, alkyl amide groups having 1 to 12 carbon atoms, aryl amide groups having 1 to 12 carbon atoms, carbonyl groups, carboxyl groups, cyano groups, sulfonyl groups, thioalkyl groups having 1 to 12 carbon atoms, and thioaryl groups having 1 to 12 carbon atoms.

$Z_{21}^{-}$ represents a monovalent anion which may be selected from a halogen ion, a perchlorate ion, a hexafluorophosphate ion, a tetrafluoroborate ion, a sulfonate ion, a sulfinate ion, a thiosulfonate ion and a sulfate ion. $Z_{21}^{-}$ preferably represents a perchlorate ion, a hexafluorophosphate ion, a tetrafluoroborate ion, a sulfonate ion, or a sulfinate ion from the viewpoint of stability.

In the formula (RI-III), $R^{41}$, $R^{42}$, and $R^{43}$ each independently represent an aryl group, an alkyl group, an alkenyl group, or an alkynyl group, which may have 20 or less of carbon atoms and 1 to 6 substituents, and is preferably an aryl group from the viewpoints of the reactivity and stability. Examples of preferable substituents include an alkyl group having 1 to 12 carbon atoms, an alkenyl group having 1 to 12 carbon atoms, an alkynyl group having 1 to 12 carbon atoms, an aryl group having 1 to 12 carbon atoms, an alkoxy group having 1 to 12 carbon atoms, an aryloxy group having 1 to 12 carbon atoms, a halogen atom, an alkylamino group having 1 to 12 carbon atoms, a dialkylamino group having 1 to 12 carbon atoms, an alkylamide group having 1 to 12 carbon atoms, an arylamide group having 1 to 12 carbon atoms, a carbonyl group, a carboxyl group, a cyano group, a sulfonyl group, a thioalkyl group having 1 to 12 carbon atoms, and a thioaryl group having 1 to 12 carbon atoms.

$Z_{31}^-$ represents a monovalent anion. Examples of the monovalent anion include a halogen ion, a perchlorate ion, a hexafluorophosphate ion, a tetrafluoroborate ion, a sulfonate ion, a sulfinate ion, a thiosulfonate ion, and a sulfate ion. From the viewpoints of the stability and reactivity, preferable examples of the monovalent anion include a perchlorate ion, a hexafluorophosphate ion, a tetrafluoroborate ion, a sulfonate ion, a sulfinate ion, and a carboxylate ion. In particular, a carboxylate ion described in JP-A 2001-343742 is preferred and a carboxylate ion described in JP-A 2002-148790 is more preferred.

Specific examples of the onium salt compound, which is preferably used as the polymerization initiator in the invention, are shown below. However, the onium salt compound is not limited thereto.

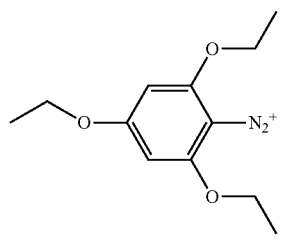

PF$_6^-$ (N-1)

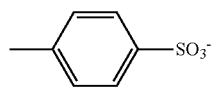

(N-2)

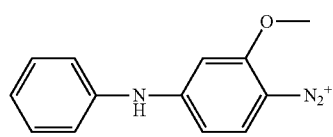

(N-3)

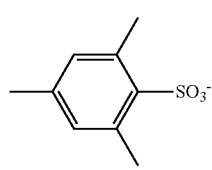

ClO$_4^-$ (N-4)

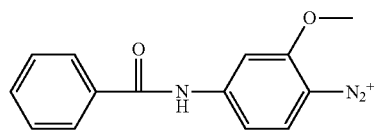

CF$_3$SO$_3^-$ (N-5)

BF$_4^-$ (N-6)

-continued

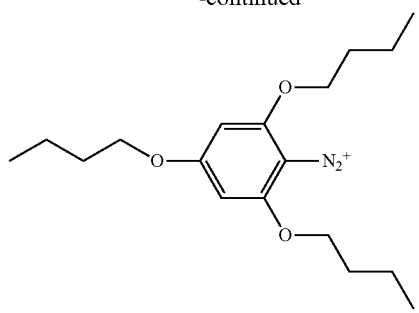

(N-7)

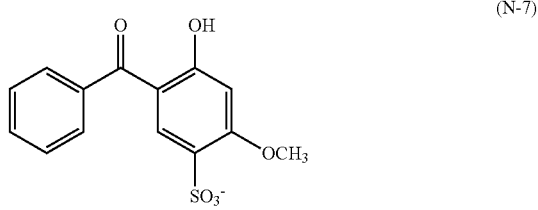

ClO$_4^-$ (N-8)

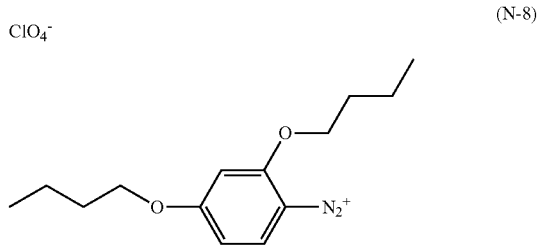

(N-9)

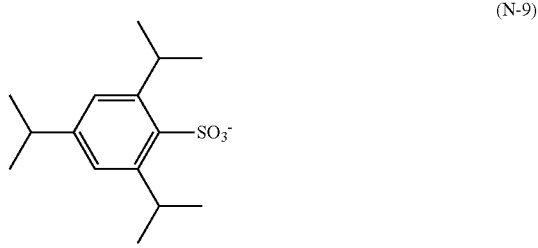

(N-10)

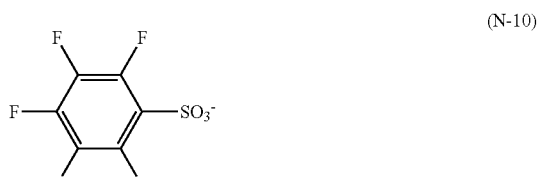

PF$_6^-$ (N-11)

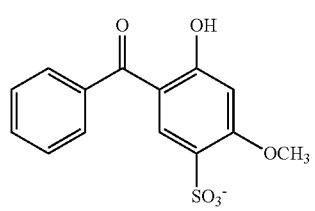 (N-12)
ClO$_4^-$
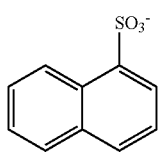 (N-13)
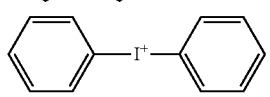 (N-14)
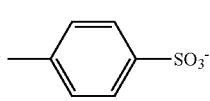 (I-1)
PF$_6^-$ (I-2)
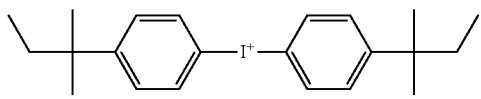
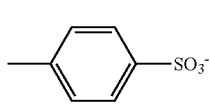 (I-3)
ClO$_4^-$ (I-4)
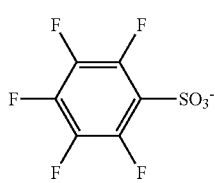 (I-5)
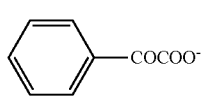 (I-6)
CF$_3$SO$_3^-$ (I-7)
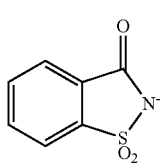 (I-8)
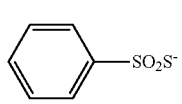 (I-9)
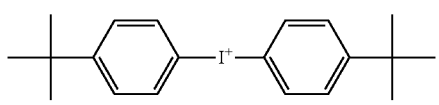
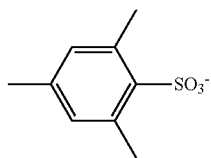 (I-10)
ClO$_4^-$ (I-11)
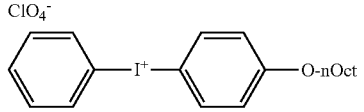
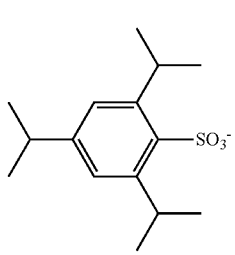 (I-12)
CF$_3$COO$^-$ (I-13)
CF$_3$SO$_3^-$ (I-14)
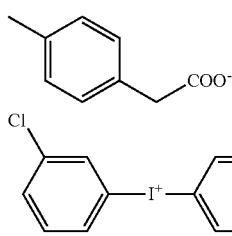 (I-15)
BF$_4^-$ (I-16)
 (I-17)
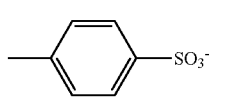 (I-18)
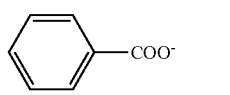
C$_4$F$_9$SO$_3^-$ (I-19)
PF$_6^-$ (I-20)
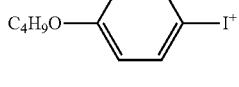
CF$_3$SO$_3^-$ (I-21)
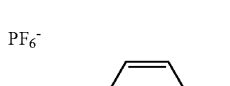
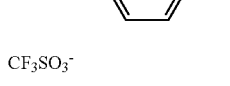
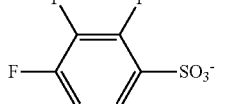
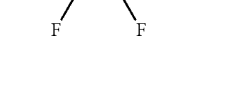 (I-22)

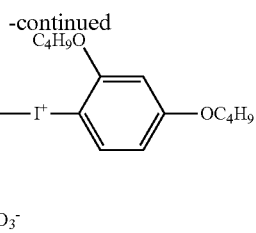
(I-23)
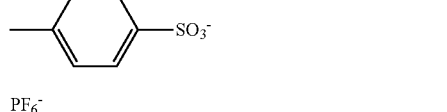
(I-24)
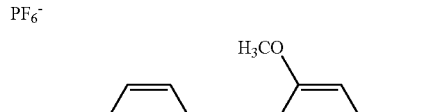
(I-25)
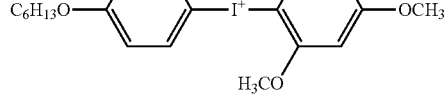
(I-26)
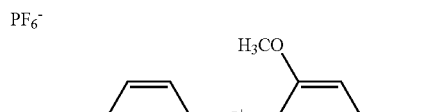
(I-27)
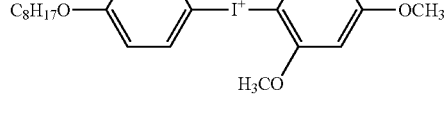
(S-1)
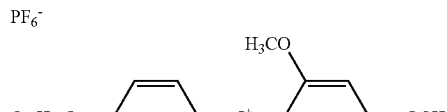
(S-2)
PF$_6^-$ (S-3)
ClO$_4^-$ (S-4)
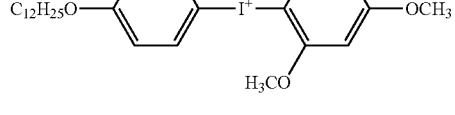
(S-5)
(S-6)
CF$_3$SO$_3^-$
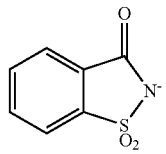
(S-7)
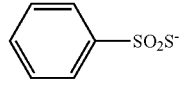
(S-8)
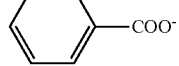
(S-9)
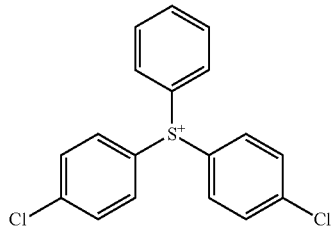
(S-10)
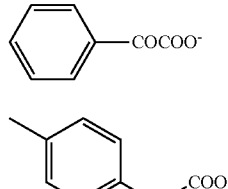
(S-11)
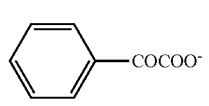
(S-12)
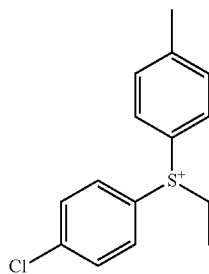
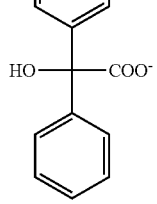
(S-13)
BF$_4^-$ (S-14)

-continued

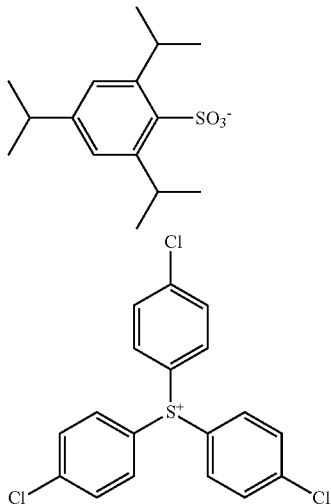
(S-15)

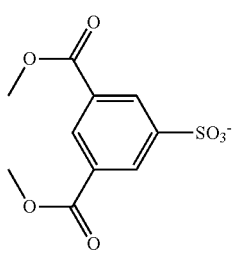
(S-16)

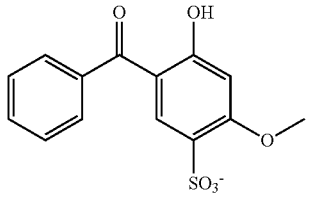
(S-17)

Of the above-mentioned compounds, the oxime ester compound (J), and the onium salt compound (K), examples of which include diazonium salts, iodonium salts and sulfonium salts, are preferable as the polymerization initiator in the invention, in particular, from the viewpoints of reactivity and stability. In the invention, the onium salt compound (K) functions not as an acid generator but as an ionic radical polymerization initiator.

From the viewpoint of the balance between the reactivity and the stability, a particularly preferable example of the polymerization initiator used in the invention is an iodonium salt having an electron-donating group or a sulfonium salt having an electron-withdrawing group. Moreover, an iodonium salt which has a skeleton having a cationic moiety and 2 or more alkoxy groups is preferred, and an iodonium salt which has a skeleton having a cationic moiety and 3 or more alkoxy groups is most preferred.

One of the polymerization initiators may be used alone, or a combination of at least two kinds thereof may be used in the photosensitive layer.

The amount of the polymerization initiator may be from 0.1 to 50% by mass, preferably from 0.5 to 30% by mass, and particularly preferably from 1 to 20% by mass, with respect to the total solid content of the photosensitive layer. When the amount falls within the above ranges, curability can be attained with high sensitivity, and when the composition is applied to a photosensitive layer of a planographic printing plate precursor, excellent sensitivity is achieved, and stain resistance of a non-image portion at the time of printing may be satisfactory.

The polymerization initiator may be added to a layer which includes other components, or added to a separately formed layer.

Polymerizable Compound

The polymerizable compound which may be used in the photosensitive layer of the negative-working photosensitive material of the invention is a polymerizable compound having at least one ethylenically unsaturated double bond. The polymerizable compound may be selected from compounds each having at least one terminal ethylenically unsaturated bond, and preferably selected from compounds each having two or more terminal ethylenically unsaturated bonds. A group of these compounds is well known in the industrial field. In the invention, these compounds may be used without any particular restriction. The compounds may take chemical forms such as monomer, prepolymer, (dimer, trimer or oligomer), and mixtures thereof, and copolymers thereof.

Examples of the monomer and the copolymer therefrom include unsaturated carboxylic acids (such as acrylic acid, methacrylic acid, itaconic acid, crotonic acid, isocrotonic acid or maleic acid), esters thereof, and amides thereof. Preferable examples thereof include esters each made from an unsaturated carboxylic acid and an aliphatic polyhydric alcohol, and amides each made from an unsaturated carboxylic acid and an aliphatic polyhydric amine. Other preferable examples thereof include: addition reaction products each made from (i) an unsaturated carboxylic acid ester or amide having a nucleophilic substituent such as a hydroxyl, amino or mercapto group, and (ii) a monofunctional or polyfunctional isocyanate or an epoxy; and dehydration condensation reaction products each made from (i) an unsaturated carboxylic acid ester or amide having a nucleophilic substituent such as a hydroxyl, amino or mercapto group, and (ii) a monofunctional or polyfunctional carboxylic acid. Further preferable examples thereof include: addition reaction products each made from an unsaturated carboxylic acid ester or amide having an electrophilic substituent such as an isocyanate or epoxy group, and a monofunctional or polyfunctional alcohol, amine or thiol; and substituent reaction products each made from an unsaturated carboxylic acid ester or amide having a leaving group such as a halogen or tosyloxy group, and a monofunctional or polyfunctional alcohol, amine, or thiol. In addition, other examples thereof include the compounds in which the unsaturated carboxylic acids are each substituted with an unsaturated phosphonic acid, styrene, vinyl ether, or the like.

Examples of the ester monomers between aliphatic polyhydric alcohols and unsaturated carboxylic acids include:

acrylic esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylol propane triacrylate, trimethylol propane tris(acryloyloxypropyl)ether, trimethylol ethane triacrylate, hexane diol diacrylate, 1,4-cyclohexane diol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tris(acryloyloxyethyl) isocyanurate, and polyester acrylate oligomers;

methacrylic esters such as tetramethylene glycol dimethacrylate, triethylene glycol dimethacrylate, neopentyl glycol dimethacrylate, trimethylol propane trimethacrylate, trimethylol ethane trimethacrylate, ethylene glycol dimethacrylate, 1,3-butanediol dimethacrylate, hexane diol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethyl methane, and bis[p-(methacryloxyethoxy)phenyl]dimethyl methane;

itaconic esters such as ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate;

crotonic esters such as ethylene glycol dicrotonate, tetramethylene glycol dicrotonate, pentaerythritol dicrotonate, and sorbitol tetradicrotonate;

isocrotonic esters such as ethylene glycol diisocrotonate, pentaerythritol diisocrotonate, and sorbitol tetraisocrotonate; and maleic esters such as ethylene glycol dimaleate, triethylene glycol dimaleate, pentaerythritol dimaleate, and sorbitol tetramaleate.

Other examples of the esters include aliphatic alcohol esters described in JP-B No. 46-27926, JP-B No. 51-47334 and JP-A No. 57-196231, those having an aromatic skeleton described in JP-A No. 59-5240, JP-A No. 59-5241 and JP-A No. 2-226149, and those having an amino group described in JP-A No. 1-165613. In an embodiment, a mixture of such ester monomers is used.

Examples of monomers of the amides between aliphatic polyvalent amine compounds and unsaturated carboxylic acids include methylene bis-acrylamide, methylene bis-methacrylamide, 1,6-hexamethylene bis-acrylamide, 1,6-hexamethylene bis-methacrylamide, diethylene triamine trisacrylamide, xylylene bisacrylamide, and xylylene bis-methacrylamide.

Examples of other preferable amide monomers include those having a cyclohexylene structure described in JP-B No. 54-21726.

In addition, addition-polymerizable urethane compounds produced by use of addition reaction between an isocyanate and a hydroxyl group are also preferable, and specific examples thereof include the vinylurethane compounds including two or more polymerizable vinyl groups in a molecule thereof, the compounds being prepared by addition-reacting a hydroxyl group-containing vinyl monomer represented by the following formula (i) to a polyisocyanate compound having two or more isocyanate groups in the molecule, which are described in JP-B No. 48-41708.

CH$_2$=C(R$^4$)COOCH$_2$CH(R$^5$)OH     (i)

In the formula (i), R$^4$ and R$^5$ each independently represent H or CH$_3$.

Further, urethane acrylates as described in JP-A No. 51-37193 and JP-B Nos. 2-32293 and 2-16765 and urethane compounds having an ethylene oxide skeleton as described in JP-B Nos. 58-49860, 56-17654, 62-39417 and 62-39418 may also be suitably used.

Furthermore, when an addition-polymerizable compound having an amino structure or a sulfide structure in the molecule like those described in JP-A Nos. 63-277653, 63-260909 and 1-105238 is used, a photopolymerizable composition that is excellent in photosensitizing speed can be obtained.

Other examples thereof include multifunctional acrylates and methacrylates such as polyester acrylates and epoxy acrylates obtained by reacting epoxy resin with (meth)acrylic acid, as described in JP-A No. 48-64183, JP-B No. 49-43191 and JP-B 52-30490. Specific unsaturated compounds described in JP-B No. 46-43946, JP-B No. 1-40337 and JP-B No. 1-40336 and vinyl phosphonic acid compounds described in JP-A No. 2-25493 can also be mentioned. In some cases, a structure containing a perfluoroalkyl group described in JP-A No. 61-22048 is preferably used. Photo-setting monomers and oligomers described in the Journal of Japanese Adhesive Society, vol. 20, No. 7, pp. 300-308 (1984) may also be used.

The structure, and particular methods of use (such as using a compound independently or in combination with other compounds) of the addition polymerizable compounds may be selected arbitrarily in accordance with the desired properties of a final polymerizable composition. When the polymerizable composition of the invention is used for, for example, a recording layer (i.e., photosensitive layer) of a negative planographic printing plate precursor, the selection of compound and/or method is made in consideration of achieving a structure including a large amount of unsaturated groups per molecule, which is preferable due to higher photosensitizing speed. In this respect, in many cases, a bifunctional or higher structure is preferable. From the viewpoint of increasing the strength of the resultant image portion (i.e., the cured film), a compound having a trifunctional or higher structure is preferable. It is also effective to use a combination of compounds having different numbers of functional groups and/or different polymerizable groups (such as an acrylic acid ester, a methacrylic acid ester, a styrene based compound, and a vinyl ether compound) for adjusting both of the photosensitivity and the strength. Compounds having a large molecular weight and compounds having a high hydrophobicity are excellent in photosensitizing speed or film strength, but may not be preferable from the viewpoints of developing speed or precipitation in a developer. The selection of the addition polymerizable compound and the method of use thereof are important factors also for compatibility or dispersibility of the compound with or in the other components (such as the binder polymer (b), the radical polymerization initiator (c), or a colorant) in the photosensitive layer. Compatibility may be improved by using, for example, a compound in a low-purity grade, or a combination of two or more of the compounds.

In the invention, one of the polymerizable compounds may be used alone, or two or more of them may be used in combination.

The amount of the polymerizable compound in a photosensitive layer of the negative-working photosensitive material of the invention is preferably from 5 to 80% by mass and more preferably from 25 to 75% by mass, with respect to non-volatile component.

Binder Polymer

A photosensitive layer in the negative-working photosensitive material of the invention includes at least one binder polymer, whereby the film properties of the photosensitive layer may be improved.

The binder polymer may be a linear organic polymer. The linear organic polymer may be any known linear organic polymer. The polymer is preferably selected from linear organic polymers which are soluble or swellable in water or weak alkaline water in order to achieve development with water or weak alkaline water. The linear organic polymers may be selected and used according to not only properties as a film forming agent, but also the kind of the developer to be used, such as water, weak alkaline water, or an organic solvent.

Examples of the binder polymer include acrylic resins, polyvinyl acetal resins, polyurethane resins, polyamide resins, epoxy resins, methacrylic resins, styrene resins, and polyester resins. Of those, acrylic resins and polyurethane resins are preferable.

Furthermore, the binder polymer may have crosslinking property to improve the film strength of the image portion to be obtained.

To impart the crosslinking property to the binder polymer, it is advisable to introduce a crosslinkable functional group such as an ethylenically unsaturated bond into the main chain of a polymer or a side chain thereof. The crosslinkable functional group may be introduced by copolymerization or polymer reaction.

The term "crosslinkable group" as used herein refers to a group that makes molecules of the binder polymer to be crosslinked with each other during radical polymerization reaction that occurs in the photosensitive layer when the negative-working photosensitive material is exposed to light. The crosslinkable group is not particularly limited as far as the group has such a function. Examples of the crosslinkable group include functional groups capable of undergoing addition polymerization reaction, such as an ethylenically unsaturated bond group, an amino group, or an epoxy group. The crosslinkable group may be a functional group capable of generating radicals by irradiation with light, and examples thereof include thiol groups, halogen groups, and onium salt structures. Of these groups, ethylenically unsaturated bond groups are preferable. Particularly preferable are functional groups represented by the following formulae (1) to (3).

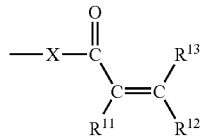

Formula (1)

In the formula (1), $R^{11}$ to $R^{13}$ each independently represent a hydrogen atom or a monovalent organic group. $R^{11}$ preferably represents a hydrogen atom, or a substituted or unsubstituted alkyl group. $R^{11}$ more preferably represents a hydrogen atom or a methyl group from the viewpoint of radical reactivity. $R^{12}$ and $R^{13}$ each independently represent a hydrogen atom, a halogen atom, an amino group, a carboxyl group, an alkoxycarbonyl group, a sulfo group, a nitro group, a cyano group, a substituted or unsubstituted alkyl group, a substituted or unsubstituted aryl group, a substituted or unsubstituted alkoxy group, a substituted or unsubstituted aryloxy group, a substituted or unsubstituted alkylamino group, a substituted or unsubstituted arylamino group, a substituted or unsubstituted alkylsulfonyl group, or a substituted or unsubstituted arylsulfonyl group. From the viewpoint of radical reactivity, $R^{12}$ and $R^{13}$ each preferably represent a hydrogen atom, or a carboxyl, alkoxycarbonyl, substituted or unsubstituted alky, or substituted or unsubstituted aryl group.

X represents an oxygen atom, a sulfur atom, or —N($R^{22}$)— wherein $R^{22}$ represents a hydrogen atom or a monovalent organic group. Examples of $R^{22}$ include substituted or unsubstituted alkyl groups. $R^{22}$ preferably represents a hydrogen atom, or a methyl, ethyl or isopropyl group from the viewpoint of high radical reactivity.

The alkyl group and the like represented by each of $R^{11}$ to $R^{13}$ optionally has a substituent, and examples of the substituent include halogen atoms, and alkyl, alkenyl, alkynyl, aryl, alkoxy, aryloxy, amino, alkylamino, arylamino, carboxyl, alkoxycarbonyl, sulfo, nitro, cyano, amide, alkylsulfonyl, and arylsulfonyl groups.

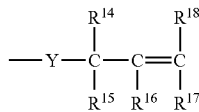

Formula (2)

In the formula (2), $R^{14}$ to $R^{18}$ each independently represent a hydrogen atom, a halogen atom, or a monovalent organic group. Preferable examples thereof include: hydrogen and halogen atoms; and amino, dialkylamino, carboxyl, alkoxycarbonyl, sulfo, nitro, cyano, substituted or unsubstituted alkyl, substituted or unsubstituted aryl, substituted or unsubstituted alkoxy, substituted or unsubstituted aryloxy, substituted or unsubstituted alkylamino, substituted or unsubstituted arylamino, substituted or unsubstituted alkylsulfonyl, and substituted or unsubstituted arylsulfonyl groups. Particularly preferable are a hydrogen atom, and carboxyl, alkoxycarbonyl, substituted or unsubstituted alkyl, and substituted or unsubstituted aryl groups.

The alkyl group and the like represented by each of $R^{14}$ to $R^{18}$ optionally has a substituent, and examples of the substituent are the same as in the case of the formula (1). Y represents an oxygen or sulfur atom, or —N($R^{22}$)— wherein $R^{22}$ has the same definition as $R^{22}$ in the formula (1). Preferable examples of $R^{22}$ in the formula (2) are also the same as those in the formula (1).

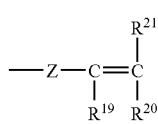

Formula (3)

In the formula (3), $R^{19}$ represents a hydrogen atom or a monovalent organic group, and preferably represents a hydrogen atom, or a substituted or unsubstituted alkyl group. In particular, $R^{19}$ preferably represents a hydrogen atom or a methyl group from the viewpoint of high radical reactivity. $R^{20}$ and $R^{21}$ each independently represent a hydrogen or halogen atom, or an amino, dialkylamino, carboxyl, alkoxycarbonyl, sulfo, nitro, cyano, substituted or unsubstituted alkyl, substituted or unsubstituted aryl, substituted or unsubstituted alkoxy, substituted or unsubstituted aryloxy, substituted or unsubstituted alkylamino, substituted or unsubstituted arylamino, substituted or unsubstituted alkylsulfonyl, or substituted or unsubstituted arylsulfonyl group. In particular, it is preferable that $R^{20}$ and $R^{21}$ each independently represent a hydrogen atom, or a carboxyl, alkoxycarbonyl, substituted or unsubstituted alkyl or substituted or unsubstituted aryl group from the viewpoint of high radical reactivity.

The alkyl group and the like represented by each of $R^{19}$ to $R^{21}$ optionally has a substituent, and examples of the substituent are the same as in the case of the formula (1). Z represents an oxygen or sulfur atom, —N($R^{23}$)— wherein $R^{23}$ is selected from substituted or unsubstituted alkyl groups and the like, or a substituted or unsubstituted phenylene group. In particular, it is preferable that $R^{23}$ represents a methyl, ethyl or isopropyl group from the viewpoint of high radical reactivity.

Of the above-mentioned binder polymers, more preferable are (meth)acrylic acid copolymer having, in a side chain thereof, a crosslinkable group, and polyurethane.

The binder polymer having crosslinking property may be cured as follows: for example, free radicals (polymerization initiating radicals or propagating radials in the polymerization step of the polymerizable compound) are added to the crosslinkable group of the binder polymer, and addition polymerization is attained, directly or through polymerization chains of the polymerizable compound, between molecules of the binder polymer, so that linkages are formed between the polymer molecules. Alternatively, the binder polymer may be cured as follows: atoms (for example, hydrogen atoms on the carbon atoms adjacent to the functional crosslinkable groups) in the polymer are abstracted by free radicals, so as to generate polymer radicals, and the polymer radicals are bonded to each other so that crosslinkages are formed between the polymer molecules.

The amount of the crosslinkable groups (i.e., the amount of radical-polymerizable unsaturated double bonds, which is determined by iodometric titration) in the binder polymer is preferably from 0.1 to 10.0 mmol, more preferably from 1.0 to 7.0 mmol, and most preferably from 2.0 to 5.5 mmol per one gram of the binder polymer.

Alkali-Soluble Binder Polymer

When development treatment for removing uncured regions is conducted with an alkaline developer, the binder polymer needs to dissolve in the alkaline developer; thus, an organic polymer soluble or swellable in alkaline water is preferably used. In the case of using, in particular, an alkaline developer having a pH of 10 or more, an alkali-soluble binder is preferably used. In the case of conducting development with water, a water-soluble polymer may be used.

For example, when a water-soluble organic polymer is used, development with water is possible. The polymer may be a linear organic polymer, examples of which include radical polymers having carboxylic acid groups in side chains thereof, such as radical polymers described in JP-A Nos. 59-44615, 54-92723, 59-53836, and 59-71048, and Japanese Patent Application Publication (JP-B) Nos. 54-34327, 58-12577, and 54-25957, and the like. Specifically, examples of the radical polymers include resins each obtained by homopolymerizing or copolymerizing a monomer having a carboxyl group; resins each obtained by homopolymerizing or copolymerizing a monomer having an acid anhydride group, and then subjecting acid anhydride units of the resultant polymer to hydrolysis, half-esterification, or half-amidation; and epoxy acrylates each obtained by modifying an epoxy resin with an unsaturated monocarboxylic acid and an acid anhydride. Examples of the monomer having a carboxyl group include acrylic acid, methacrylic acid, itaconic acid, crotonic acid, maleic acid, fumaric acid, and 4-carboxylstyrene. Examples of the monomer having an acid anhydride group include maleic anhydride.

Another example of the alkali-soluble binder polymer is an acidic cellulose derivative having, in a side chain thereof, a carboxylic acid group. A further useful example thereof is a product wherein a cyclic acid anhydride is added to a polymer having a hydroxyl group.

When the alkali-soluble resin is a copolymer, the copolymer may be formed by copolymerization of monomers including one or more other monomers than the above-mentioned monomers. Examples of such other monomers include compounds described in the following items (1) to (12):

(1) acrylic esters and methacrylic acid esters having an aliphatic hydroxy group such as 2-hydroxyethyl acrylate, 2-hydroxypropyl acrylate, 3-hydroxypropyl acrylate, 4-hydroxybutyl acrylate, 2-hydroxyethyl methacrylate, 2-hydroxypropyl methacrylate, 3-hydroxypropyl methacrylate, and 4-hydroxybutyl methacrylate;

(2) alkyl acrylates such as methyl acrylate, ethyl acrylate, propyl acrylate, butyl acrylate, isobutyl acrylate, amyl acrylate, hexyl acrylate, 2-ethylhexyl acrylate, octyl acrylate, benzyl acrylate, 2-chloroethyl acrylate, glycidyl acrylate, 3,4-epoxycyclohexylmethyl acrylate, vinyl acrylate, 2-phenylvinyl acrylate, 1-propenyl acrylate, allyl acrylate, 2-allyloxyethyl acrylate, and propargyl acrylate;

(3) alkyl methacrylates such as methyl methacrylate, ethyl methacrylate, propyl methacrylate, butyl methacrylate, isobutyl methacrylate, amyl methacrylate, hexyl methacrylate, 2-ethylhexyl methacrylate, cyclohexyl methacrylate, benzyl methacrylate, 2-chloroethyl methacrylate, glycidyl methacrylate, 3,4-epoxycyclohexylmethyl methacrylate, vinyl methacrylate, 2-phenylvinyl methacrylate, 1-propenyl methacrylate, allyl methacrylate, 2-allyloxyethyl methacrylate, and propargyl methacrylate;

(4) acrylamides or methacrylamides such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, N-ethyl-N-phenylacrylamide, vinylacrylamide, vinylmethacrylamide, N,N-diallylacrylamide, N,N-diallylmethacrylamide, allylacrylamide, and allylmethacrylamide;

(5) vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether;

(6) vinyl esters such as vinyl acetate, vinyl chloroacetate, vinyl butylate, and vinyl benzoate;

(7) styrenes such as styrene, α-methylstyrene, methylstyrene, chloromethylstyrene, and p-acetoxystyrene;

(8) vinyl ketones such as methyl vinyl ketone, ethyl vinyl ketone, propyl vinyl ketone, and phenyl vinyl ketone;

(9) olefins such as ethylene, propylene, isobutylene, butadiene, and isoprene;

(10) N-vinylpyrrolidone, acrylonitrile, methacrylonitrile, and the like;

(11) unsaturated imides such as maleimide, N-acryloylacrylamide, N-acetylmethacrylamide, N-propionylmethacrylamide, and N-(p-chlorobenzoyl)methacrylamide; and

(12) methacrylic acid monomers having a hetero atom bonded to the α-position thereof (such as compounds described in JP-A Nos. 2002-309057 and 2002-311569).

Of these compounds, preferable are a (meth)acrylic resin having, in a side chain thereof, an allyl group or having, in a side chain thereof, a vinyl ester group and a carboxyl group; alkali-soluble resins having, in side chains thereof, double bonds, which are described JP-A Nos. 2000-187322 and 2002-62698; and alkali-soluble resins having, in side chains thereof, amide groups, which are described in JP-A No. 2001-242612 in view of their excellent balance between film strength, sensitivity and developability.

Acid-group-containing urethane binder polymers, which are described in JP-B Nos. 7-12004, 7-120041, 7-120042 and 8-12424, and JP-A Nos. 63-287944, 63-287947, 1-271741, and 11-352691, and other publications; and urethane binder polymers having, in side chains thereof, acid groups and double bonds, which are described in JP-A No. 2002-107918 are advantageous from the viewpoints of printing durability and suitability for exposure at a low exposure dose since they are extremely good in strength.

Preferable are also acetal-modified polyvinyl alcohol binder polymers having an acid group, which are described in EP993966 and EP1204000, JP-A No. 2001-318463, and other publications from the viewpoint of excellent balance between film strength and developability.

Besides, other examples of the water-soluble linear organic polymers include polyvinyl pyrrolidone and polyethylene oxide. In order to increase the strength of the cured film, alcohol-soluble nylon, or polyether made from 2,2-bis-(4-hydroxyphenyl)-propane and epichlorohydrin may also be used as the polymer.

The weight-average molecular weight of the binder polymer used in the invention is preferably 5,000 or more, more preferably from 10,000 to 300,000. The number-average molecular weight thereof is preferably 1,000 or more, more preferably from 2,000 to 250,000. The polydispersity index (i.e., weight-average molecular weight/number-average molecular weight) is preferably 1 or more, and more preferably from 1.1 to 10.

These polymers may each be any type of polymer, such as a random polymer, a block polymer, or a graft polymer.

The polymer used in the invention may be synthesized by a method known in the technical field. Examples of a solvent used in the synthesis include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethylsulfoxide, and water. One of these solvents may be used alone, or two or more thereof may be used in combination.

The radical polymerization initiator used for the synthesis of the polymer used in the invention may be a known compound such as an azo initiator or a peroxide initiator.

In order to prevent the composition from being damaged by a developer it is preferable that the curable composition includes, as a binder thereof, a polymer having a repeating unit represented by the following formula (4), which is described in JP-A No. 2003-318053, such as a 2-methacryloyloxyethyl succinate copolymer or a 2-methacryloyloxyethylhexahydrophthalate copolymer.

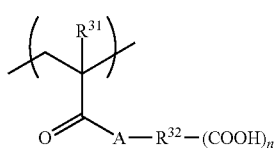

Formula (4)

In the formula (4), $R^{31}$ represents a hydrogen atom or a methyl group, and $R^{32}$ represents a linking group composed of two or more atoms selected from the group consisting of carbon, hydrogen, oxygen, nitrogen and sulfur atoms, the number of the atoms being from 2 to 82. "A" represents an oxygen atom or $-NR^{33}-$ wherein $R^{33}$ represents a hydrogen atom or a monovalent hydrocarbon group having 1 to 10 carbon atoms, and n represents an integer of 1 to 5.

In the formula (4), the number of the atoms which constitute the main skeleton of the linking group represented by $R^{32}$ is preferably from 1 to 30. The linking group more preferably has an alkylene structure, or a structure wherein alkylene structures are linked to each other through an ester bond.

The repeating units each represented by the formula (4) will be described in detail hereinafter.

In the formula (4), $R^{31}$ represents a hydrogen atom or a methyl group, and preferably represents a methyl group.

In the formula (4), the linking group represented by $R^{32}$ is a linking group composed of two or more atoms selected from the group consisting of carbon, hydrogen, oxygen, nitrogen and sulfur atoms, the number of the atoms being from 2 to 82, preferably from 2 to 50, and more preferably from 2 to 30. When the linking group has a substituent, the number of atoms mentioned above indicates the number of atoms including also the atoms in the substituent.

More specifically, the number of the atoms which constitute the main skeleton of the linking group represented by $R^{32}$ is preferably from 1 to 30, more preferably from 3 to 25, even more preferably from 4 to 20, and most preferably from 5 to 10. In the invention, the phrase "main skeleton of the linking group" indicates one or more atoms or an atomic group used for linking A and the terminal COOH in the formula (4). In particular, when plural linking paths are present, the phrase "main skeleton of the linking group" indicates one or more atoms or an atomic group constituting a linking path that has the smallest number of atoms. Accordingly, when the linking group has therein a cyclic structure, the number of atoms to be calculated varies in accordance with the linking position (for example, o-, m-, or p-position) in the cyclic structure.

Hereinafter, the structures of examples of the binder polymer which is preferably used in the invention, and the number of atoms constituting the main skeleton of the linking group represented by $R^{32}$ in each of the structures and a way of calculating the number will be shown or described.

| | Number of atoms constituting the main skeleton of the linking group |
|---|---|
| (1) 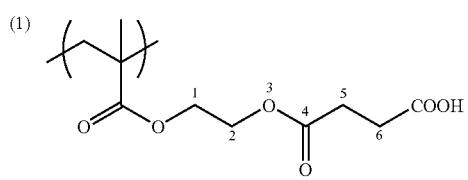 | 6 |

| | Number of atoms constituting the main skeleton of the linking group |
|---|---|
| (2) 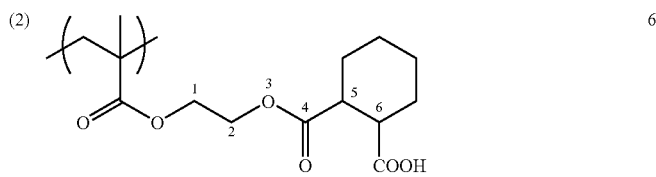 | 6 |
| (3) 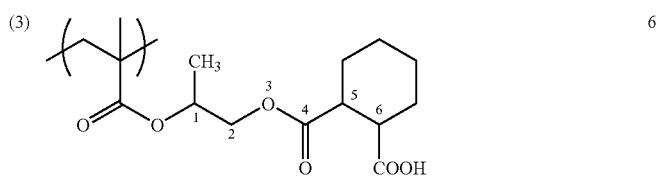 | 6 |
| (4) 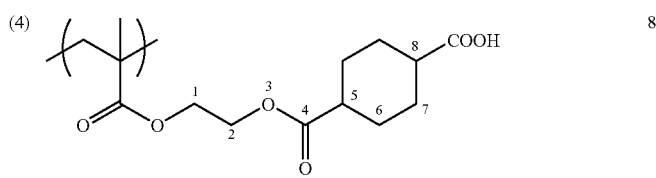 | 8 |
| (5) 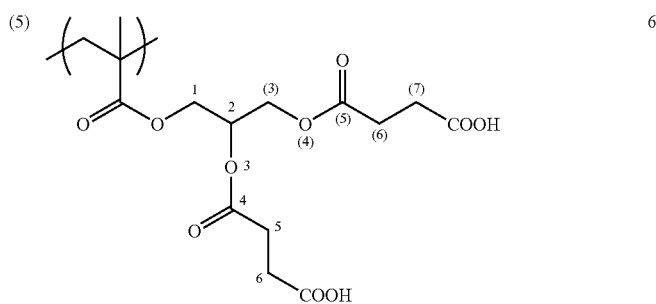 | 6 |
| (6) 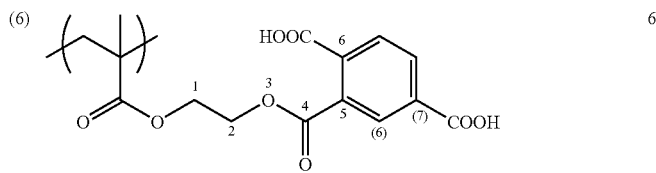 | 6 |
| (7) 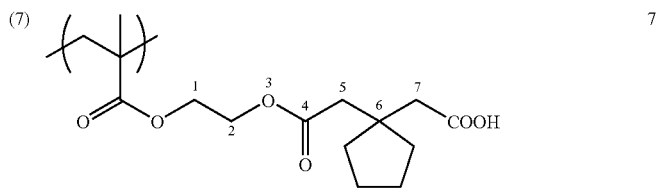 | 7 |

| | Number of atoms constituting the main skeleton of the linking group |
|---|---|
| (8) 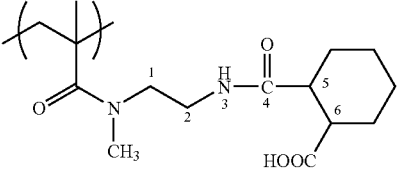 | 6 |

More specific examples of the linking group represented by $R^{32}$ in the formula (4) include alkylenes, substituted alkylenes, arylenes, and substituted arylenes. The linking group may include two or more of these bivalent groups bonded to each other through an amide or ester bond.

Examples of the linking bond which has a chain structure include ethylene and propylene. Structures wherein two or more out of such alkylenes are linked to each other through one or more ester bonds are also preferable examples.

The linking group represented by $R^{32}$ in the formula (4) is preferably a (n+1)-valent hydrocarbon group having an aliphatic ring structure having 3 to 30 carbon atoms. More specifically, the linking group is a (n+1)-valent hydrocarbon group that is obtained by removing, from a compound having an aliphatic ring structure, (n+1) hydrogen atoms on any carbon atoms which constitute the compound. Examples of the compound having an aliphatic ring structure include cyclopropane, cyclopentane, cyclohexane, cycloheptane, cyclooctane, cyclodecane, dicyclohexane, tercyclohexane, and norbornane. The number of carbon atoms in $R^{32}$, which also include carbon atoms in its substituent, is preferably from 3 to 30.

Any carbon atom in the compound constituting an aliphatic ring structure may be substituted with a heteroatom selected from the group consisting of nitrogen, oxygen, and sulfur atoms. From the viewpoint of printing durability, $R^{32}$ is preferably a (n+1)-valent hydrocarbon group that has a substituted or unsubstituted aliphatic ring structure that includes two or more rings and that has 5 to 30 carbon atoms. Examples of the hydrocarbon group include groups derived from condensed polycyclic aliphatic hydrocarbons, aliphatic hydrocarbons having a bridged ring, spiro aliphatic hydrocarbons, and aliphatic hydrocarbon ring assemblies (i.e., plural rings linked to each other through one or more bonds or linking groups). In this case also, the number of carbon means the number of carbon atoms in $R^{32}$, which also include carbon atoms of the substituent(s) in $R^{32}$.

Furthermore, the linking group represented by $R^{32}$ is preferably a group having 5 to 10 atoms. The structure thereof is preferably a chain structure having an ester bond, or a cyclic structure as described above.

A substituent which can be introduced into the linking group represented by $R^{32}$ may be a monovalent non-metal atomic group wherein the monovalent non-metal atomic group is not a hydrogen atom, and examples thereof include a halogen atom (such as —F, —Br, —Cl, or —I), a hydroxyl group, an alkoxy group, an aryloxy group, a mercapto group, an alkyl thio group, an aryl thio group, an alkyl dithio group, an aryl dithio group, an amino group, a N-alkyl amino group, a N,N-dialkyl amino group, a N-aryl amino group, a N,N-diaryl amino group, a N-alkyl-N-aryl amino group, an acyloxy group, a carbamoyloxy group, a N-alkylcarbamoyloxy group, a N-aryl carbamoyloxy group, a N,N-dialkyl carbamoyloxy group, a N,N-diaryl carbamoyloxy group, a N-alkyl-N-aryl carbamoyloxy group, an alkyl sulfoxy group, an aryl sulfoxy group, an acyl thio group, an acyl amino group, a N-alkyl acyl amino group, a N-aryl acyl amino group, a ureido group, a N'-alkyl ureido group, a N',N'-dialkyl ureido group, a N'-aryl ureido group, a N',N'-diaryl ureido group, a N'-alkyl-N'-aryl ureido group, a N-alkyl ureido group, a N-aryl ureido group, a N'-alkyl-N-alkyl ureido group, a N'-alkyl-N-aryl ureido group, a N',N'-dialkyl-N-alkyl ureido group, a N',N'-dialkyl-N-aryl ureido group, a N'-aryl-N-alkyl ureido group, a N'-aryl-N-aryl ureido group, a N',N'-diaryl-N-alkyl ureido group, a N',N'-diaryl-N-aryl ureido group, a N'-alkyl-N'-aryl-N-alkyl ureido group, a N'-alkyl-N'-aryl-N-aryl ureido group, an alkoxy carbonyl amino group, an aryloxy carbonyl amino group, a N-alkyl-N-alkoxycarbonyl amino group, a N-alkyl-N-aryloxy carbonyl amino group, a N-aryl-N-alkoxycarbonyl amino group, a N-aryl-N-aryloxycarbonyl amino group, a formyl group, an acyl group, a carboxyl group and its conjugate base group, an alkoxy carbonyl group, an aryloxy carbonyl group, a carbamoyl group, a N-alkyl carbamoyl group, a N,N-dialkyl carbamoyl group, a N-aryl carbamoyl group, a N,N-diaryl carbamoyl group, a N-alkyl-N-aryl carbamoyl group, an alkyl sulfinyl group, an aryl sulfinyl group, an alkyl sulfonyl group, an aryl sulfonyl group, a sulfo group (—SO₃H) and its conjugate base group, an alkoxy sulfonyl group, an aryloxy sulfonyl group, a sulfinamoyl group, a N-alkyl sulfinamoyl group, a N,N-dialkyl sulfinamoyl group, a N-aryl sulfinamoyl group, a N,N-diaryl sulfinamoyl group, a N-alkyl-N-aryl sulfinamoyl group, a sulfamoyl group, a N-alkyl sulfamoyl group, a N,N-dialkyl sulfamoyl group, a N-aryl sulfamoyl group, a N,N-diaryl sulfamoyl group, a N-alkyl-N-aryl sulfamoyl group, a N-acyl sulfamoyl group and its conjugate base group, a N-alkyl sulfonyl sulfamoyl group (—SO₂NHSO₂ (alkyl)) and its conjugate base group, a N-aryl sulfonyl sulfamoyl group (—SO₂NHSO₂ (allyl)) and its conjugate base group, a N-alkyl sulfonyl carbamoyl group (—CONHSO₂ (alkyl)) and its conjugate base group, a N-aryl sulfonyl carbamoyl group (—CONHSO₂ (aryl)) and its conjugate base group, an alkoxy silyl group (—Si(O-alkyl)₃), an aryloxy silyl group (—Si(O-aryl)₃), a hydroxysilyl group (—Si(OH)₃) and its conjugate base group, a phosphono group (—PO₃H₂) and is conjugate base group, a dialkyl phosphono group (—PO₃(alkyl)₂), a diaryl phosphono group (—PO₃(aryl)₂), an alkyl aryl phosphono group (—PO₃(alkyl)(aryl)), a monoalkyl phosphono group (—PO₃H(alkyl)) and its conjugate base group, a monoaryl phosphono group (—PO₃H(aryl)) and its conjugate base group, a phosphonoxy group (—OPO₃H₂) and its conjugate base group, a dialkyl phosphonoxy group (—OPO$_3$(alkyl)$_2$), a diaryl phosphonoxy group (—OPO$_3$(aryl)$_2$), an alkyl aryl phosphonoxy group (—OPO$_3$(alkyl)(aryl)), a monoalkyl phosphonoxy group (—OPO$_3$H(alkyl)) and its conjugate base group, a monoaryl phosphonoxy group (—OPO$_3$H(aryl)) and its conjugate base group, a cyano group, a nitro group, a dialkyl boryl group (—B(alkyl)$_2$), a diaryl boryl group (—B(aryl)$_2$), an alkyl aryl boryl group (—B(alkyl)(aryl)), a dihydroxy boryl group (—B(OH)$_2$) and its conjugate base group, an alkyl hydroxy boryl group (—B(alkyl)(OH)) and its conjugate base group, an aryl hydroxy boryl group (—B(aryl)(OH)) and its conjugate base group, an aryl group, an alkenyl group and an alkynyl group.

Depending on the design of the photosensitive layer, a substituent having a hydrogen atom capable of hydrogen bonding, particularly a substituent having acidity whose acid dissociation constant (pKa) is lower than that of carboxylic acid, may not be preferable because it tends to lower printing durability. On the other hand, a hydrophobic substituent such as a halogen atom, a hydrocarbon group (alkyl group, aryl group, alkenyl group, or alkynyl group), an alkoxy group and an aryloxy group is preferable because it tends to improve printing durability. In particular, when the cyclic structure is a six-membered or lower-membered monocyclic aliphatic hydrocarbon such as cyclopentane or cyclohexane, the hydrocarbon preferably has such a hydrophobic substituent. If possible, these substituents may be bound to one another or to a substituted hydrocarbon group to form a ring. The substituents may themselves be substituted.

In the formula (4), when A is NR$^{33}$—, R$^{33}$ represents a hydrogen atom or a monovalent hydrocarbon group having 1 to 10 carbon atoms. Examples of the monovalent hydrocarbon group having 1 to 10 carbon atoms represented by R$^{33}$ include an alkyl group, an aryl group, an alkenyl group, and an alkynyl group.

Specific examples of the alkyl group include linear, branched, or cyclic alkyl groups having 1 to 10 carbon atoms, such as a methyl group, an ethyl group, a propyl group, a butyl group, a pentyl group, a hexyl group, a heptyl group, an octyl group, a nonyl group, a decyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclopentyl group, a cyclohexyl group, a 1-adamantyl group, and a 2-norbornyl group.

Specific examples of the aryl group include: aryl groups having 1 to 10 carbon atoms such as a phenyl group, a naphthyl group, and an indenyl group; and heteroaryl groups which has 1 to 10 carbon atoms and include one hetero atom selected from the group consisting of a nitrogen atom, an oxygen atom, and a sulfur atom, such as a furyl group, a thienyl group, a pyrrolyl group, a pyridyl group, and a quinolyl group.

Specific examples of the alkenyl group include linear, branched, or cyclic alkenyl groups having 1 to 10 carbon atoms, such as a vinyl group, a 1-propenyl group, a 1-butenyl group, a 1-methyl-1-propenyl group, a 1-cyclopentenyl group, and a 1-cyclohexenyl group.

Specific examples of the alkynyl group include alkynyl groups having 1 to 10 carbon atoms such as an ethynyl group, a 1-propynyl group, a 1-butynyl group, and a 1-octynyl group. Examples of the substituent which may be introduced into R$^{33}$ are the same as those listed as the substituent which may be introduced into R$^{32}$. However, R$^{33}$ has 1 to 10 carbon atoms including the carbon atoms in the substituent.

In the formula (4), A is preferably an oxygen atom or —NH— from the viewpoint of easiness of synthesis.

In the formula (4), n represents an integer of from 1 to 5, and preferably represents 1 from the viewpoint of the printing durability.

Specific examples of the repeating unit represented by the formula (4) composing the binder polymer particularly suitable for the invention are listed below, but are not limited to them.

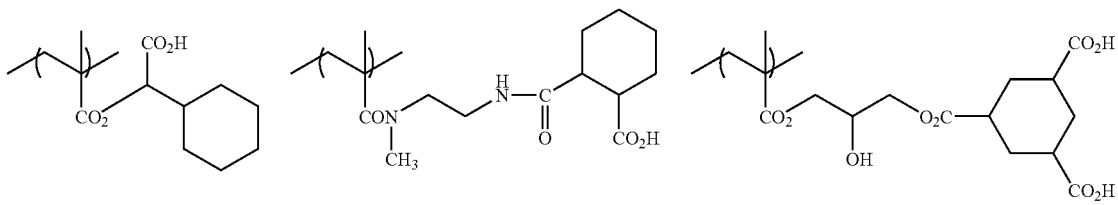

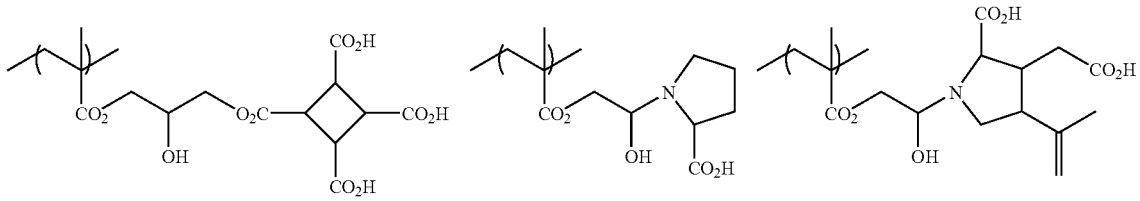

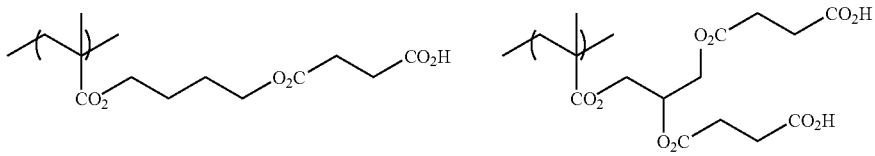

-continued
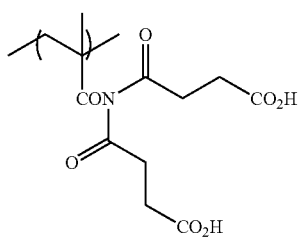 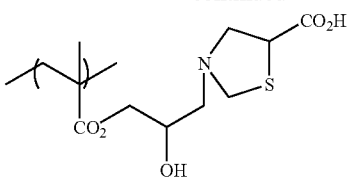 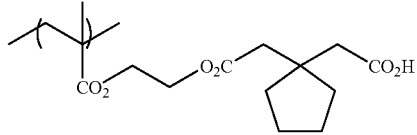
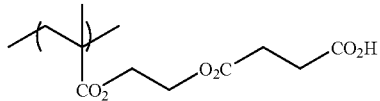 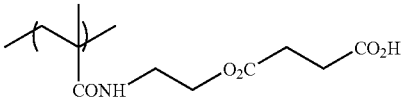
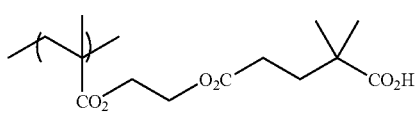 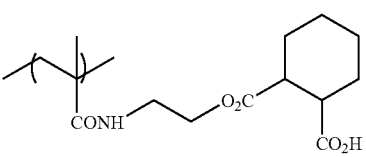
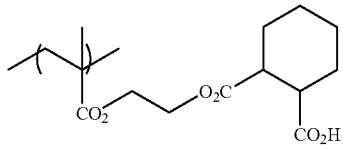 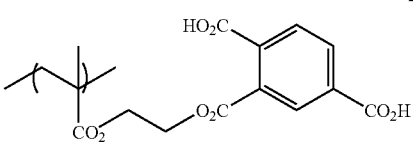
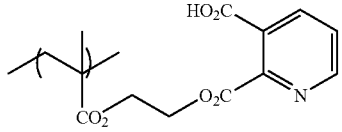 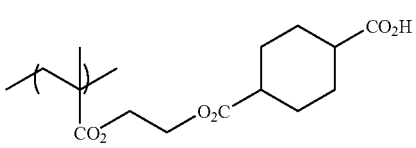
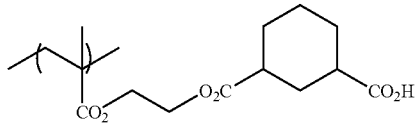 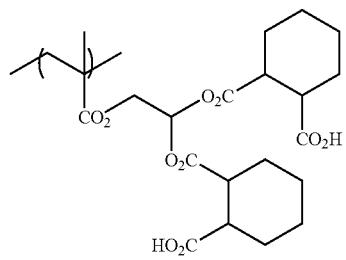 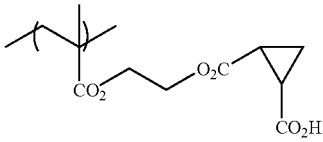
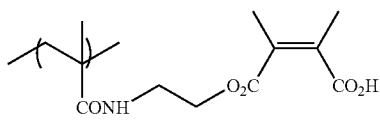 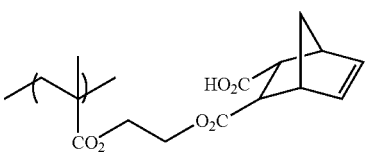
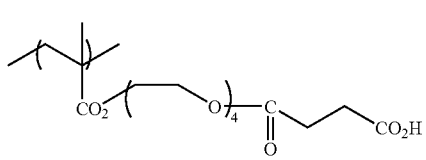 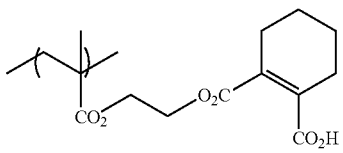
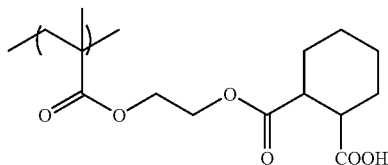 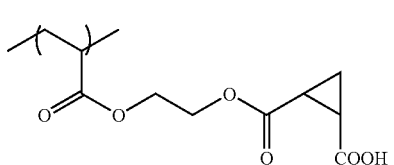
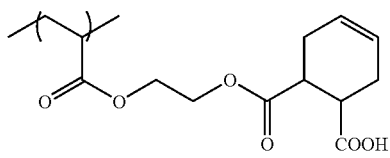 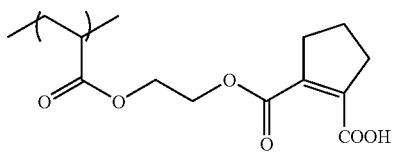

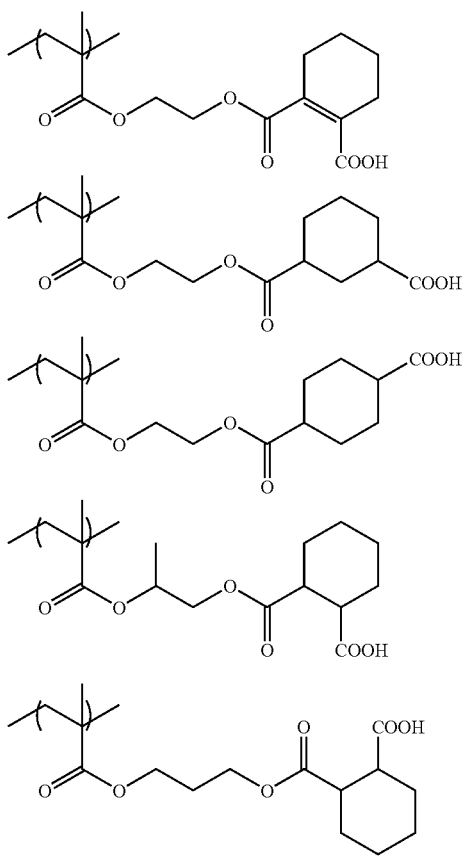
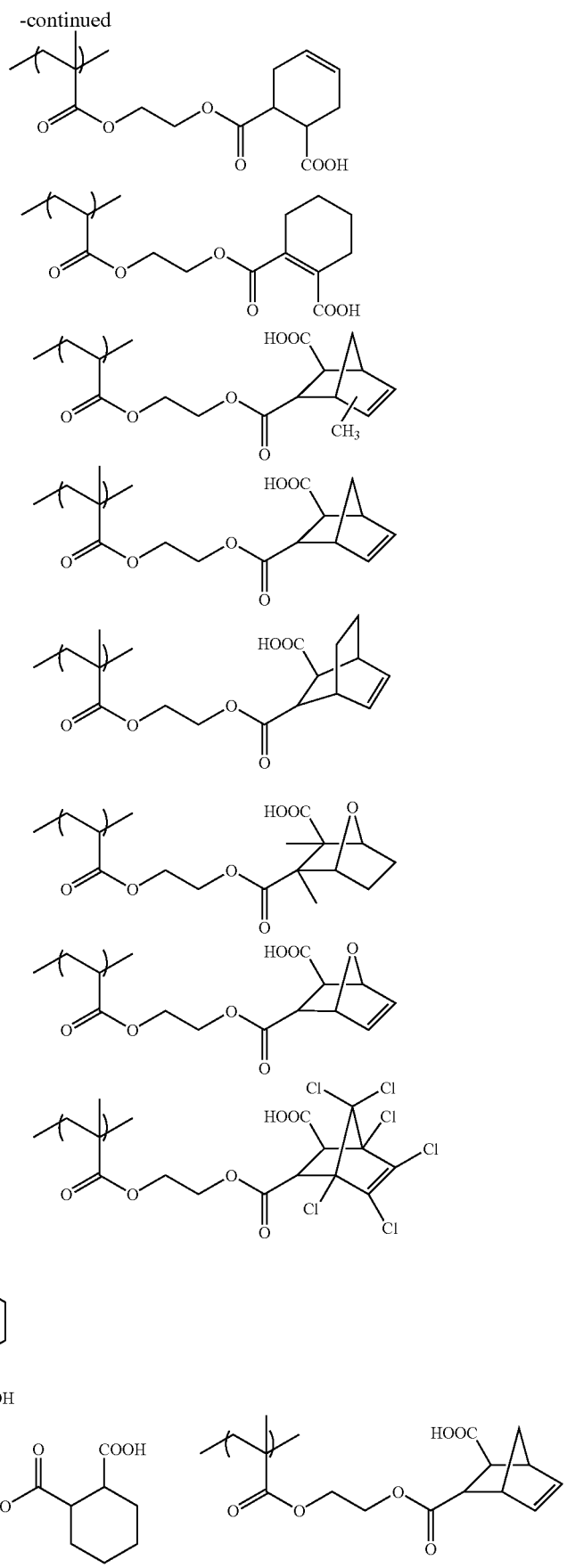

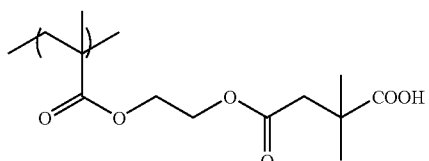
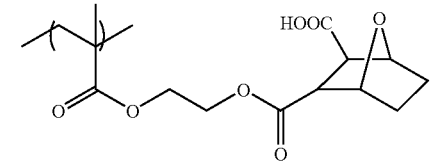
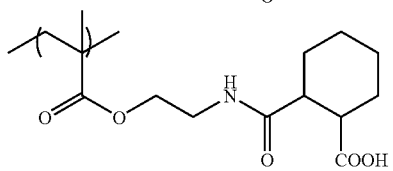
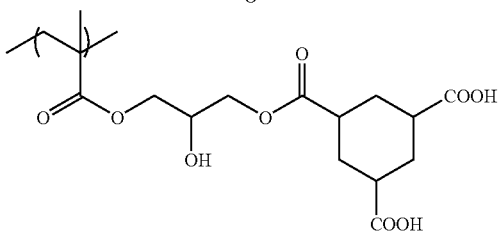
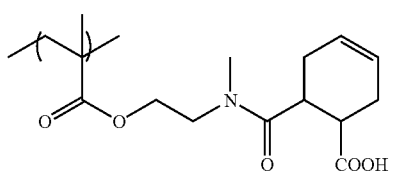
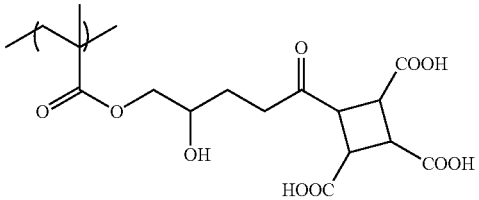
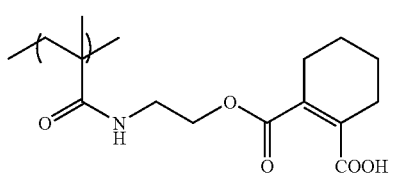
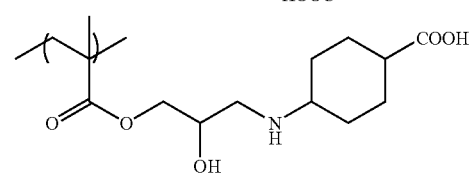
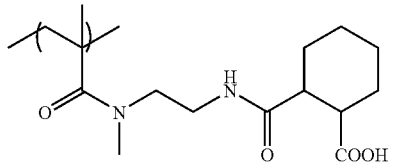
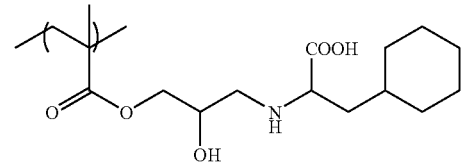
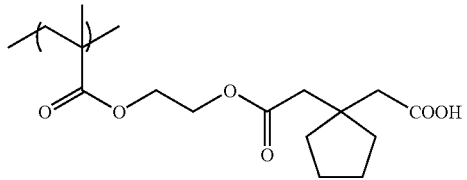
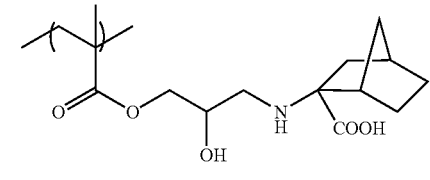
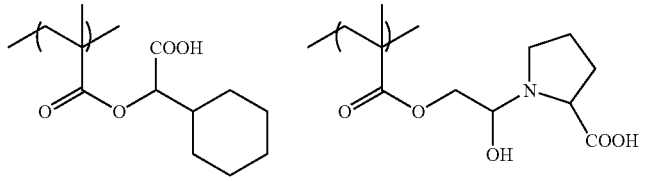
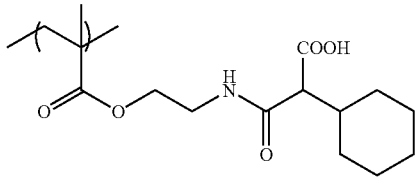
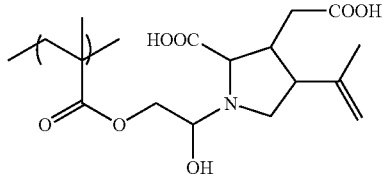
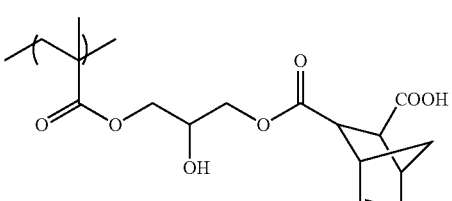
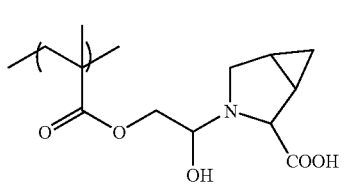
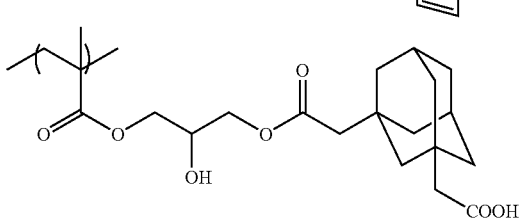

-continued
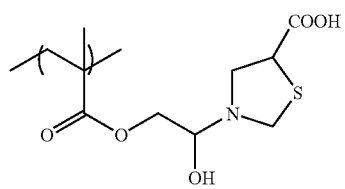
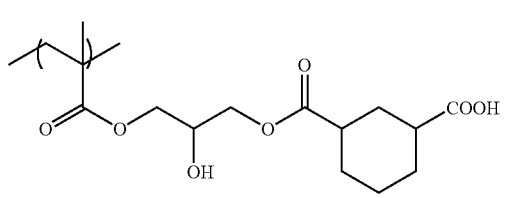
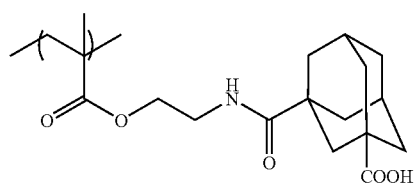
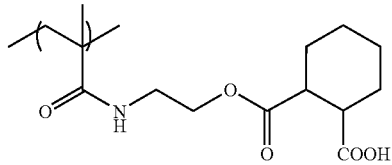
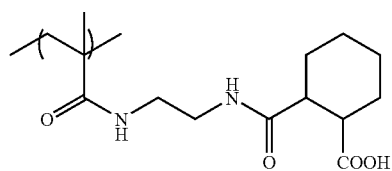
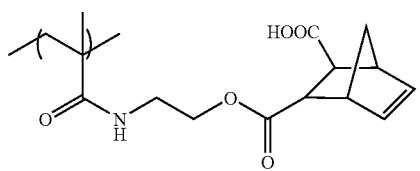
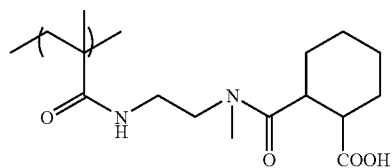
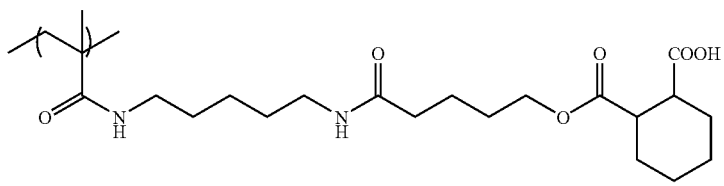
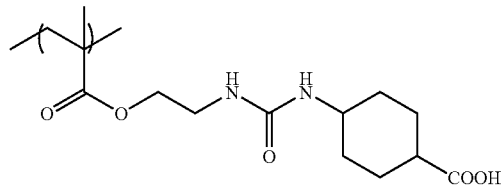
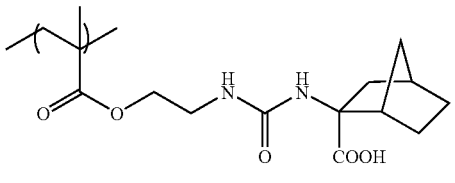
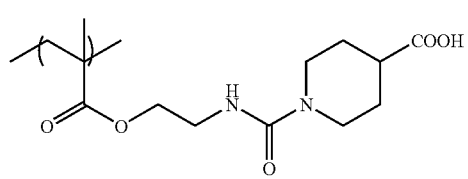
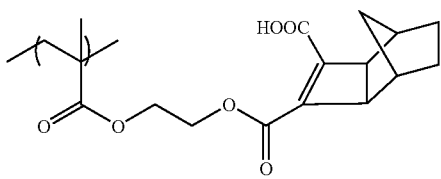
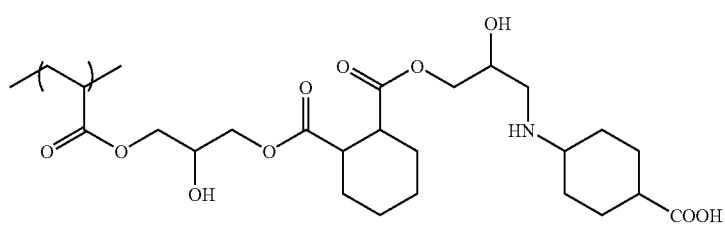
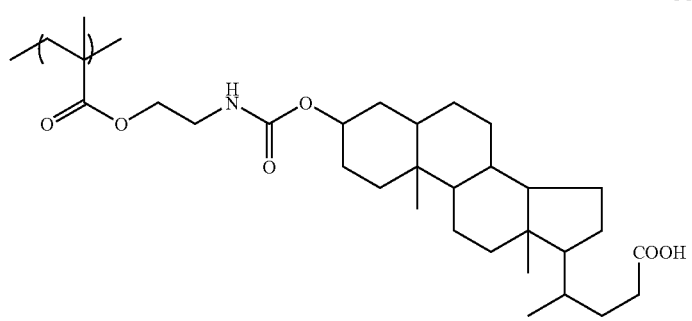

-continued

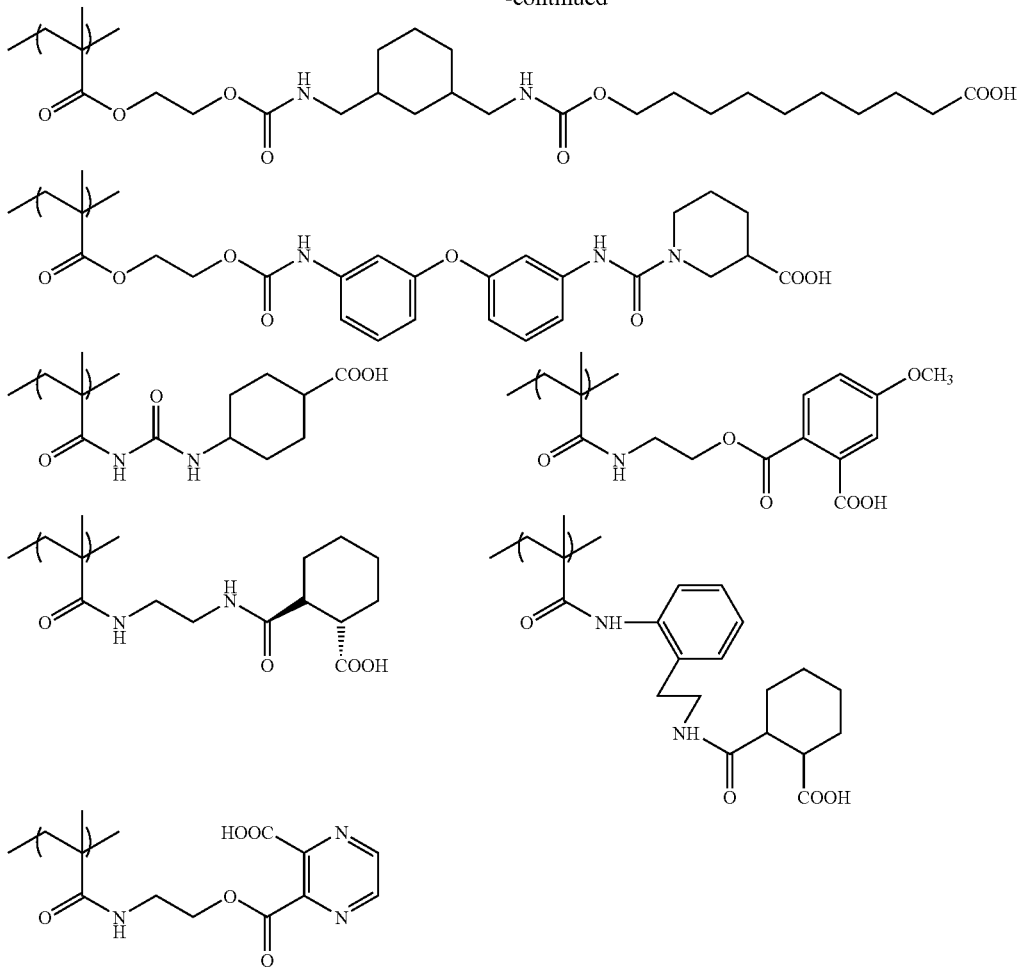

The binder polymer may have a single species of the repeating unit represented by the formula (4), or may have two or more species thereof. The binder polymer in the invention may be a polymer made only of the repeating units represented by the formula (4); alternatively, the binder polymer in the invention may be a copolymer wherein the repeating units represented by the formula (4) are combined with a further, different copolymerizable component. The total amount of the repeating units represented by the formula (4) in the copolymer, which may be appropriately determined in accordance with the structure thereof, the design of the polymerizable composition and the like, is preferably from 1 to 99 mole percent, more preferably from 5 to 40 mole percent, and even more preferably from 5 to 20 mole percent, with respect to the total amount of moles of the polymer components.

The copolymerizable components used for the copolymer may be any known monomer as far as the monomer is a radical-polymerizable monomer. Specific examples thereof include monomers described in "Polymer Data Handbook -Basic Version- (edited by the Society of Polymer Science, Japan, Baifukan Co., Ltd., 1986). One copolymerizable component may be used alone, or two or more of them may be used in combination.

Of the binder polymers, particularly preferable are copolymers made from allyl (meth)acrylate, (meth)acrylic acid, and optional other addition polymerizable monomers, polymers including an acrylic group, a methacrylic group or an allyl group, as described in JP-A Nos. 2000-131837, 2002-62648, 2000-187322 or 2004-318053, and the like since they provide excellent film strength, sensitivity and developability.

In particular, preferable are polymers having a repeating unit represented by the formula (4) and a radical polymerizable group (e.g., carbon-carbon double bond) having a structure represented by any one of the formulae (1) to (3). More preferable are polymers having a repeating unit represented by the formula (4) and a radical polymerizable group having a structure represented by the formula (1) or (2).

One of the binder polymers may be used alone, or two or more of them may be used in combination.

The binder polymer (b) used in the invention is preferably a polymer which is substantially insoluble in water, but is soluble in an aqueous alkali solution. The use of this polymer can allow avoidance of the use of an organic solvent, which is unfavorable for the environment, as a developer, or can restrict the amount thereof to be used to an extremely small amount.

The acid value (i.e., a value of the acid content per gram of the polymer which is represented by a chemical equivalent number) of the binder polymer (b), and the molecular weight thereof are selected as appropriate from the viewpoints of image strength and developability. The acid value is preferably from 0.4 to 3.0 meq/g, and more preferably from 0.6 to 2.0 meq/g.

The amount of the binder polymer (b) in a photosensitive layer in the negative-working photosensitive material of the invention may be determined as appropriate, and is preferably from 10 to 90% by mass, more preferably from 20 to 80% by mass, and most preferably from 30 to 70% by mass, with respect to the total solid content of the photosensitive layer.

The photosensitive layer in the negative-working photosensitive material of the invention may further include a sensitizer, an infrared absorbing agent, or the like, as necessary.

Sensitizer

The photosensitive layer in the negative-working photosensitive material of the invention may further include a sensitizer (which may hereinafter be referred to as a "sensitizing dye") to improve sensitivity. In particular, when the polymerization initiator is a photopolymerization initiator, it is preferable from the viewpoint of improving the sensitivity that the photosensitive layer further includes a sensitizer that sensitizes the photopolymerization initiator.

The sensitizing dye is preferably a sensitizing dye having an absorption peak in the wavelength range of from 300 to 850 nm, more preferably from 300 to 600 nm, and particularly preferably from 300 to 450 nm. Moreover, the sensitizing dye preferably has a molar absorbance coefficient (ε) of from 10,000 to 100,000, more preferably from 15,000 to 100,000, and particularly preferably from 20,000 to 100,000. The sensitizing dye may be a spectral sensitizing dye, or a dye or pigment which absorbs light from a light source to interact with the photopolymerization initiator.

Preferable examples of the spectral sensitizing dyes include polynuclear aromatics (e.g. pyrene, perylene, and triphenylene), xanthenes (e.g. fluorescein, eosin, erythrosine, rhodamine B, and rose bengal), cyanines (e.g. thiacarbocyanine, and oxacarbocyanine), melocyanines (e.g. melocyanine and carbomelocyanine), thiazines (e.g. thioene, methylene blue, and toluidine blue), acridines (e.g. acridine orange, chloroflavine, and acriflavine), phthalocyanines (e.g. phthalocyanine and metallophthalocyanine), porphyrins (e.g. tetraphenyl porphyrin, center metal substituted porphyrin), chlorophylls (e.g. chlorophyll, chlorophyllin, and center metal substituted chlorophyll), metal complexes, anthraquinones (e.g. anthraquinone), and squaryliums (e.g. squarylium).

More preferable examples of the spectral sensitizing dyes include styryl dyes described in JP-B No. 37-13034, cation dyes described in JP-A No. 62-143044, quinoxalinium salts described in JP-B No. 59-24147, novel methylene blue compounds described in JP-A No. 64-33104, anthraquinones described in JP-A No. 64-56767, benzoxanthene dyes described in JP-A No. 2-1714, acridines described in JP-A No. 2-226148 and JP-A No. 2-226149, pyrylium salts described in JP-B No. 40-28499, cyanines described in JP-B No. 46-42363, benzofuran dyes described in JP-A No. 2-63053, conjugate ketone dyes described in JP-A No. 2-85858 and JP-A No. 2-216154, dyes described in JP-A No. 57-10605, azocinnamylidene derivatives described in JP-B No. 2-30321, cyanine dyes described in JP-A No. 1-287105, xanthene dyes described in JP-A No. 62-31844, JP-A No. 62-31848, and JP-A No. 62-143043, aminostyryl ketones described in JP-B No. 59-28325, melocyanine dyes described in JP-B No. 61-9621, dyes described in JP-A No. 2-179643, melocyanine dyes described in JP-A No. 2-244050, melocyanine dyes described in JP-B No. 59-28326, melocyanine dyes described in JP-A No. 59-89803, melocyanine dyes described in JP-A No. 8-129257, and benzopyran dyes described in JP-A No. 8-334897.

The sensitizing dye to be used in the invention is more preferably a dye represented by the following formula (5).

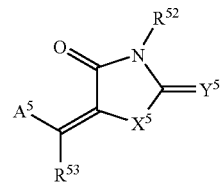

Formula (5)

In the formula (5), $A^5$ represents a substituted or unsubstituted aromatic ring or a substituted or unsubstituted heterocycle; $X^5$ represents an oxygen atom, a sulfur atom, or a —$N(R^{51})$—; $Y^5$ represents an oxygen atom or —$N(R^{51})$; $R^{51}$, $R^{52}$ and $R^{53}$ each independently represents a hydrogen atom or a monovalent group of nonmetal atoms; and $A^5$ and any one of $R^{51}$, $R^{52}$ and $R^{53}$ may be bonded to each other to form an aliphatic or aromatic ring.

Examples of the monovalent group of nonmetal atom represented by $R^{51}$, $R^{52}$, or $R^{53}$ preferably include a substituted or unsubstituted alkyl group or a substituted or unsubstituted aryl group.

Specific examples of $R^{51}$, $R^{52}$, and $R^{53}$ are described below. Preferable examples of the alkyl group include linear, branched, and cyclic alkyl groups having 1 to 20 carbon atoms, and specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecy group, an eicosyl group, an isopropyl group, an isobutyl group, a s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbornyl group. Among them, linear alkyl groups having 1 to 12 carbon atoms, branched alkyl groups having 3 to 12 carbon atoms, and cyclic alkyl groups having 5 to 10 carbon atoms are more preferable.

As the substituent of the substituted alkyl group, a monovalent group of nonmetal atoms is used wherein the monovalent group is not a hydrogen atom, and preferable examples thereof include a halogen atom (such as —F, —Br, —Cl, or —I), a hydroxyl group, an alkoxy group, an aryloxy group, a mercapto group, an alkylthio group, an arylthio group, an alkyldithio group, an aryldithio group, an amino group, a N-alkylamino group, a N,N-dialkylamino group, a N-arylamino group, a N,N-diarylamino group, a N-alkyl-N-arylamino group, an acyloxy group, a carbamoyloxy group, a N-alkylcarbamoyloxy group, a N-arylcarbamoyloxy group, a N,N-dialkylcarbamoyloxy group, a N,N-diarylcarbamoyloxy group, a N-alkyl-N-arylcarbamoyloxy group, an alkylsulfoxy group, an arylsulfoxy group, an acyloxy group, an acylthio group, an acylamino group, a N-alkylacylamino group, a N-arylacylamino group, a ureido group, a N'-alkylureido group, a N',N'-dialkylureido group, a N'-arylureido group, a N',N'-diarylureido group, a N'-alkyl-N'-arylureido group, a N-alkylureido group, a N-arylureido group, a N'-alkyl-N-alkylureido group, a N'-alkyl-N-arylureido group, a N',N'-dialkyl-N-alkylureido group, a N',N'-dialkyl-N-arylureido group, a N'-aryl-N-alkylureido group, a N'-aryl-N-arylureido group, a N',N'-diaryl-N-alkylureido group, a N',N'-diaryl-N-arylureido group, a N'-alkyl-N'-aryl-N-alkylureido group, a N'-alkyl-N'-aryl-N-arylureido group, an alkoxycarbonylamino group, an aryloxycarbonylamino group, a N-alkyl-N-alkoxycarbonylamino group, a N-alkyl-N-aryloxycarbonylamino group, a N-aryl-N-alkoxycarbonylamino group, a N-aryl-N-aryloxycarbonylamino group, a formyl group, an acyl group, a carboxyl group, an alkoxycarbonyl group, an aryloxycarbonyl group, a carbamoyl group, a N-alkylcarbamoyl group, a N,N-dialkylcarbamoyl group, a N-arylcarbamoyl group, a N,N-diarylcarbamoyl group, a N-alkyl-N-arylcarbamoyl group, an alkylsulfinyl group, an arylsulfinyl group, an alkylsulfonyl group, an arylsulfonyl group, a sulfo group (—SO$_3$H) and conjugate base groups thereof (hereinafter, referred to as a sulfonate group), an alkoxysulfonyl group, an aryloxysulfonyl group, a sulfinamoyl group, a N-alkylsulfinamoyl group, a N,N-dialkylsulfinamoyl group, a N-arylsulfinamoyl group, a N,N-diarylsulfinamoyl group, a N-alkyl-N-arylsulfinamoyl group, a sulfamoyl group, a N-alkylsulfamoyl group, a N,N-dialkylsulfamoyl group, a N-arylsulfamoyl group, a N,N-diarylsulfamoyl group, a N-alkyl-N-arylsulfamoyl group, a phosphono group (—PO$_3$H$_2$) and conjugate base groups thereof (hereinafter, referred to as a phosphonate group), a dialkylphosphono group (—PO$_3$(alkyl)$_2$), diarylphosphono group (—PO$_3$(aryl)$_2$), an alkylarylphosphono group (—PO$_3$(alkyl)(aryl)), a monoalkylphosphono group (—PO$_3$H(alkyl)) and conjugate base groups thereof (hereinafter, referred to as an alkylphosphonate group), a monoarylphosphono group (—PO$_3$H(aryl)) and conjugate base groups thereof (hereinafter, referred to as an arylphosphonate group), phosphonooxy group (—OPO$_3$H$_2$) and conjugate base groups thereof (hereinafter, referred to as a phosphonateoxy group), a dialkyl phosphonooxy group (—OPO$_3$(alkyl)$_2$), diarylphosphonooxy group (—OPO$_3$(aryl)$_2$), alkylarylphosphonooxy group (—OPO$_3$(alkyl)(aryl)), monoalkylphosphonooxy group (—OPO$_3$H(alkyl)) and conjugate base groups thereof (hereinafter, referred to as an alkylphosphonateoxy group), monoarylphosphonooxy group (—OPO$_3$H(aryl)) and conjugate base groups thereof (hereinafter, referred to as an arylphosphonateoxy group), a cyano group, a nitro group, an aryl group, a heteroaryl group, an alkenyl group, an alkynyl group, and a silyl group.

Specific examples of the alkyl group in these substituents include the above-described alkyl groups, which may be further substituted.

Specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, a N-phenylcarbamoylphenyl group, a phenyl group, a cyanophenyl group, a sulfophenyl group, a sulfonatephenyl group, a phosphonophenyl group, and a phosphonatephenyl group.

The heteroaryl group is a group derived from a monocyclic or polycyclic aromatic ring containing at least one of a nitrogen atom, an oxygen atom, or a sulfur atom. Particularly preferable examples of the heteroaryl ring in the heteroaryl group include thiophene, thiathrene, furan, pyran, isobenzofuran, chromene, xanthene, phenoxazine, pyrrole, pyrazole, isothiazole, isoxazole, pyrazine, pyrimidine, pyridazine, indolysine, isoindolysine, indoyl, indazole, purine, quinolizine, isoquinoline, phthalazine, naphthyridine, quinazoline, cinnoline, pteridine, carbazole, carboline, phenanthroline, acridine, perimidine, phenanthroline, phthalazine, phenarsazine, phenoxazine, and furazan, which may be further condensed with a benzene ring, or may be substituted.

Examples of the alkenyl group include a vinyl group, a 1-propenyl group, a 1-butenyl group, a cinnamyl group, and a 2-chloro-1-ethenyl group, and examples of the alkynyl group include an ethynyl group, a 1-propynyl group, a 1-butynyl group, and a trimethylsilylethynyl group. Examples of G$^{51}$ in the acyl group (G$^{51}$CO—) include a hydrogen atom, and the above-described alkyl groups and aryl groups. Among these substituents, more preferable examples include a halogen atom (—F, —Br, —Cl, and —I), an alkoxy group, an aryloxy group, an alkylthio group, an arylthio group, a N-alkylamino group, a N,N-dialkylamino group, an acyloxy group, a N-alkylcarbamoyloxy group, a N-arylcarbamoyloxy group, an acylamino group, a formyl group, an acyl group, a carboxyl group, an alkoxycarbonyl group, an aryloxycarbonyl group, a carbamoyl group, a N-alkylcarbamoyl group, a N,N-dialkylcarbamoyl group, a N-arylcarbamoyl group, a N-alkyl-N-arylcarbamoyl group, a sulfo group, a sulfonate group, a sulfamoyl group, a N-alkylsulfamoyl group, a N,N-dialkylsulfamoyl group, a N-arylsulfamoyl group, a N-alkyl-N-arylsulfamoyl group, a phosphono group, a phosphonate group, a dialkylphosphono group, a diarylphosphono group, a monoalkylphosphono group, an alkylphosphonate group, a monoarylphosphono group, an arylphosphonate group, a phosphonooxy group, a phosphonateoxy group, an aryl group, an alkenyl group, and an alkylidene group (e.g. methylene group).

Examples of the alkylene group in the substituted alkyl group include a divalent organic residue obtained by removing any one of the hydrogen atoms on the above-described alkyl group having 1 to 20 carbon atoms, and preferable examples thereof include a linear alkylene group having 1 to 12 carbon atoms, a branched alkylene group having 3 to 12 carbon atoms, and a cyclic alkylene group having 5 to 10 carbon atoms.

Specific examples of the substituted alkyl group which is obtained by combining the above-described substituent with an alkylene group and is preferable as R$^{51}$, R$^{52}$, or R$^{53}$ include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, a N-cyclohexylcarbamoyloxyethyl group, a N-phenylcarbamoyloxyethyl group, an acetylaminoethyl group, a N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, a N-methylcarbamoylethyl group, a N,N-dipropylcarbamoylmethyl group, a N-(methoxyphenyl)carbamoylethyl group, a N-methyl-N-(sulfophenyl)carbamoylmethyl group, a sulfobutyl group, a sulfonatepropyl group, a sulfonatebutyl group, a sulfamoylbutyl group, a N-ethylsulfamoylmethyl group, a N,N-dipropylsulfamoylpropyl group, a N-tolylsulfamoylpropyl group, a N-methyl-N-(phosphonophenyl)sulfamoyloctyl group, a phosphonobutyl group, a phosphonatehexyl group, a diethylphosphonobutyl group, a diphenylphosphonopropyl group, a methylphosphonobutyl group, a methylphosphonatebutyl group, a tolylphosphonohexyl group, a tolylphosphonatehexyl group, a phosphonooxypropyl group, a phosphonateoxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group, and a 3-butynyl group.

Specific examples of the aryl group preferable as $R^{51}$, $R^{52}$, or $R^{53}$ include a condensed ring formed by 1 to 3 benzene rings, and a condensed ring formed by a benzene ring and a 5-membered unsaturated ring, and specific examples thereof include a phenyl group, a naphthyl group, an anthryl group, a phenanthryl group, an indenyl group, an acenaphthenyl group, and a fluorenyl group. Among these groups, a phenyl group, and a naphthyl group are more preferable.

Specific examples of the substituted aryl group preferable as $R^{51}$, $R^{52}$, or $R^{53}$ include the above-described aryl group having a monovalent group of nonmetal atoms (wherein the monovalent group is not a hydrogen atom) as a substituent on the carbon atom forming the ring. Preferable examples of the substituent include the above-described alkyl groups, substituted alkyl groups, and examples of the substituents in the alkyl groups. Specific preferable examples of the substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, a N-cyclohexylcarbamoyloxyphenyl group, a N-phenylcarbamoyloxyphenyl group, an acetylaminophenyl group, a N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, a N-methylcarbamoylphenyl group, a N,N-dipropylcarbamoylphenyl group, a N-(methoxyphenyl)carbamoylphenyl group, a N-methyl-N-(sulfophenyl)carbamoylphenyl group, a sulfophenyl group, a sulfonatephenyl group, a sulfamoylphenyl group, a N-ethylsulfamoylphenyl group, a N,N-dipropylsulfamoylphenyl group, a N-tolylsulfamoylphenyl group, a N-methyl-N-(phosphonophenyl)sulfamoylphenyl group, a phosphonophenyl group, a phosphonatephenyl group, a diethylphosphonophenyl group, a diphenylphosphonophenyl group, a methylphosphonophenyl group, a methylphosphonatephenyl group, a tolylphosphonophenyl group, a tolylphosphonatephenyl group, an allylphenyl group, a 1-propenylmethylphenyl group, a 2-butenylphenyl group, a 2-methylallylphenyl group, a 2-methylpropenylphenyl group, a 2-propynylphenyl group, a 2-butynylphenyl group, and 3-butynylphenyl group.

Particularly preferable examples of $R^{52}$ and $R^{53}$ include a substituted or unsubstituted alkyl group. More preferable examples of $R^{51}$ include a substituted or unsubstituted aryl group. The reason for this is not evident, but is considered that these substituents particularly strengthen the interaction between electrons excited upon light absorption and the initiator compound, which improves the efficiency of the initiator compound to generate a radical, acid, or base.

Next, $A^5$ in the formula (5) will be described. $A^5$ represents a substituted or unsubstituted aromatic ring or a substituted or unsubstituted heterocycle, specific examples of the substituted or unsubstituted aromatic ring or heterocycle are the same as those of $R^{51}$, $R^{52}$ or $R^{53}$.

$A^5$ is preferably an aryl group having an alkoxy group, a thioalkyl group, or an amino group, and is in particular preferably an aryl group having an amino group.

Next, $Y^5$ in the formula (5) will be described. $Y^5$ represents a group of nonmetal atoms which forms a heterocycle together with $A^5$ and any carbon atom adjacent to $Y^5$. The heterocycle is preferably a 5-, 6- or 7-membered (preferably, 5- or 6-membered), nitrogen- or sulfur-containing heterocycle which may have a condensed ring.

Examples of the nitrogen-containing heterocycle include those known as a component of basic nuclei in melocyanine dyes described in L. G. Brooker et al., J. Am, Chem. Soc., vol. 73 (1951), pp. 5326-5358 and reference documents cited therein. Specific examples thereof include thiazoles (such as thiazole, 4-methylthiazole, 4-phenylthiazole, 5-methylthiazole, 5-phenylthiazole, 4,5-dimethylthiazole, 4,5-diphenylthiazole, 4,5-di(p-methoxyphenylthiazole), 4-(2-thienyl)thiazole, and 4,5-di(2-furyl)thiazole), benzothiazoles (such as benzothiazole, 4-chlorobenzothiazole, 5-chlorobenzothiazole, 6-chlorobenzothiazole, 7-chlorobenzothiazole, 4-methylbenzothiazole, 5-methylbenzothiazole, 6-methylbenzothiazole, 5-bromobenzothiazole, 4-phenylbenzothiazole, 5-phenylbenzothiazole, 4-methoxybenzothiazole, 5-methoxybenzothiazole, 6-methoxybenzothiazole, 5-iodobenzothiazole, 6-iodobenzothiazole, 4-ethoxybenzothiazole, 5-ethoxybenzothiazole, tetrahydrobenzothiazole, 5,6-dimethoxybenzothiazole, 5,6-dioxymethylene benzothiazole, 5-hydroxybenzothiazole, 6-hydroxybenzothiazole, 6-dimethylaminobenzothiazole, and 5-ethoxycarbonylbenzothiazole), naphthothiazoles (such as naphtho[1,2]thiazole, naphtho[2,1]thiazole, 5-methoxynaphtho[2,1]thiazole, 5-ethoxynaphtho[2,1]thiazole, 8-methoxynaphtho[1,2]thiazole, and 7-methoxynaphtho[1,2]thiazole), thianaphtheno-7',6',4,5-thiazoles (such as 4'-methoxythianaphtheno-7',6',4,5-thiazole), oxazoles (such as 4-methyloxazole, 5-methyloxazole, 4-phenyloxazole, 4,5-diphenyloxazole, 4-ethyloxazole, 4,5-dimethyloxazole, and 5-phenyloxazole), benzoxazoles (e.g. benzoxazole, 5-chlorobenzoxazole, 5-methyl benzoxazole, 5-phenylbenzooxazole, 6-methylbenzoxazole, 5,6-dimethylbenzoxazole, 4,6-dimethylbenzoxazole, 6-methoxybenzoxazole, 5-methoxybenzoxazole, 4-ethoxybenzoxazole, 5-chlorobenzoxazole, 6-methoxybenzoxazole, 5-hydroxybenzoxazole, and 6-hydroxybenzoxazole), naphthooxazoles (such as naphtho[1,2]oxazole and naphtho[2,1]oxazole), selenazoles (such as 4-methylselenazole and 4-phenylselenazole), benzoselenazoles (such as benzoselenazole, 5-chlorobenzoselenazole, 5-methoxybenzoselenazole, 5-hydroxybenzoselenazole, and tetrahydrobenzoselenazole), naphthoselenazoles (such as naphtho[1,2]selenazole, and naphtho[2,1]selenazole), thiazolines (such as thiazoline, 4-methylthiazoline, 4,5-dimethylthiazoline, 4-phenylthiazoline, 4,5-di(2-furyl)thiazoline, 4,5-diphenylthiazoline, and 4,5-di(p-methoxyphenyl)thiazoline), 2-quinolines (such as quinoline, 3-methylquinoline, 5-methylquinoline, 7-methylquinoline, 8-methylquinoline, 6-chloroquinoline, 8-chloroquinoline, 6-methoxyquinoline, 6-ethoxyquinoline, 6-hydroxyquinoline, and 8-hydroxyquinoline), 4-quinolines (e.g. quinoline, 6-methoxyquinoline, 7-methylquinoline, and 8-methylquinoline), 1-isoquinolines (such as isoquinoline and 3,4-dihydroisoquinoline), 3-isoquinolines (such as isoquinoline), benzimidazoles (such as 1,3-dimethylbenzimidazole, 1,3-diethylbenzimidazole, and 1-ethyl-3-phenylbenzimidazole), 3,3-dialkylindolenines (such as 3,3-dimethylindolenine, 3,3,5-trimethylindolenine, and 3,3,7-trimethylindolenine), 2-pyridines (such as pyridine and 5-methylpyridine), and 4-pyridine (such as pyridine). These ring substituents may be combined with each other to form a ring.

Examples of the sulfur-containing heterocycle include dithiol partial structures in dyes described in JP-A No. 3-296759.

Specific examples thereof include benzodithiols (such as benzodithiol, 5-t-butylbenzodithiol, and 5-methylbenzodithiol), naphthodithiols (such as naphtho[1,2]dithiol, and naphtho[2,1]dithiol), dithiols (such as 4,5-dimethyldithiols, 4-phenyldithiols, 4-methoxycarbonyldithiols, 4,5-dimethoxycarbonyldithiols, 4,5-diethoxycarbonyldithiols, 4,5-ditrifluoromethyldithiols, 4,5-dicyanodithiol, 4-methoxycarbonylmethyldithiol, and 4-carboxymethyldithiol).

Of the examples of the nitrogen- or sulfur-containing heterocycle that is formed by $Y^5$ together with $A^5$ and the carbon atoms adjacent to $Y^5$ in the formula (5), a dye having a structure represented by the following partial structural formula (6) is particularly preferable since the dye has a high sensitizing capability and provides a photosensitive composition having extremely excellent storage stability.

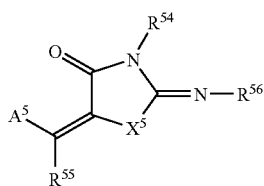

Formula (6)

In the formula (6), $A^5$ represents a substituted or unsubstituted aromatic ring or a substituted or unsubstituted heterocycle; $X^5$ represents an oxygen atom, a sulfur atom, or —N($R^{51}$)—; $R^{51}$, $R^{54}$, $R^{55}$ and $R^{56}$ each independently represent a hydrogen atom or a monovalent group of nonmetal atoms; and $A^5$, and any one of $R^{51}$, $R^{54}$, $R^{55}$ and $R^{56}$ may be bonded to each other to form an aliphatic or aromatic ring.

In the formula (6), $A^5$ and $R^{51}$ have the same meanings as $A^5$ and $R^{51}$ in the formula (5), respectively, and $R^{54}$, $R^{55}$ and $R^{56}$ have the same meanings as $R^{52}$, $R^{53}$ and $R^{51}$ in the formula (5), respectively.

The compound represented by the formula (5) is more preferably a compound represented by the following formula (7).

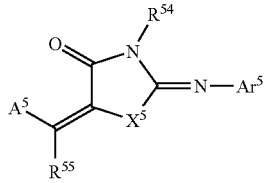

Formula (7)

In the formula (7), $A^5$ represents a substituted or unsubstituted aromatic ring or a substituted or unsubstituted heterocycle; $X^5$ represents an oxygen atom, a sulfur atom, or —N($R^{51}$)—; $R^{51}$, $R^{54}$, and $R^{55}$ each independently represent a hydrogen atom or a monovalent group of nonmetal atoms; $A^5$ and $R^{51}$, $R^{54}$ or $R^{55}$ may be bonded to each other to form an aliphatic or aromatic ring; and $Ar^5$ represents a substituted aromatic ring or a substituted heterocycle, provided that the total number of the Hammett value(s) of the substituent(s) present on the skeleton of $Ar^5$ is larger than zero. The phrase "the total number of the Hammett values is larger than zero" indicates that when $Ar^5$ has one substituent, the Hammett value of the substituent is larger than zero, and when $Ar^5$ has plural substituents, the total number of the Hammett values of the substituents is larger than zero.

In the formula (7), $A^5$ and $R^{51}$ have the same meanings as $A^5$ and $R^{51}$ in the formula (5), respectively; $R^{54}$ has the same meaning as $R^{52}$ in the formula (5); and $R^{55}$ has the same meaning as $R^{53}$ in the formula (5). $Ar^5$ represents a substituted aromatic ring or a substituted heterocycle, and specific examples thereof include the specific examples of the substituted aromatic ring or substituted heterocycle described with respect to $A^5$ in the formula (5), provided that the total of the Hammett value(s) of the substituent(s) that may be introduced onto the skeleton of $Ar^5$ in the formula (7) is larger than zero. Examples of the substituent(s) that may be introduced onto the skeleton of $Ar^5$ include halogen atoms, trifluoromethyl, carbonyl, ester, nitro, cyano, sulfoxide, amide, and carboxyl groups. The Hammett values of these substituents are as follows: trifluoromethyl groups (—$CF_3$, m: 0.43, p: 0.54), carbonyl groups (e.g., —COH, m: 0.36, p: 0.43), ester groups (e.g., —$COOCH_3$, m: 0.37, p: 0.45), halogen atoms (e.g., Cl, m: 0.37, p: 0.23), cyano groups (—CN, m: 0.56, p: 0.66), sulfoxide groups (e.g., —$SOCH_3$, m: 0.52, p: 0.45), amide groups (e.g., —$NHCOCH_3$, m: 0.21, p: 0.00), and carboxyl groups (—COOH, m: 0.37, p: 0.45). In each of the above parentheses, the position(s) on the aryl skeleton, into which the corresponding substituent is introduced, and the Hammett value of the substituent are indicated. For example, "(m: 0.50)" indicates that when the corresponding substituent is introduced into a meta position on an aryl skeleton, the substituent has a Hammett value of 0.50. A preferable example of $Ar^5$ is a substituted phenyl group, and preferable examples of the substituent on the skeleton of $Ar^5$ include ester and cyano groups. The position of the substituent on the skeleton of $Ar^5$ is preferably an ortho position.

Specific preferable examples of the sensitizing dye represented by the formula (5) are shown below (Exemplified compounds D1 to D57). However, the dye is not limited thereto.

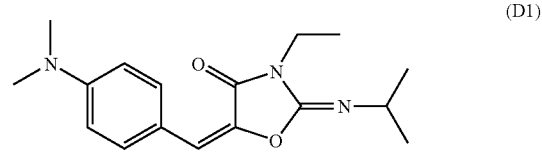

(D1)

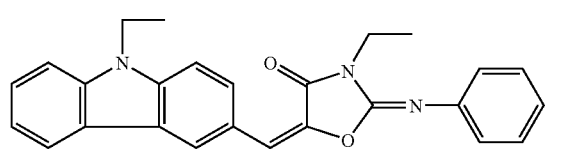

(D2)

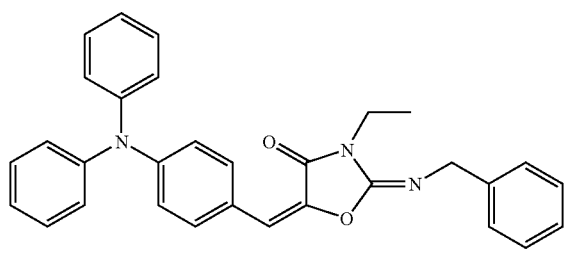

(D3)

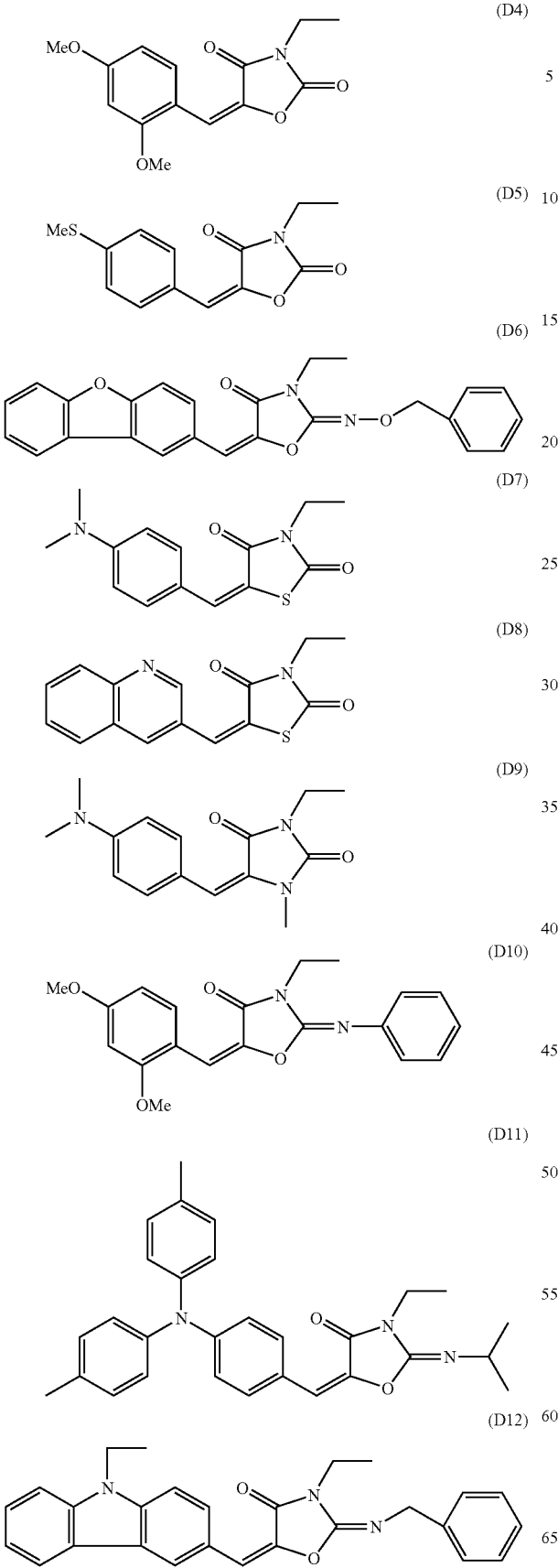
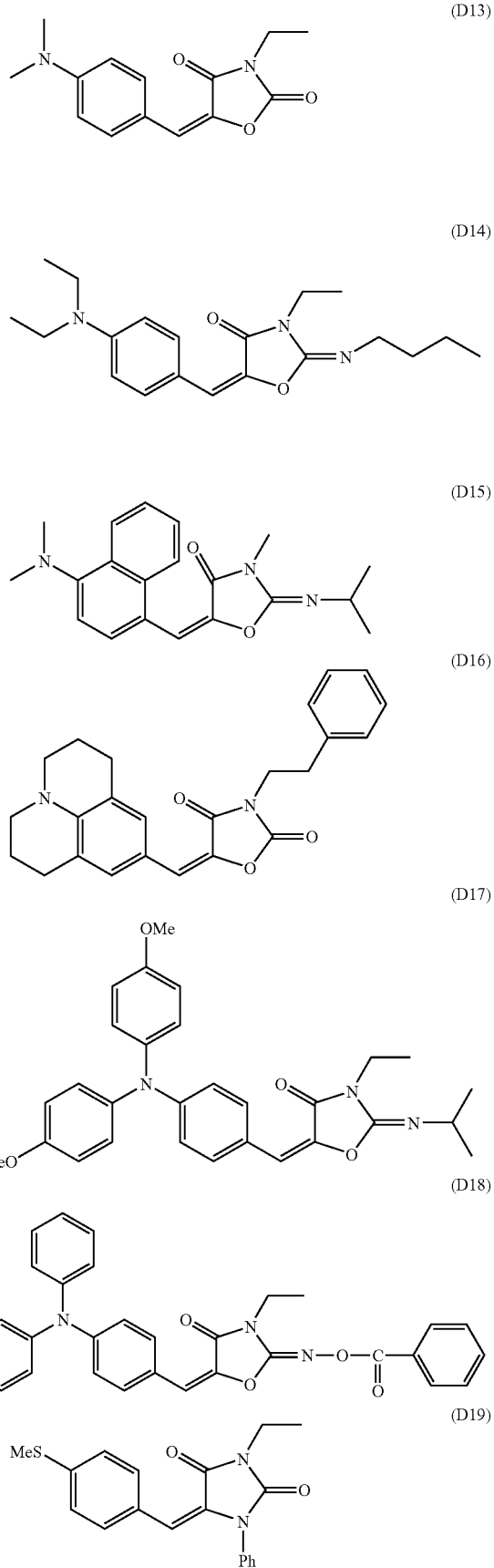

-continued
(D20)
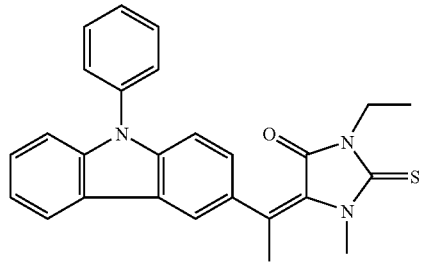
(D21)
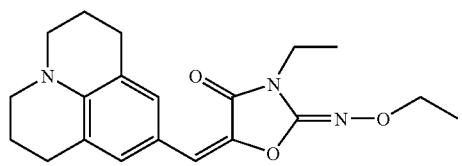
(D22)
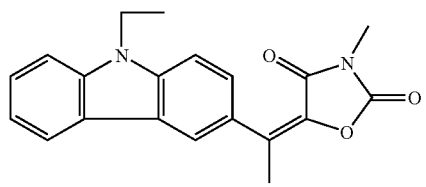
(D23)
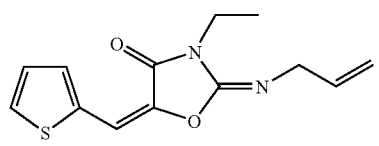
(D24)
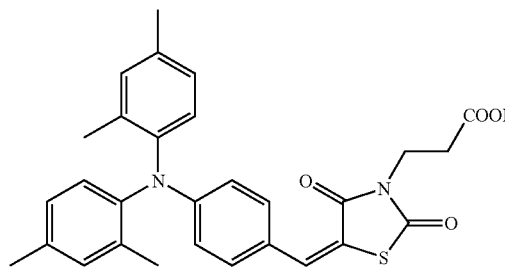
(D25)
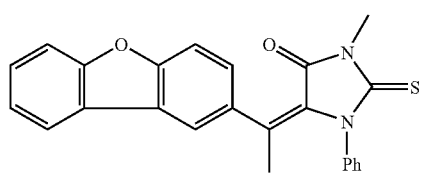
(D26)
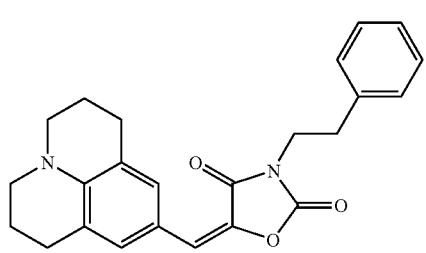
(D27)
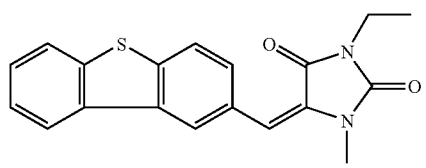
-continued
(D28)
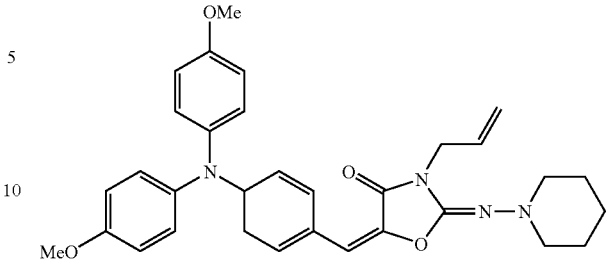
(D29)
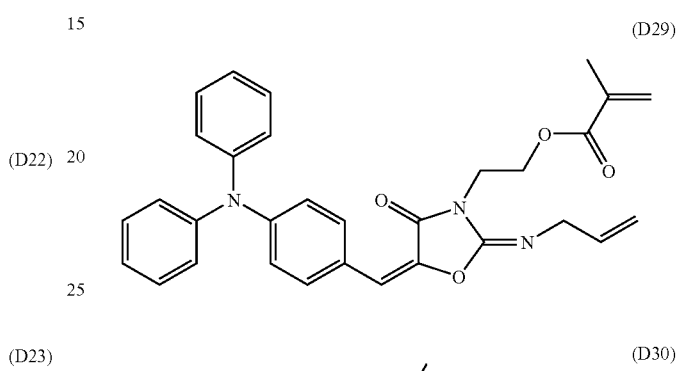
(D30)
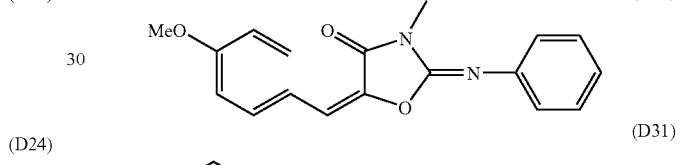
(D31)
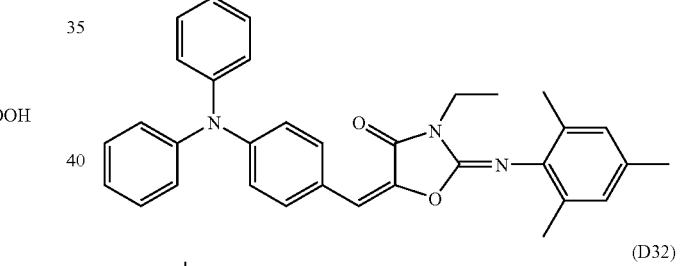
(D32)
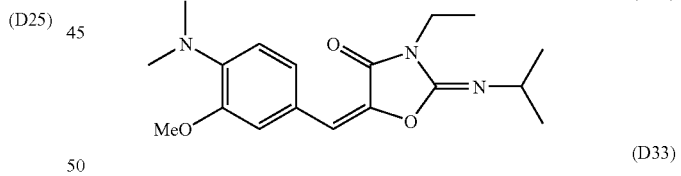
(D33)
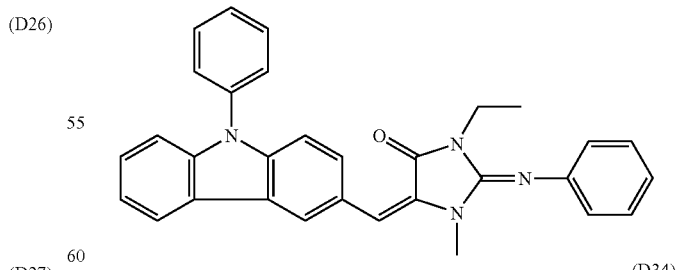
(D34)
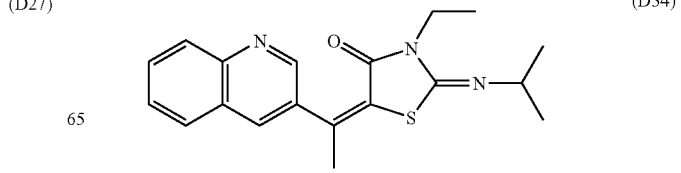

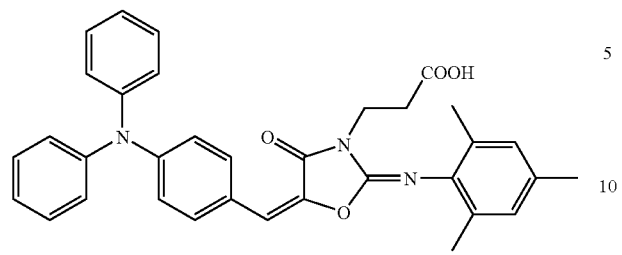
(D35)
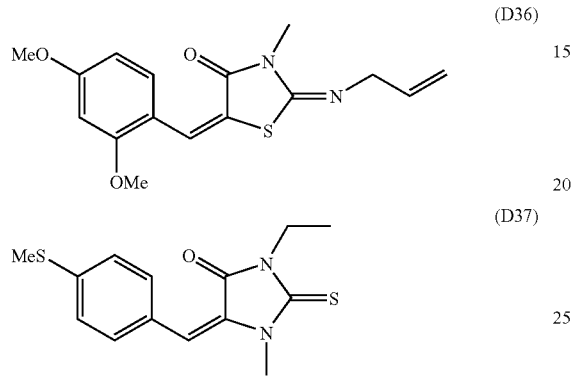
(D36)
(D37)
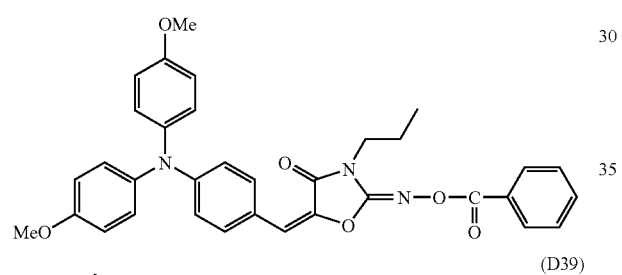
(D38)
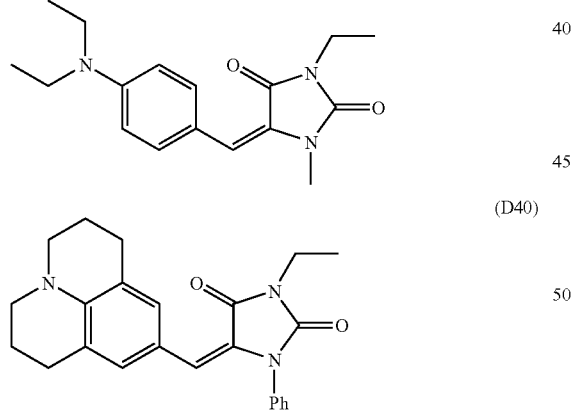
(D39)
(D40)
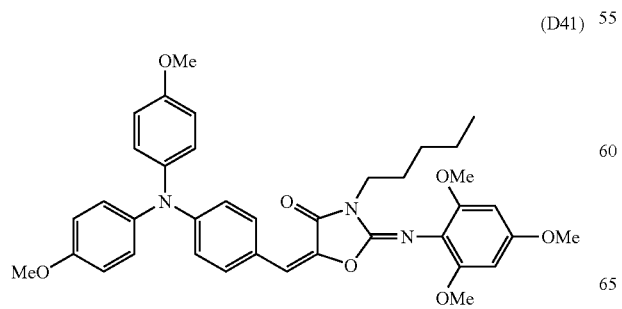
(D41)
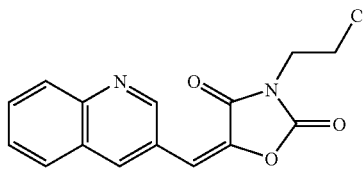
(D42)
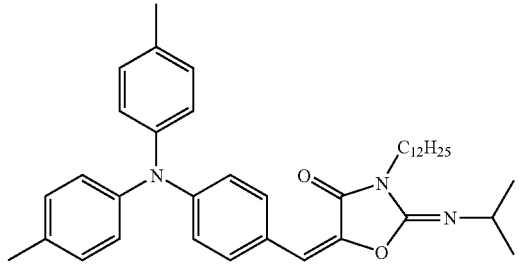
(D43)
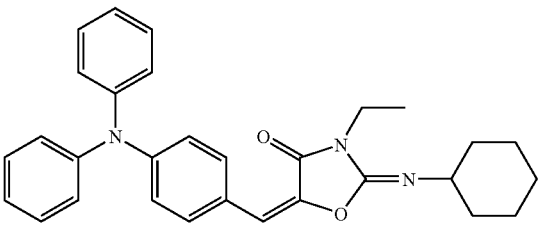
(D44)
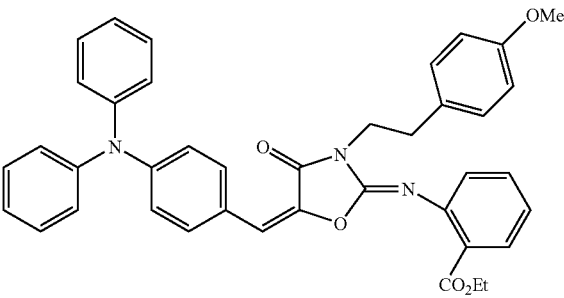
(D45)
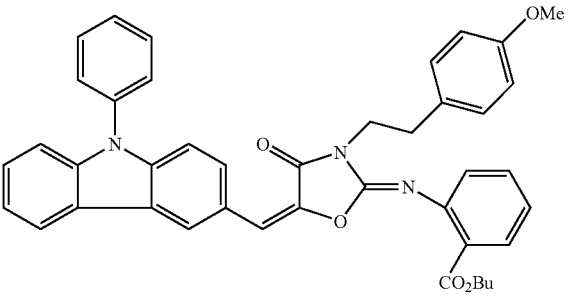
(D46)

-continued
(D47)
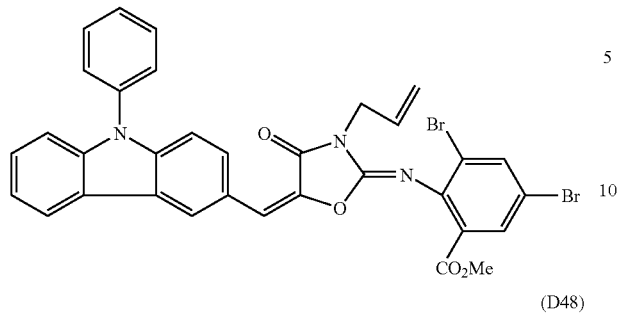
(D48)
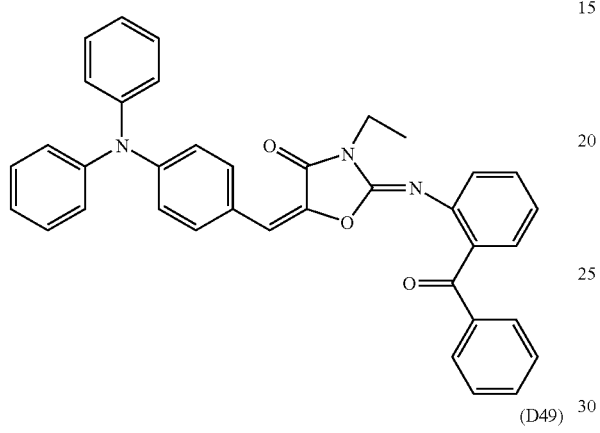
(D49)
(D50)
(D51)
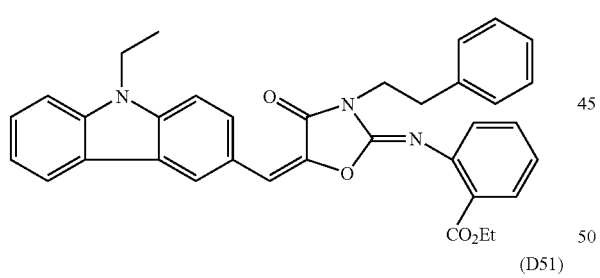
(D52)
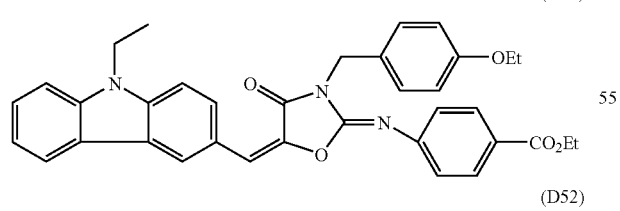
(D53)
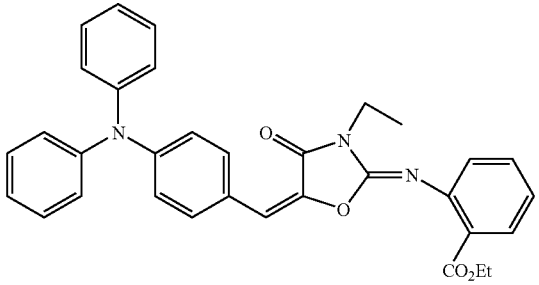
(D54)
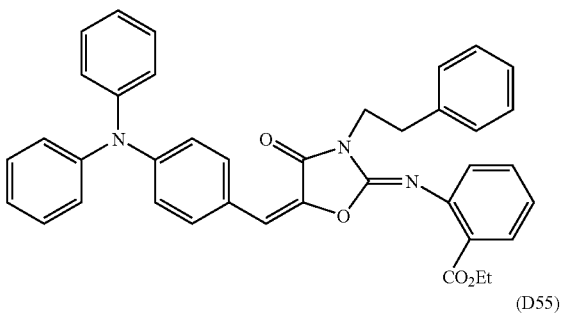
(D55)
(D56)
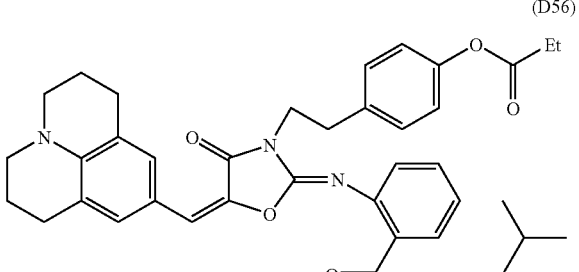
(D57)
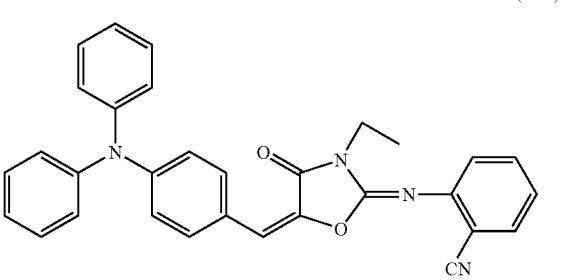

The compound represented by the formula (5) will be described.

The compound represented by the formula (5) is usually prepared by condensation reaction between an acidic nucleus having an active methylene group and a substituted or unsubstituted aromatic ring or heterocycle, which can be synthesized in accordance with JP-B No. 59-28329. Examples of the reaction method include condensation reaction between an acidic nuclear compound and a basic nuclear material having an aldehyde group or a carbonyl group on the heterocycle, as shown in the following reaction formula (1). The condensation reaction is conducted, as necessary, in the presence of a base. The base may be freely selected from generally used bases such as amines, pyridines (e.g. trialkylamine, dimethylamino pyridine, and diazabicycloundecene DBU), metal amides (e.g. lithium diisopropylamide), metal alkoxides (e.g. sodium methoxide and potassium-t-butoxide), and metal hydrides (e.g. sodium hydride and potassium hydride).

Reaction Formula (1)

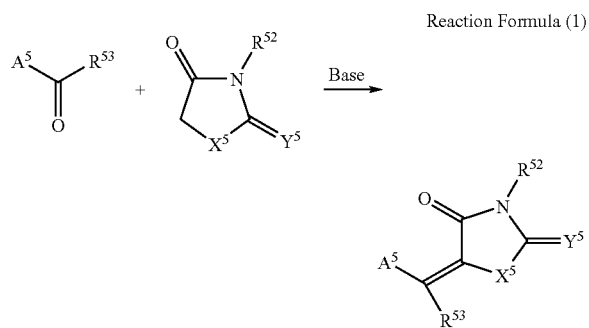

Alternatively, the synthesis method may be a method according to the following reaction formula (2). Specifically, an acidic nuclear compound wherein $Y^5$ is a sulfur atom as the acidic nuclear compound in the reaction formula (1) is used as a starting material. The same procedures as in the reaction formula (1) are conducted from start of the reaction up to the procedure of synthesizing a dye precursor by condensation reaction between the compound as the starting material and a basic nuclear material having an aldehyde or carbonyl group on a heterocycle. Thereafter, the dye precursor is further reacted with a metal salt capable of chemically interacting with a sulfur atom to form a metal sulfide, and water or a primary amine compound (R—$NH_2$ wherein R represents a monovalent group of nonmetal atoms).

Of these methods, the method according to the reaction represented by the reaction formula (2) is particularly preferable from the viewpoint of synthesis efficiency because the yield of the product obtained by the reaction is high. The reaction represented by the reaction formula (2) is particularly useful for synthesizing the compound represented by the formula (6).

Reaction Formula (2)

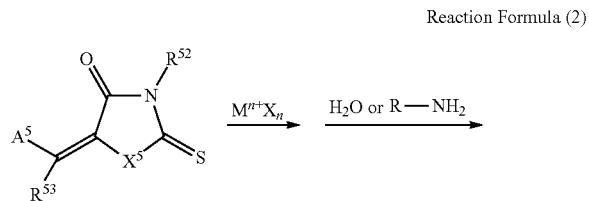

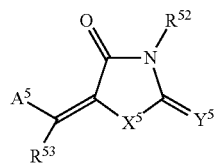

In the reaction formula (2), $M^{n+}X_n$ represents a metal salt which chemically interacts with a sulfur atom in the thiocarbonyl group to form a metal sulfide. Specific examples of the compound include AgBr, AgI, AgF, AgO, AgCl, $Ag_2O$, $Ag(NO_3)$, $AgSO_4$, $AgNO_2$, $Ag_2CrO_4$, $Ag_3PO_4$, $Hg_2(NO_3)_2$, $HgBr_2$, $Hg_2Br_2$, HgO, $HgI_2$, $Hg(NO_3)_2$, $Hg(NO_2)_2$, $HgBr_2$, $HgSO_4$, $Hg_2I_2$, $Hg_2SO_4$, $Hg(CH_3CO_2)_2$, AuBr, $AuBr_3$, AuI, $AuI_3$, $AuF_3$, $Au_2O_3$, AuCl, $AuCl_3$, CuCl, CuI, $CuI_2$, $CuF_2$, CuO, $CuO_2$, $Cu(NO_3)_2$, $CuSO_4$, and $Cu_3(PO_4)_2$, in which M is Al, Au, Ag, Hg, Cu, Zn, Fe, Cd, Cr, Co, Ce, Bi, Mn, Mo, Ga, Ni, Pd, Pt, Ru, Rh, Sc, Sb, Sr, Mg, Ti, or the like, and X is F, Cl, Br, I, $NO_3$, $SO_4$, $NO_2$, $PO_4$, $CH_3CO_2$, or the like. Among them, a silver salt is a most preferable metal salt because it readily interacts with a sulfur atom.

The sensitizing dye represented by the formula (5) used in the invention can be subjected to various chemical modification to improve the property of the photosensitive layer. For example, the sensitizing dye may be combined with an addition polymerizable compound structure (e.g. an acryloyl group or a methacryloyl group) through a covalent bond, an ionic bond, a hydrogen bond, or the like to increase the strength of the light-exposed film and suppress the unnecessary deposition of dyes from the light-exposed film.

Further, photosensitivity can be remarkably enhanced under particularly low concentration of an optical initiation system, by bonding the sensitizing dye with the above-described radical generating partial structure in the initiator compound (e.g. reduction decomposable sites such as alkyl halide, onium, peroxide, and biimidazole, and oxidation disintegrating sites such as borate, amine, trimethylsilylmethyl, carboxymethyl, carbonyl, and imine).

Further, in the case where the image recording material of the invention is used as a planographic printing plate precursor having a negative-working photosensitive layer, which is a preferable aspect of the invention, it is effective to introduce a hydrophilic site (acid groups or polar groups such as a carboxyl group and esters thereof, a sulfonic group and esters thereof, and an ethylene oxide group). Particularly, an ester type hydrophilic group exhibits excellent compatibility in the photosensitive layer due to its relatively hydrophobic structure, and generates an acid group upon hydrolysis to increase its hydrophilicity in a developer.

Additionally, for example, a substituent may be introduced as appropriate to improve compatibility in the photosensitive layer and to suppress crystal deposition. For example, in a certain kind of photosensitive system, an unsaturated bond such as an aryl group or an allyl group may be considerably effective at improving the compatibility. Besides, crystal deposition is remarkably suppressed by introducing steric hindrance between the n planes of the dye through introduction of a branched alkyl structure or other method. Further, adhesiveness of a metal, metal oxide and the like to an inorganic substance is improved by introducing a phosphonate group, an epoxy group, a trialkoxysilyl group, or the like.

Alternatively, polymerization of the sensitizing dye or other methods may be used according to the intended use.

It is preferable to use, as the sensitizing dye used in the invention, at least one sensitizing dye represented by the formula (5). As far as the dye represented by the formula (5) is used, the particular manner of use thereof may be selected as appropriate in accordance with the intended function and/or performance of a finally-obtained photosensitive material. For example, it is possible to select, as appropriate, which particular structure of the dye is used, with reference to the above-described dye modifications, whether a single dye is used or a combination of two or more different dyes are used, and the amount of dye added. As an example, by using a combination of two or more sensitizing dyes, the compatibility of the dye with the photosensitive layer can be increased.

An important factor for the selection of the sensitizing dye is the molar absorption coefficient thereof at the wavelength of light emitted from a light source utilized, in addition to the photosensitivity. It is economically advantageous to use a dye having a large molar absorption coefficient because the addition amount of the dye can be relatively small. The use of such a dye is also advantageous from viewpoint of the film-related properties of the photosensitive layer.

In addition to the sensitizing dye represented by the formula (5), a different, conventional sensitizing dye may be used in the invention as far as the advantageous effects of the invention are not impaired.

Because the photosensitivity and resolution of the photosensitive layer and the film properties of the recording layer are greatly influenced by the absorbance at the light source wavelength, the amount of a sensitizing dye is appropriately determined from the viewpoint of these factors.

For example, in a region where the absorbance is as low as 0.1 or less, the sensitivity lowers and the resolution is reduced due to the influence of halation. For example, for curing a film as thick as 5 μm or more, however, the degree of curing may be increased rather at such a low absorbance. In a region where the absorbance is as high as 3 or more, most of the light is absorbed at the surface of the photosensitive layer and, as a result, curing in the internal portion is inhibited. Therefore, when the curable composition of the invention is used as a planographic printing plate precursor, the film strength and the adhesiveness to the support may become insufficient.

When the planographic printing plate precursor of the invention includes, for example, a photosensitive layer having a relatively thin layer thickness, the addition amount of the sensitizing dye is such that the absorbance of the photosensitive layer is preferably within the range of from 0.1 to 1.5, and more preferably from 0.25 to 1. Since the absorbance is determined in accordance with the addition amount of the sensitizing dye and the thickness of the photosensitive layer, a desired absorbance may be obtained by controlling the addition amount and the thickness. The absorbance of the photosensitive layer may be measured by a conventional method. Examples of the measurement method include a method including forming, onto a transparent or white support, a photosensitive layer to an appropriately determined thickness, such that the coating amount of a coating solution for the photosensitive layer (or photosensitive layer coating solution) after drying is within the range necessary for a planographic printing plate precursor, and then measuring the absorbance with a transmission optical densitometer, and a method including forming a recording layer onto a reflective support made of aluminum or the like, and then measuring the reflection density thereof.

When a photosensitive layer used in the invention is used as a recording layer of a planographic printing plate precursor, the addition amount of the sensitizing dye is usually from 0.05 to 30 parts by mass, preferably from 0.1 to 20 parts by mass, and more preferably from 0.2 to 10 parts by mass, with respect to 100 parts by mass of the total solid content of the photosensitive layer.

Infrared Absorbing Agent

When the composition of the invention is exposed to an infrared ray having a wavelength of 760 to 1200 nm from a laser, as a light source, that emits such infrared rays, the composition may also include, as a sensitizing dye, an infrared absorbing agent having an absorption maximum in this wavelength range. The infrared absorbing agent can convert an infrared ray that is absorbed therein into heat. By the heat generated at this time, the radical generator (i.e. polymerization initiator) is thermally decomposed to generate a radical. The infrared absorbing agent used in the invention may be a dye or pigment having an absorption maximum in a wavelength range from 750 to 850 nm.

The dye may be a commercially available dye or a known dye described in, for example, "Senryo Binran" (Dye Handbook) (edited by the Society of Synthetic Organic Chemistry, Japan, and published in 1970). Specific examples thereof include azo dyes, metal complex salt azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts, and metal thiolate complexes.

Specific examples thereof include cyanine dyes described in JP-A Nos. 58-125246, 59-84356, 59-202829, and 60-78787, methine dyes described in JP-A Nos. 58-173696, 58-181690, and 58-194595, naphthoquinone dyes described in 58-112793, 58-224793, 59-48187, 59-73996, 60-52940, and 60-63744, squarylium dyes described in JP-A No. 58-112792, and cyanine dyes described in GB Patent No. 434,875.

Other examples of the dye include near infrared absorption sensitizers described in U.S. Pat. No. 5,156,938, substituted arylbenzo(thio)pyrylium salts described in U.S. Pat. No. 3,881,924, trimethinethiapyrylium salts described in JP-A No. 57-142645 (U.S. Pat. No. 4,327,169), pyrylium compounds described in JP-A Nos. 58-181051, 58-220143, 59-41363, 59-84248, 59-84249, 59-146063, and 59-146061, cyanine dyes described in JP-A No. 59-216146, pentamethinethiopyrylium salts described in U.S. Pat. No. 4,283,475, and pyrylium compounds described in JP-B Nos. 5-13514, and 5-19702. Additional examples of the dye include near infrared absorbing dyes represented by the formulae (I) and (II) described in the specification of U.S. Pat. No. 4,756,993.

Further, preferred examples of the infrared absorbing dye to be used in the invention include the following specific indolenine cyanine dyes described in JP-A No. 2002-278057.

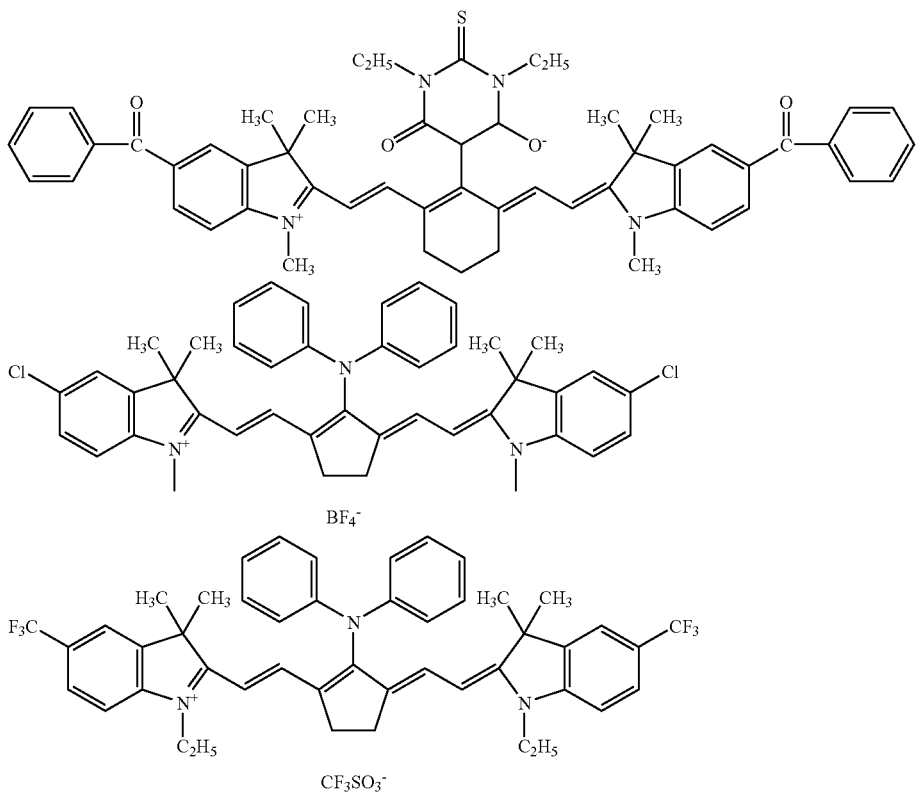

Of these dyes, preferable are cyanine dyes, squarylium dyes, pyrylium dyes, nickel thiolate complexes, and indolenine cyanine dyes. More preferable are cyanine dyes and indolenine cyanine dyes. Even more preferable are dyes represented by the following formulae (a) to (e) from the viewpoint of sensitivity, and particularly preferable is the cyanine dye represented by the following formula (a) since the dye provides a high polymerization activity and is excellent in stability and economical efficiency when the dye is used in the recording layer in the invention.

Formula (a)

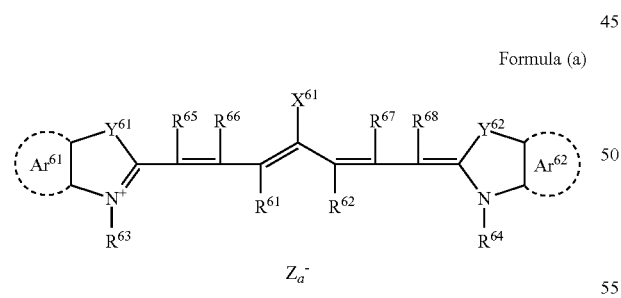

In the formula (a), $X^{61}$ represents a hydrogen atom, a halogen atom, —$NAr^{63}_2$, $X^{62}$-$L^{61}$ or the group represented by the following formula (a-1). $Ar^{63}$ represents an aromatic hydrocarbon group having 6 to 14 carbon atoms, and the aromatic hydrocarbon group may have one or more substituents selected from the group consisting of halogen atoms, alkyl groups, allyl groups, alkenyl groups, alkynyl groups, cyano groups, carboxy groups, nitro groups, amide groups, ester groups, alkoxy groups, amino groups and heterocyclic groups, and these substituents may themselves be substituted by such a substituent as those described above. $X^{62}$ represents an oxygen atom, a sulfur atom or —$N(R^x)$— wherein $R^x$ represents a hydrogen atom or a hydrocarbon group having 1 to 10 carbon atoms. $L^{61}$ represents a hydrocarbon group having 1 to 12 carbon atoms, an aromatic ring having a heteroatom, or a hydrocarbon group having 1 to 12 carbon atoms and containing a heteroatom. The term "heteroatom" used herein refers to an atom selected from N, S, O, a halogen atom or Se.

Formula (a-1)

In the formula (a-1), $X_a^-$ has the same meaning as $Z_a^-$, which will be described later, and $R^a$ represents a substituent selected from the group consisting of a hydrogen atom, an alkyl group, an aryl group, a substituted or unsubstituted amino group, and a halogen atom.

$R^{61}$ and $R^{62}$ each independently represent a hydrocarbon group having 1 to 12 carbon atoms. From the viewpoint of the storage stability of a photosensitive layer coating solution, $R^{61}$ and $R^{62}$ each preferably represent a hydrocarbon group having 2 or more carbon atoms, and more preferably, $R^{61}$ and $R^{62}$ are bonded to each other to form a 5-membered or 6-membered ring.

$Ar^{61}$ and $Ar^{62}$ may be the same as or different from each other, and each independently represent an aromatic hydrocarbon group which may have a substituent. The aromatic hydrocarbon group is preferably a benzene ring or a naphthalene ring. Examples of the substituent include a hydrocarbon group having 12 or less carbon atoms, a halogen atom and an alkoxy group having 12 or less carbon atoms. $Y^{61}$ and $Y^{62}$ may be the same as or different from each other, and each independently represent a sulfur atom or a dialkyl methylene group having 12 or less carbon atoms. $R^{63}$ and $R^{64}$ may be the same as or different from each other, and each independently represent a hydrocarbon group which has 20 or less carbon atoms and which may have a substituent. Examples of the substituent include an alkoxy group having 12 or less carbon atoms, a carboxyl group and a sulfo group. $R^{65}$, $R^{66}$, $R^{67}$ and $R^{68}$ may be the same as or different from each other, and each independently represent a hydrogen atom or a hydrocarbon group having 12 or less carbon atoms. Each of $R^{65}$, $R^{66}$, $R^{67}$ and $R^{68}$ is preferably a hydrogen atom because the starting material is easily available. $Z_a^-$ represents a counter anion. However, when the cyanine dye represented by the formula (a) has an anionic substituent in its structure and does not necessitate neutralization of the charge, $Z_a^-$ may not be present. From the viewpoint of the storage stability of the photosensitive layer coating solution, $Z_a^-$ may be a halogen ion, a perchlorate ion, a tetrafluoroborate ion, a hexafluorophosphate ion or a sulfonate ion, particularly preferably a perchlorate ion, a hexafluorophosphate ion or an aryl sulfonate ion.

Examples of the cyanine dye that is represented by the formula (a) and can be preferably used in the invention include dyes described in JP-A No. 2001-133969, paragraphs [0017] to [0019], JP-A No. 2002-40638, paragraphs [0012] to [0038], and JP-A No. 2002-23360, paragraphs [0012] to [0023], and compounds shown below.

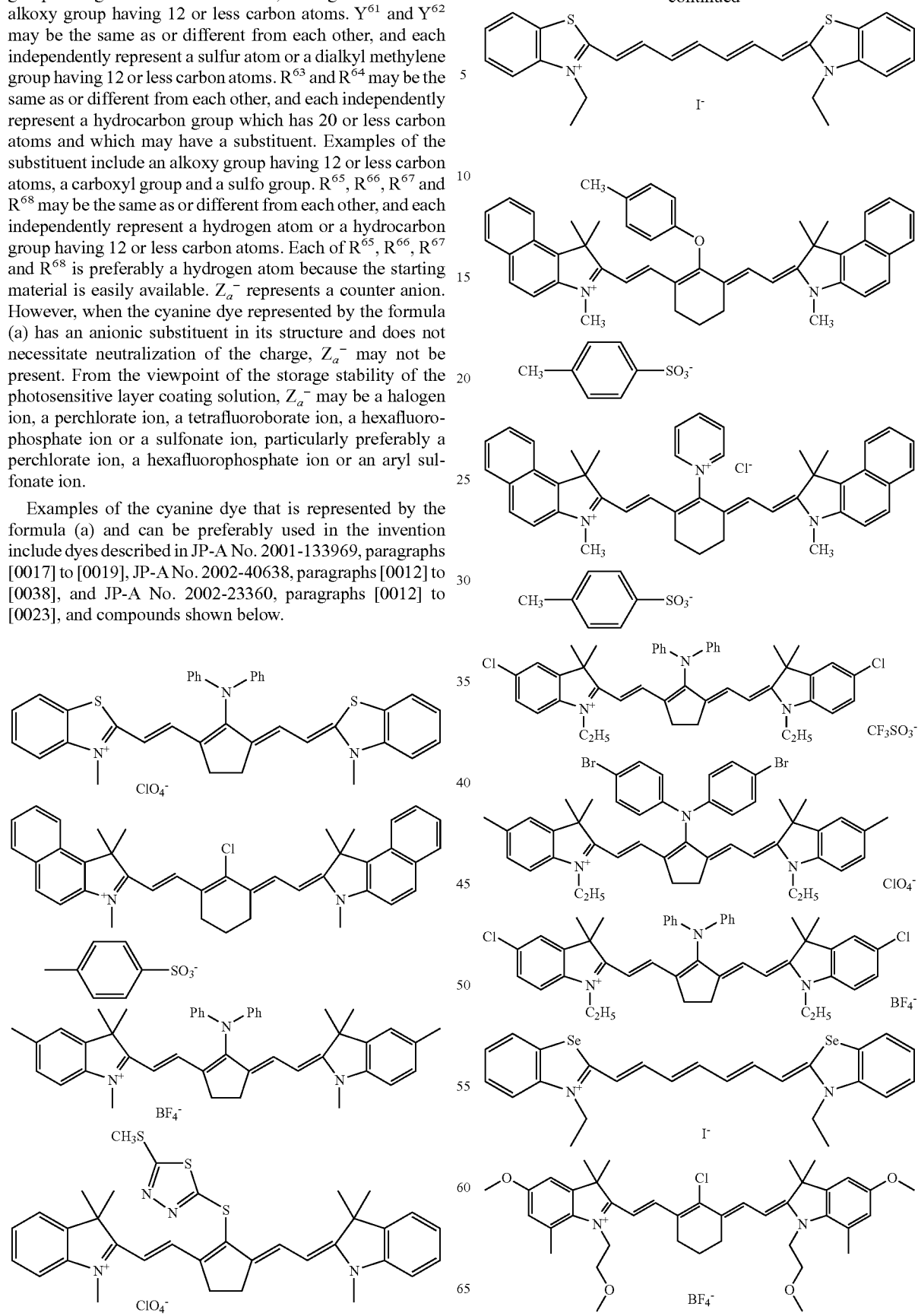

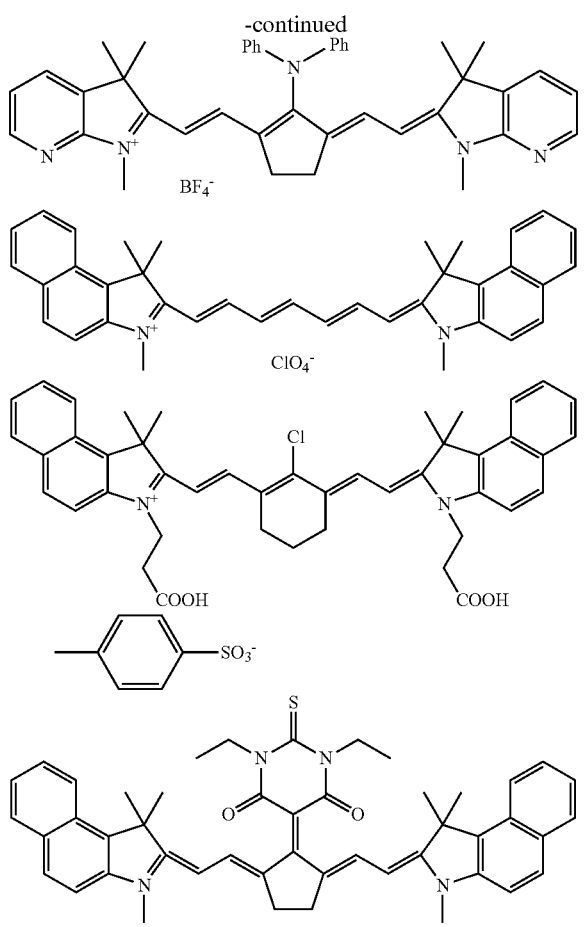

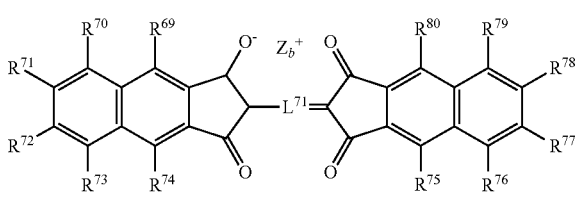

Formula (b)

In the formula (b), $L^{71}$ represents a methine chain which has 7 or more conjugated carbon atoms and may have one or more substituents, and two or more of the substituents may be bonded to each other to form a cyclic structure, and $Z_b^+$ represents a counter cation. Examples of the counter cation include ammonium, iodonium, sulfonium, phosphonium and pyridinium cations, and alkali metal cations ($Na^+$, $K^+$, and $Li^+$). $R^{69}$ to $R^{74}$, and $R^{75}$ to $R^{80}$ each independently represent a substituent selected from the group consisting of hydrogen and halogen atoms, and cyano, alkyl, aryl, alkenyl, alkynyl, carbonyl, thio, sulfonyl, sulfinyl, oxy and amino groups, or represents a substituent obtained by combining two or three of these substituents. Two or more of these substituents may be bonded to each other to form a cyclic structure. Of the compounds represented by the formula (b), preferred is a compound in which $L^{71}$ represents a methine chain having 7 conjugated carbon atoms and $R^{69}$ to $R^{74}$ and $R^{75}$ to $R^{80}$ each represent a hydrogen atom, from the viewpoints of availability of the compound and effects of the compound.

Specific examples of the dye represented by the formula (b), which can be preferably used in the invention, are shown below.

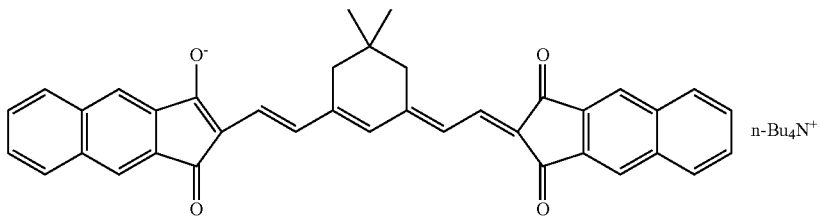

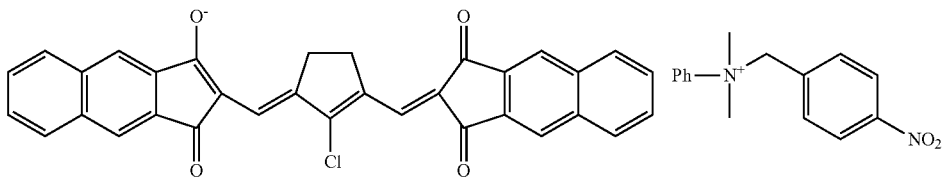

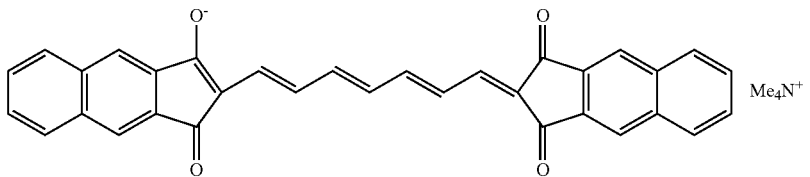

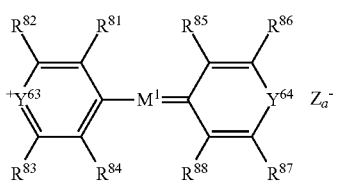

In the formula (c), $Y^{63}$ and $Y^{64}$ each independently represent an oxygen, sulfur, selenium or tellurium atom; $M^1$ represents a methine chain having 5 or more conjugated carbon atoms; and $R^{81}$ to $R^{84}$ and $R^{85}$ to $R^{88}$, which may be the same or different, each represent a hydrogen or halogen atom, or a cyano, alkyl, aryl, alkenyl, alkynyl, carbonyl, thio, sulfonyl, sulfinyl, oxy or amino group; and $Z_a^-$ represents a counter anion and has the same meaning as $Z_a^-$ in the formula (a).

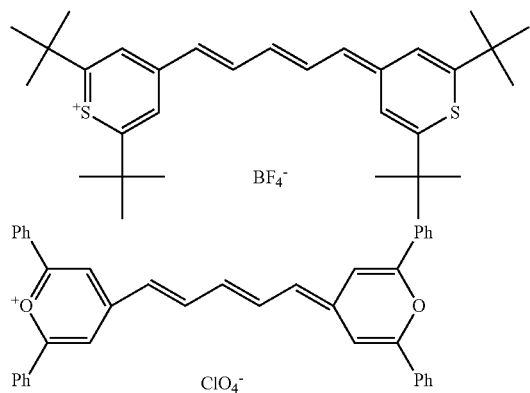

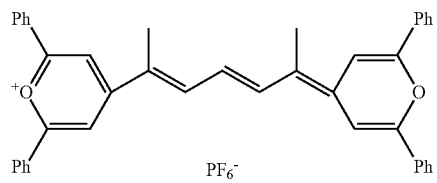

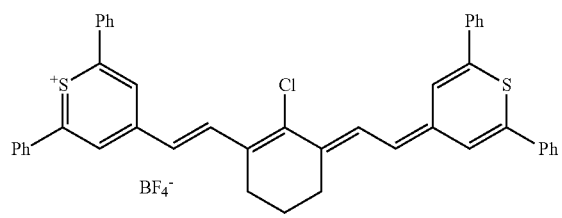

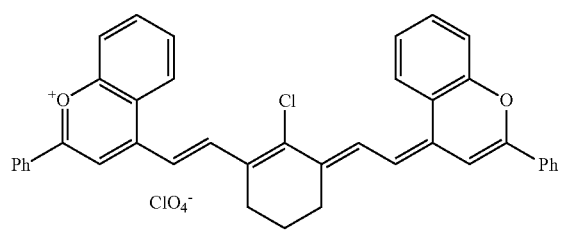

Formula (c)

-continued

Formula (d)

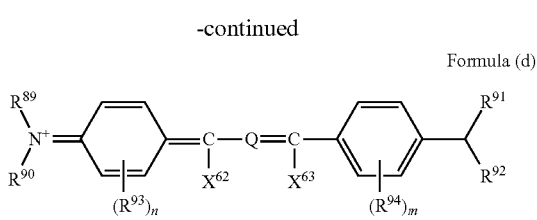

In the formula (d), $R^{89}$ to $R^{92}$ each independently represent a hydrogen atom, or an alkyl or aryl group; $R^{93}$ and $R^{94}$ each independently represent an alkyl or substituted oxy group, or a halogen atom; and n and m each independently represent an integer of 0 to 4. $R^{89}$ and $R^{90}$ may be bonded to each other to form a ring. $R^{91}$ and $R^{92}$ may be bonded to each other to form a ring. At least one of $R^{89}$ or $R^{90}$, and $R^{93}$ may be bonded to each other to form a ring. At least one of $R^{91}$ or $R^{92}$, and $R^{94}$ may be bonded to each other to form a ring. When plural $R^{93}$s are present, plural $R^{93}$s may be bonded to each other to form a ring, When plural $R^{94}$s are present, plural $R^{94}$s may be bonded to each other to form a ring. $X^{62}$ and $X^{63}$ each independently represent a hydrogen atom, or an alkyl or aryl group provided that at least one of $X^{62}$ or $X^{63}$ represents a hydrogen atom or an alkyl group. Q represents a substituted or unsubstituted trimethine or pentamethine group, and may be combined with a bivalent organic group to form a cyclic structure. $Z_c^-$ represents a counter anion, and has the same meaning as $Z_a^-$ in the formula (a).

Specific examples of the dye represented by the formula (d), which can be preferably used in the invention, are shown below.

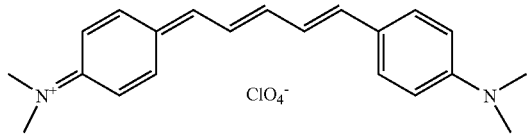

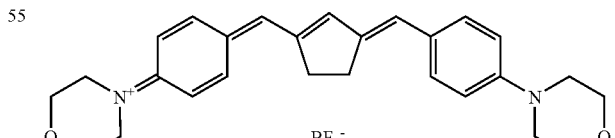

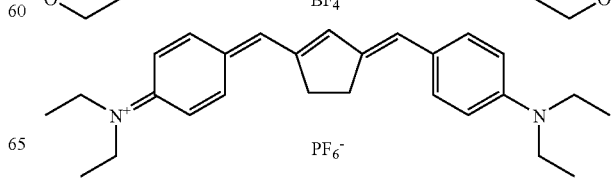

-continued

Formula (e)

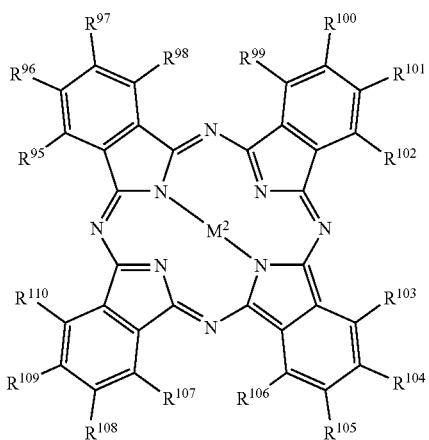

In the formula (e), $R^{95}$ to $R^{110}$ each independently represent a hydrogen or halogen atom, a cyano, alkyl, aryl, alkenyl, alkynyl, hydroxyl, carbonyl, thio, sulfonyl, sulfinyl, oxy or amino group, or an onium salt structure, which may have a substituent, and $M^2$ represents two hydrogen atoms, a metal atom, a halogenated metal group, or an oxy metal group. Examples of the metal atom include atoms in the group IA, the group IIA, the group IIIB, and the group IVB in the periodic table; transition metals in the first, second, third periods in the periodic table; and lanthanoid elements. In particular, preferable are copper, magnesium, iron, zinc, cobalt, aluminum, titanium, and vanadium.

Specific examples of the dye represented by the formula (e), which can be preferably used in the invention, are shown below.

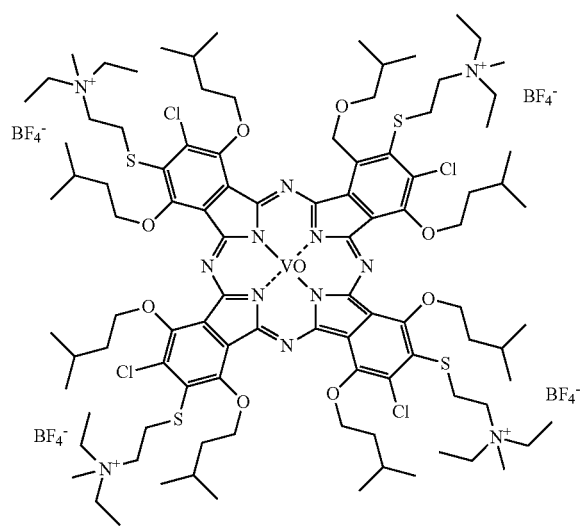

-continued

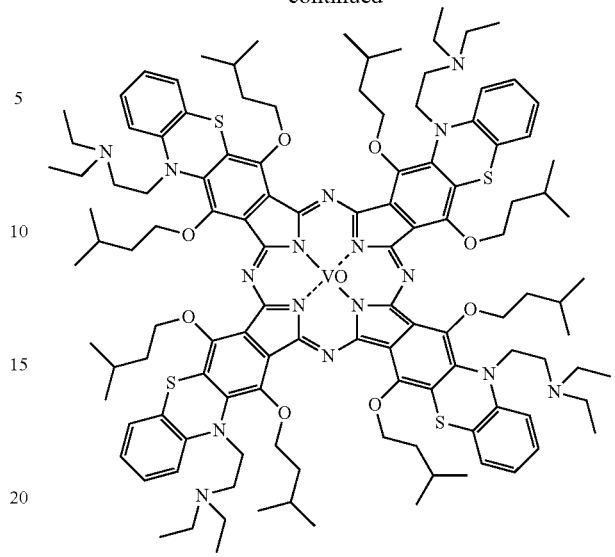

Examples of the pigment used in the invention include commercial pigments and those described in Color Index (C. I.) Handbook, "Saishin Ganryo Binran" (Newest Dye Handbook) (published in 1977 and compiled by Japanese Society of Pigment Technology), "Saishin Ganryo Oyo Gijyutsu" (Newest Pigment Applied Technology) (published in 1986 by CMC), and "Insatsu Inki Gijyutsu" (Printing Ink Technology) (published in 1984 by CMC).

As to the type of the pigment, examples of usable pigments include black pigments, yellow pigments, orange pigments, brown pigments, red pigments, violet pigments, blue pigments, green pigments, fluorescent pigments, metallic powder pigments, and other pigments such as polymer-binding colorants. Specific examples thereof include insoluble azo pigments, azo lake pigments, condensed azo pigments, chelate azo pigments, phthalocyanine pigments, anthraquinone pigments, perylene pigments, perinone pigments, thioindigo pigments, quinacridone pigments, dioxazine pigments, isoindolinone pigments, quinophthalone pigments, dyed lake pigments, azine pigments, nitroso pigments, nitro pigments, natural pigments, fluorescent pigments, inorganic pigments, and carbon black. A preferable pigment among those described above is carbon black.

Such pigments may be used with or without being subjected to surface treatment. Examples of the method of surface treatment include a method of coating the surface with a resin or a wax, a method of allowing a surfactant to adhere to the surface, and a method of bonding a reactive substance (e.g., a silane coupling agent, an epoxy compound, a polyisocyanate etc.) onto the surface of the pigment. These methods of surface treatment are described in "Kinzoku Sekken No Seishitsu To Oyo" (Properties and Application of Metallic Soap) (Sachi Shobo), "Insatsu Inki Gijyutsu" (Printing Ink Technology) (published in 1984 by CMC Shuppan) and "Saishin Ganryo Oyo Gijyutsu" (Newest Pigment Applied Technology) (published in 1986 by CMC Shuppan).

The particle diameter of the pigment is preferably in a range of from 0.01 to 10 μm, more preferably from 0.05 to 1 μm, and still more preferably from 0.1 to 1 μm. A pigment particle diameter of less than 0.01 μm is not preferable in respect of the stability of a pigment dispersion in the photosensitive layer coating liquid, whereas a particle diameter of more than 10 μm is not preferable in respect of the uniformity of the photosensitive layer.

As the method of dispersing the pigments, any known dispersion techniques used in production of inks or toners can be used. Examples of the dispersing machine include a supersonic dispersing device, a sand mill, an attritor, a pearl mill, a super mill, a ball mill, an impeller, a disperser, a KD mill, a colloid mill, a dynatron, a triple roll mill, and a press kneader. Details thereof are described in "Saishin Ganryo Oyo Gijyutsu" (Newest Pigment Applied Technology) (published in 1986 by CMC Shuppan).

In the invention, one of the sensitizing agents may be used, or a combination of two or more sensitizing agents may be used.

The sensitizing agent to be used in the invention is preferably a cyanine dye.

From the viewpoint of sensitivity, the sensitizing agent is more preferably a cyanine dye represented by the formula (a). Among dyes represented by the formula (a), cyanine dyes in which $X^{61}$ is a diarylamino group or $X^{62}$-$L^{61}$ are preferable, and those having a diaryl amino group are more preferable.

A cyanine dye having an electron-withdrawing group or a heavy atom-containing substituent at each of indolenine sites at both terminals is also preferable, and for example, a dye described in JP-A No. 2002-278057 is preferably used. A cyanine dye which has an electron-withdrawing group at each of indolenine sites at both terminals, and which has a diarylamino group as $X^{61}$ is most preferable.

The sensitizing dye such as the above-described infrared absorbing agent, which is added to promote curing of the polymerizable compositions, may be added to the photosensitive layer of the negative-working photosensitive material, or an independently provided other layer, for example, a topcoat layer or an undercoat layer of the negative-working photosensitive material. The sensitizing dye preferably has an optical density of from 0.1 to 3.0 in the photosensitive layer at the absorption maximum in a wavelength range of from 760 nm to 1200 nm from the viewpoint of sensitivity. The optical density is determined according to the addition amount of the infrared absorbing agent and the thickness of the photosensitive layer, hence the predetermined optical density is achieved by controlling these factors.

The optical density of the photosensitive layer can be measured by an ordinary method. Examples of the measurement method include a method of forming a photosensitive layer on a transparent or white support in an appropriately determined thickness such that the coating amount after drying is within the range necessary for a planographic printing plate precursor, and measuring the absorbance with a transmission optical densitometer, and a method of forming a recording layer on a reflective support such as an aluminum support, and measuring the reflection density.

The addition amount of the sensitizing dye to the photosensitive layer is preferably from 0.5 to 20% by mass with respect to the total solid content of the image recording layer. Within the range, property changes are highly sensitive to light exposure, thereby high sensitivity is achieved with no deleterious influences on the uniformity and strength of the film.

Other Components (e)

The composition that constitutes the photosensitive layer of the negative-working photosensitive material of the invention may include other components (additives) that are suitable for the usage, production process, or the like. Examples of the additives will be described hereinafter.

(e-1) Co-Sensitizer

When a specific additive or compound is used in the composition for forming the photosensitive layer, the sensitivity can be further improved. This compound will be referred to as a co-sensitizer hereinafter. The operation mechanism of the co-sensitizer is unclear, but is considered to be based, in many cases, on a chemical process as follows: the co-sensitizer reacts with various intermediate active species (such as radicals and cations) generated in the process of photoreaction initiated by a photopolymerization initiator and subsequent addition polymerization reaction, to generate new active radicals. Co-sensitizers can be roughly classified into (i) a compound which is reduced to generate an active radical, (ii) a compound which is oxidized to generate an active radical, and (iii) a compound which reacts with a radical having a low activity to convert it to a highly active radical, or which acts as a chain transfer agent. However, there are many cases in which a common view has not been formed as to class each compound belongs to.

Compound (I) which can be Reduced to Generate an Active Radical

Some examples of the compound (I) include compounds as described below.

Compounds having a carbon-halogen bond: an active radical is considered to be generated by the reductive cleavage of the carbon-halogen bond. Specific examples thereof include trihalomethyl-s-triazines and trihalomethyloxadiazoles.

Compounds having a nitrogen-nitrogen bond: an active radical is considered to be generated by the reductive cleavage of the nitrogen-nitrogen bond. Specific examples thereof include hexaarylbisimidazoles.

Compounds having an oxygen-oxygen bond: an active radical is considered to be generated by the reductive cleavage of the oxygen-oxygen bond. Specific examples thereof include organic peroxides.

Onium compounds: an active radical is considered to be generated by the reductive cleavage of a carbon-heteroatom bond or oxygen-nitrogen bond thereof. Specific examples thereof include diaryliodonium salts, triarylsulfonium salts, and N-alkoxypyridinium (azinium) salts.

Ferrocene, and iron arene complexes: an active radical can be generated by reduction.

Compound (II) which is Oxidized to Generate an Active Radical

Some examples of the compound (II) are compounds as described below.

Alkyl-ate complexes: an active radical is considered to be generated by oxidative cleavage of a carbon-heteroatom bond thereof. Specific preferable examples thereof include triarylalkylborates.

Alkylamine compounds: an active radical is considered to be generated by oxidative cleavage of a C—X bond on the carbon atom adjacent to a nitrogen atom, in which X is preferably, for example, a hydrogen atom, or a carboxyl, trimethylsilyl or benzyl group. Specific examples of the compound include ethanolamines, N-phenylglycines, N-phenyliminodiacetic acid mid derivatives thereof, and N-trimethylsilylmethylanilines.

Sulfur-containing compounds and tin-containing compounds: a compound in which the nitrogen atom of the above-mentioned amine compound is substituted with a sulfur or tin atom is considered to generate an active radical in a similar manner. Moreover, a compound having an S—S bond is also known to have a sensitization effect by the cleavage of the S—S bond.

α-substituted methylcarbonyl compounds: an active radical can be generated by the oxidative cleavage of α-carbon bond. Moreover, a compound in which the carbonyl is converted into an oxime ether also shows a similar function.

Specific examples thereof include 2-alkyl-1-[4-(alkylthio) phenyl]-2-morpholinopropan-1-one, and oxime ethers each obtained by a reaction of the 2-alkyl-1-[4-(alkylthio)phenyl]-2-morpholinopropan-1-one with a hydroxylamine and subsequent etherification of the N—OH.

Sulfinic acid salts: an active radical can be generated by reduction. Specific examples thereof include sodium arylsulfinate.

Compound (iii) which Reacts with a Radical Having Low Activity to Convert it to a Highly Active Radical, or Acts as a Chain Transfer Agent Some examples of the compound (iii) include a group of compounds having, in their molecule, SH, PH, SiH or GeH. The compound donates hydrogen to a low active radical species to generate a radical, or is oxidized and then subjected to de-protonation to generate a radical. Specific examples thereof include 2-mercaptobenzimidazoles.

In an exemplary embodiment, a polycarboxylic acid compound containing an aromatic ring or heterocyclic aromatic ring structure to which at least two carboxyl groups are bonded directly or via a divalent linking group is included for the purpose of improving sensitivity and/or developability. Specific examples of the polycarboxylic acid compound include (p-acetamidophenylimido) diacetic acid, 3-(bis(carboxymethyl)amino) benzoic acid, 4-(bis(carboxymethyl) amino) benzoic acid, 2-[(carboxymethyl)phenylamino] benzoic acid, 2-[(carboxymethyl)phenylamino]-5-methoxybenzoic acid, 3-[bis(carboxymethyl)amino]-2-naphthalene carboxylic acid, N-(4-aminophenyl)-N-(carboxymethyl)glycine, N,N'-1,3-phenylene-bis-glycine, N,N'-1,3-phenylenebis[N-(carboxymethyl)] glycine, N,N'-1,2-phenylenebis[N-(carboxymethyl)] glycine, N-(carboxymethyl)-N-(4-methoxyphenyl) glycine, N-(carboxymethyl)-N-(3-methoxyphenyl) glycine, N-(carboxymethyl)-N-(3-hydroxyphenyl) glycine, N-(carboxymethyl)-N-(3-chlorophenyl) glycine, N-(carboxymethyl)-N-(4-bromophenyl) glycine, N-(carboxymethyl)-N-(4-chlorophenyl) glycine, N-(carboxymethyl)-N-(2-chlorophenyl) glycine, N-(carboxymethyl)-N-(4-ethylphenyl) glycine, N-(carboxymethyl)-N-(2,3-dimethylphenyl) glycine, N-(carboxymethyl)-N-(3,4-dimethylphenyl) glycine, N-(carboxymethyl)-N-(3,5-dimethylphenyl) glycine, N-(carboxymethyl)-N-(2,4-dimethylphenyl) glycine, N-(carboxymethyl)-N-(2,6-dimethylphenyl) glycine, N-(carboxymethyl)-N-(4-formylphenyl) glycine, N-(carboxymethyl)-N-ethylanthranilic acid, N-(carboxymethyl)-N-propylanthranilic acid, 5-bromo-N-(carboxymethyl) anthranilic acid, N-(2-carboxyphenyl) glycine, o-dianisidine-N,N,N',N'-tetraacetic acid, N,N'-[1,2-ethanediylbis (oxy-2,1-phenylene)] bis[N-(carboxymethyl)glycine], 4-carboxyphenoxy acetic acid, catechol-O,O'-diacetic acid, 4-methylcatechol-O,O'-diacetic acid, resorcinol-O,O'-diacetic acid, hydroquinone-O,O'-diacetic acid, α-carboxy-o-anisic acid, 4,4'-isopropylidene diphenoxy acetic acid, 2,2'-(dibenzofuran-2,8-diyldioxy) diacetic acid, 2-(carboxymethylthio) benzoic acid, 5-amino-2-(carboxymethylthio) benzoic acid, and 3-[(carboxymethyl)thio]-2-naphthalene carboxylic acid.

In particular, N-arylpolycarboxylic acids represented by the following formula (V) or compounds represented by the following Formula (VI) are preferable.

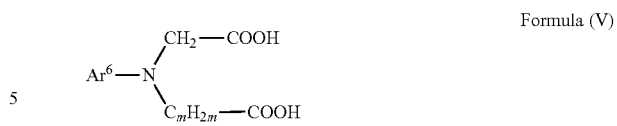

Formula (V)

In the formula (V), $Ar^6$ represents a mono-substituted aryl, poly-substituted aryl or unsubstituted aryl group, and m represents an integer of 1 to 5.

Examples of the substituent which may be introduced into the aryl group include alkyl groups having 1 to 3 carbon atoms, alkoxy groups having 1 to 3 carbon atoms, thioalkyl groups having 1 to 3 carbon atoms, and halogen atoms. The aryl group is preferably an aryl group having one substituent, or two or three substituents which may be the same as or different from each other. The symbol m is preferably 1, and $Ar^6$ is preferably a phenyl group.

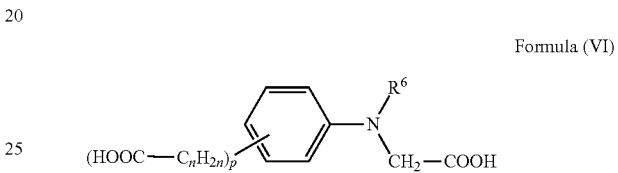

Formula (VI)

In the formula (VI), $R^6$ represents a hydrogen atom or an alkyl group having 1 to 6 carbon atoms, and n and p each represent an integer of 1 to 5.

The symbol n is preferably 1, and $R^6$ is preferably a hydrogen atom. The most preferable example of the polycarboxylic acid is anilinodiacetic acid.

In addition, examples of the compound which is preferably used to improve the sensitivity and/or the developability include compounds having two or more functional groups each of which is selected from a carboxylic acid group and a sulfonic acid group. Specific examples thereof include 5-aminoisophthalic acid, 5-nitroisophthalic acid, 4-methylphthalic acid, terephthalic acid, 2-bromoterephtalic acid, 2,3-naphthalenedicarboxylic acid, diphenic acid, 1,4,5,8-naphthalenetetracarboxylic acid, N-benzyliminodiacetic acid, N-(2-carboxyphenylglycine), N-phenyliminodiacetic acid, 1,3,5-benzenetricarboxylic acid, 1,2,4,5-benzenetetracarboxylic acid, 5-sulfosalicylic acid, 2-sulfobenzoic acid, 1,5-naphthalenedisulfonic acid, and 4-sulfophthalic acid. These compounds may each be substituted by a halogen atom, or an alkyl, alkenyl, alkynyl, cyano, hydroxyl, carboxyl, carbonyl, alkoxy, amino, amide, thiol, thioalkyl, thioalkoxy, or sulfonyl group.

Of these compounds, most preferable is the compound represented by the formula (V) or (VI).

The addition amount of such a poly(carboxylic acid/sulfonic acid) compound is preferably from 0.5 to 15% by mass, more preferably from 1 to 10% by mass, and even more preferably from 3 to 8% by mass, with respect to the total solid content of the polymerizable composition.

A large number of more specific examples of the co-sensitizer are described as additives that improves sensitivity in, for example, JP-A No. 9-236913, and these may be used in the invention.

One of the co-sensitizers may be used alone, or two or more of them may be used in combination. The use amount thereof is preferably from 0.05 to 100 parts by mass, more preferably from 1 to 80 parts by mass, and even more preferably from 3 to 50 parts by mass, with respect to 100 parts by mass of the polymerizable compound (c).

(e-2) Polymerization Inhibitor

In addition to the above-mentioned components, a small amount of a thermal polymerization inhibitor may be added to the composition that is used in the recording layer in order to inhibit undesired thermal polymerization of the polymerizable compound when the composition is produced or stored. Examples of the thermal polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and a cerium (III) salt of N-nitrosophenylhydroxyamine. The addition amount of the thermal polymerization inhibitor is preferably from about 0.01% to 5% by mass with respect to the total mass of the composition. When a higher aliphatic acid or a derivatives thereof, such as behenic acid or behenic amide, or the like is added to the composition to prevent polymerization-inhibition due to oxygen and then the composition is used to produce a planographic printing plate precursor, the higher aliphatic acid or the like may be optionally distributed unevenly on the surface of the recording layer in the step of applying a coating solution of the composition onto a support or the like, and then drying the solution. The addition amount of the higher aliphatic acid or the derivative thereof is preferably from about 0.5 to 10% by mass with respect to the entire composition.

(e-3) Colorant or the Like

Furthermore, in the negative-working photosensitive material of the invention, a dye or pigment may be added to a photosensitive layer to color the photosensitive layer. In this manner, the so-called plate-detectabilities of a printing plate made from the precursor, such as the visual of the plate and the suitability of the plate for an image-density-measuring device, can be improved. Many of dyes decrease the sensitivity of a photopolymerizable recording layer; thus, the colorant is preferably a pigment. Specific examples of the colorant include pigments such as phthalocyanine pigments, azo pigments, carbon black, and titanium oxide; and dyes such as ethyl violet, crystal violet, azo dyes, anthraquinone dyes, and cyanine dyes. The addition amount of the dye or the pigment is preferably from about 0.5 to 5% by mass with respect to the entire composition.

(e-4) Other Additives

Furthermore, the planographic printing plate precursor of the invention may include a known additive such as an inorganic filler that is used for improving physical properties of a cured film, a plasticizer, or a lipophylizing agent that can provide the surface of a recording layer with an improved affinity for ink.

Examples of the plasticizer include dioctyl phthalate, didodecyl phthalate, triethylene glycol dicaprylate, dimethyl glycol phthalate, tricresyl phosphate, dioctyl adipate, dibutyl cebacate, and triacetyl glycerin. When a binder is used, the plasticizer may be added in an amount of 10% or less by mass with respect to the total mass of the polymerizable compound, which has an ethylenically unsaturated bond, and the binder.

In addition, a UV initiator, a thermal crosslinking agent or the like may be added for enhancing the effect of post-development heating or light-exposure, in order to improve the film strength (printing durability) of the recording layer.

Besides, an additive may be additionally added to the recording layer or an intermediate layer may be provided, for improving the adhesiveness between the recording layer and the support or promoting the development-removability of the unexposed recording layer. For example, the adhesiveness is improved by the addition or undercoating of a compound exhibiting a relatively strong interaction with the support, such as a compound having a diazonium structure or a phosphonic compound, resulting in improvement of the printing durability. In the meantime, the developability of a non-image portion of the recording layer can be improved by the addition or undercoating of a hydrophilic polymer such as polyacrylic acid or polysulfonic acid, resulting in improvement of the stain resistance.

Preparation of Negative-Working Photosensitive Material

The negative-working photosensitive material of the invention has, on a support, at least the undercoat layer and photosensitive layer, which have been described above. The negative-working photosensitive material of the invention may further have a protective layer or the like as required. The negative-working photosensitive material may be produced by successively applying one or more coating solutions including the above-mentioned respective components onto the support.

When the undercoat layer is formed by coating, the components of the undercoat layer are dissolved in an organic solvent to prepare an undercoat layer coating solution, and then the solution is applied onto the support. When the photosensitive layer is formed by coating, the components for the photosensitive layer are dissolved in an organic solvent to prepare a photosensitive layer coating solution, and then the solution is applied onto the undercoat layer. The organic solvent may be selected from various organic solvents.

Examples of the organic solvents include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethylsulfoxide, γ-butyrolactone, methyl lactate, and ethyl lactate. One of the solvents may be used alone, or two or more thereof may be used in combination. The concentration of the solid content of the photosensitive layer coating solution is suitably from 2 to 50% by mass.

The coating amount of the photosensitive layer coating solution may affect mainly the sensitivity, the film strength and the developability of the photosensitive layer, and the printing durability of the printing plate to be obtained, and is desirably selected in accordance with the application of the photosensitive layer. When the negative-working photosensitive material of the invention is used for a negative-working planographic printing plate precursor, the coating amount of the photosensitive layer coating solution is preferably from about 0.1 to 10 g/m$^2$, and more preferably from 0.5 to 5 g/m$^2$, in terms of mass (per unit area) of the coating solution after the solution is dried.

Protective Layer

When the negative-working photosensitive material of the invention is a planographic printing plate precursor, a protective layer is preferably further formed on the photosensitive layer, from the viewpoints of further reducing the effect of oxygen and improving the scratch resistance.

The protective layer is desirably a layer that does not substantially inhibit light used for exposure from being transmitted through the layer, that has excellent adhesiveness with the recording layer, and that can easily be removed in a development process after the exposure process. Various disclosures of such a protective layer have been made. Detailed descriptions thereof are found, for example, in U.S. Pat. No. 3,458,311 and JP-A No. 55-49729. Such a protective layer may also be utilized in the planographic printing plate precursor of the invention.

Since a negative-working photosensitive material of the invention has a polymerizable image recording layer, it is desirable for the protective layer to be able to block, at the time of exposure to light, oxygen in the atmosphere, which inhibits polymerization. However, it is also desirable for the protective layer to have such a level of oxygen permeability as to prevent dark polymerization, from the viewpoint of storage stability and safelight suitability. Thus, the protective layer desirably has low oxygen permeability which achieves both of the functions.

Water-Soluble Polymer Compound

The material used as a main component in the protective layer is preferably a water-soluble polymer compound having a relatively high crystallinity. Examples thereof include polyvinyl alcohol, polyvinyl pyrrolidone, acidic celluloses, gelatin, arabic gum, and polyacrylic acid, which are well known water-soluble polymers in the technical field. Of those, the use of polyvinyl alcohol as the main component provides the best results in terms of oxygen blocking property, removability at development, and the like. The polyvinyl alcohol used for the protective layer may be partially substituted with ester, ether, or acetal as far as the polyvinyl alcohol has an unsubstituted vinyl alcohol unit that imparts required oxygen blocking property and water-solubility. A copolymer having the unit and another repeating unit may also be used.

Examples of the polyvinyl alcohol preferably used in an exemplary embodiment of the invention include those having a saponification degree of from 71 to 100%, and a molecular weight in a range of from 200 to 2400. It is more preferable to use a polyvinyl alcohol having a saponification degree of 91 mol % or more from the viewpoint of achieving favorable oxygen impermeability, excellent film forming property, and low adhesiveness of the surface.

Acid-modified polyvinyl alcohols may also be preferably used. Examples include a carboxy-modified polyvinyl alcohol modified with itaconic acid or maleic acid and a polyvinyl alcohol modified with sulfonic acid. Use of an acid-modified polyvinyl alcohol having a saponification degree of 91 mol % or higher is more preferable.

The water-soluble polymer compound is included in the protective layer preferably in an amount of 45 to 95% by mass, and more preferably in that of 50 to 90% by mass, with respect to the total solid content of the protective layer, from the viewpoints of the sensitivity of the negative-working photosensitive material to be obtained, adhesion between such planographic printing plate precursors when they are stacked, and the like.

At least one of the water-soluble polymer compounds may be used, and it is possible to use two or more of them. When plural water-soluble polymer compounds are used, it is preferable that the total amount of the compounds falls within the above-mentioned range.

The protective layer may include polyvinyl alcohol and polyvinyl pyrrolidone in combination from the viewpoints of the adhesive force to the photosensitive layer, the sensitivity and prevention of the generation of undesired fog. In this case, the addition amount ratio (ratio by mass) of polyvinyl alcohol having a saponification degree of 91% by mole to polyvinyl pyrrolidone (polyvinyl alcohol/polyvinyl pyrrolidone) is preferably 3/1 or less. Other than polyvinyl pyrrolidone, for example, the following compounds having relatively high crystallinity may be used together with polyvinyl alcohol: an acidic cellulose, gelatin, arabic gum, polyacrylic acid, or a copolymer thereof.

Filler

The protective layer in the invention preferably includes a filler in addition to the polymer compound, thereby improving the scratch resistance of the photosensitive layer surface and further providing the following advantage: in a case where the negative-working photosensitive material is used as a planographic printing plate precursor, adhesion between the planographic printing plate precursors when they are stacked without disposing an interleaving paper therebetween can be prevented; thus, the peelability of the precursors from each other is excellent, leading to improvement in handleability thereof. The filler may be any one of an organic filler, an inorganic filler, an inorganic-organic composite filler, and the like. Two or more of these fillers may be used in a mixture. It is preferable to use an inorganic filer and an organic filler in combination.

The shape of the filler may be appropriately selected in accordance with the purpose. Examples thereof include a fibrous shape, a needle shape, a plate shape, a spherical shape, a particulate shape (the term "particulate shape" as used herein refers to "amorphous particle"), a tetrapod shape and a balloon shape. Of these, the plate shape, spherical shape and particulate shape are preferable.

The organic filler may be synthetic resin particles or natural polymer particles. Examples of the organic filler include resin particles of acrylic resins, polyethylene, polypropylene, polyethylene oxide, polypropylene oxide, polyethyleneimine, polystyrene, polyurethane, polyurea, polyester, polyamide, polyimide, carboxymethylcellulose, gelatin, starch, chitin, chitosan or the like, and more preferably resin particles of acrylic resins, polyethylene, polypropylene, polystyrene or the like.

The particle size distribution may be a monodispersed or polydispersed distribution, and is preferably a monodispersed distribution. The filler has an average particle diameter of preferably from 1 to 20 μm, more preferably from 2 to 15 μm, and even more preferably from 3 to 10 μm. When the diameter is within the range, the advantageous effects of the invention are more effectively exerted.

The amount of the organic filler is preferably from 0.1 to 20% by mass, more preferably from 1 to 15% by mass, and even more preferably from 2 to 10% by mass, with respect to the total solid content of the protective layer.

Examples of the material for the inorganic filler include metals and metal compounds. Examples of the metal compounds include metal oxides, metal composite oxides, metal hydroxides, metal carbonates, metal sulfates, metal silicates, metal phosphates, metal nitrides, metal carbides and metal sulfides, and composite materials each made of two or more of these compounds. Specific examples of the inorganic filler include mica compounds, glass, zinc oxide, alumina, zirconium oxide, tin oxide, potassium titanate, strontium titanate, aluminum borate, magnesium oxide, magnesium borate, aluminum hydroxide, magnesium hydroxide, calcium hydroxide, titanium hydroxide, basic magnesium sulfate, calcium carbonate, magnesium carbonate, calcium sulfate, magnesium sulfate, calcium silicate, magnesium silicate, calcium phosphate, silicon nitride, titanium nitride, aluminum nitride, silicon carbide, titanium carbide and zinc sulfide; and composite compounds each made of two or more of these compounds.

Preferable are mica compounds, glass, alumina, potassium titanate, strontium titanate, aluminum borate, magnesium oxide, calcium carbonate, magnesium carbonate, calcium silicate, magnesium silicate, calcium phosphate, and calcium sulfate.

Of these materials, mica compounds are particularly preferable as the material for the inorganic filler used in the protective layer. In the following, an inorganic lamellar compound, a typical example of which is mica, is described in detail.

Inorganic Lamellar Compound

The protective layer in the invention preferably includes an inorganic lamellar compound, that is, a tabular inorganic compound. When the protective layer additionally includes the inorganic lamellar compound, the oxygen blocking property is increased and the film strength of the protective layer is increased to improve the scratch resistance. Additionally, a mat property can be imparted to the protective layer.

As a result, deterioration due to deformation or the like, and the generation of scratches in the protective layer can be suppressed as well as the layer can have an oxygen-blocking property as described above. Furthermore, since the mat property is imparted to the protective layer, adhesion between the protective layer surface of a planographic printing plate precursor and the back surface of the support of another planographic printing plate precursor adjacent thereto can be suppressed even when the planographic printing plate precursors are stacked.

Examples of the inorganic lamellar compound include mica compounds such as natural mica and synthetic mica represented by the following formula: $A(B, C)_2\text{-}5D_4O_{10}(OH, F, O)_2$ wherein A represents K, Na, or Ca; B and C each represent Fe(II), Fe(III), Mn, Al, Mg, or V; and D represents Si or Al.

Examples of the natural mica compounds include white mica, paragonite, bronze mica, black mica and flaky mica. Examples of the synthetic mica compounds include non-swellable mica such as fluorine bronze mica $KMg_3(AlSi_3O_{10})F_2$ and potassium tetrasilicate mica $KMg_{2.5}(Si_4O_{10})F_2$ and swellable mica such as Na tetrasilyric mica $NaMg_{2.5}(Si_4O_{10})F_2$, Na or Li teniolite (Na, Li) $Mg_2Li(Si_4O_{10})F_2$, montmorillonite type Na or Li hectorite (Na, Li)$_{1/8}Ng_{2/5}Li_{1/8}(Si_4O_{10})F_2$. Synthetic smectite is also useful.

Of the mica compounds, swellable mica including fluoride is particularly useful. This swellable synthetic mica has a laminate structure made of unit crystal lattice layers each having a thickness of about 10 to 15 Å, in which the degree of metal atom substitution is remarkably larger than that in other clay minerals. As a result, there is a shortage of positive charges in the lattice layers. Therefore, in order to compensate for the shortage, cations such as $Na^+$, $Ca^{2+}$ and $Mg^{2+}$ are adsorbed into the spaces between the layers. The cations interposed between the layers are called exchangeable cations, which are capable of being exchanged by various cations. When the cations between the layers are $Li^+$ or $Na^+$ ions, the bond between the lamellar crystal lattices is weak since the ion radii thereof are small, and the laminate structure is thus largely swelled by water. When shear is applied to the structure in this state, the structure is easily cleaved so as to produce a sol stable in water. The swellable synthetic mica has this tendency; thus, the mica is useful for the present embodiment. For this reason, the swellable synthetic mica is preferably used.

Regarding the shape of the inorganic lamellar compound which is typified by the mica compounds, the thickness of the compound is preferably smaller from the viewpoint of diffusion control, and the plane size thereof is preferably larger as long as it does not impair the smoothness of the coated surface and permeability of active lights. Accordingly, the aspect ratio of the inorganic lamellar compound is 20 or more, preferably 100 or more, and most preferably 200 or more. The aspect ratio is a ratio of the major axis length to the thickness of a particle (i.e. aspect ratio=major axis length/thickness), and is measured from, for example, a microphotographic projection view of the particle. The higher the aspect ratio, the higher effect is achieved.

The particle diameter of the mica compound may be from 0.3 to 20 μm, preferably from 0.5 to 10 μm, more preferably from 1 to 5 μm, in terms of the average length of the major axis. The average thickness of the particles may be 0.1 μm or less, preferably 0.05 μm or less, more preferably 0.01 μm or less. Specifically, the size of the swelling synthetic mica as a typical compound has a thickness of from 1 to 50 nm and a major axis length (plane size) of from about 1 to about 20 μm.

The amount of the inorganic lamellar compound included in the protective layer is preferably from 5 to 50% by mass, and more preferably from 10 to 40% by mass, with respect to the total solid content of the protective layer from the viewpoints of suppression of adhesion between stacked planographic printing plate precursors of the invention and suppression of scratches when the precursors are stacked, prevention of a decrease in the exposure sensitivity caused by blocking of a radiated laser, a low oxygen permeability, and the like. When plural inorganic lamellar compounds are used in combination, the total amount of these inorganic lamellar compounds preferably falls within the range.

Similarly, the amount of the inorganic filler other than the inorganic lamellar compound, which may be included in the protective layer, is preferably from 5 to 50% by mass, and more preferably from 10 to 40% by mass, with respect to the total solid content of the protective layer.

In the protective layer, an organic filler and an inorganic filler may be used in a mixture. The mixture ratio by weight of the organic filler to the inorganic filler (i.e. organic filler/inorganic filler) is preferably from 1/1 to 1/5. In this case, the total amount of the organic filler and the inorganic filler is preferably from 5 to 50% by mass, and more preferably from 10 to 40% by mass, with respect to the total solid content of the protective layer.

An inorganic-organic composite filler may also be used. The inorganic/organic composite filler is, for example, a composite compound made of an inorganic filler and at least one of the organic fillers. Examples of the inorganic filler used for the composite filler include metal powders; and particles of a metal compound (such as an oxide, nitride, sulfide, or carbide of a metal or a composite material thereof). Preferable are particles of a metal oxide or metal sulfide, and more preferable are particles of glass, $SiO_2$, ZnO, $Fe_2O_3$, $ZrO_2$, $SnO_2$, ZnS, CuS, or the like. The amount of the inorganic-organic composite filler in the protective layer is preferably from 5 to 50% by mass, and more preferably from 10 to 40% by mass, with respect to the total solid content of the protective layer.

Components of the protective layer (such as polyvinyl alcohol, an inorganic lamellar compound, and optional other additives) and the coating amount of the protective layer are selected, considering the oxygen-blocking property, development-removability, fog resistance, adhesiveness, scratch resistance and the like of the protective layer.

In the invention, the protective layer may have a mono-layered structure, or a multi-layered structure wherein plural protective sublayers having compositions different from each other are stacked. A preferable embodiment of the multi-layered protective layer is an embodiment wherein a protective sublayer including an inorganic lamellar compound is disposed as a lower protective sublayer near the recording layer, and further a protective sublayer including a filler is disposed as an upper protective sublayer on the surface of the lower protective sublayer.

The formation of the protective layer having such a multi-layered structure provides the topmost protective sublayer with sufficient scratch resistance and adhesion resistance resulting from the filler, and simultaneously provides the lower protective sublayer with an excellent oxygen blocking property. By the synergetic effect, it is possible to prevent effectively an image defect resulting from any one of the generation of a scratch and undesired oxygen permeation.

In the protective layer in the invention, the oxygen permeability at 15° C. and 1 atmosphere is preferably from 0.5 mL/m$^2$ day to 100 mL/m$^2$ day. It is preferable to adjust the coating amount of the protective layer so as to attain such an oxygen permeability.

The protective layer may also include a colorant (or water-soluble dye) which is excellent in the transmissibility of light used for exposure of the recording layer and can efficiently absorb light having wavelengths that are not used for exposure. The use of such as colorant in the protective layer may improve the safelight suitability without decreasing the sensitivity.

Formation of Protective Layer

The method of forming the protective layer is not particularly limited. The protective layer may be formed by a method of applying an aqueous protective layer coating solution including the above-described components onto the photosensitive layer. For example, a method described in U.S. Pat. No. 3,458,311 or JP-A No. 55-49729 may also be used.

Hereinafter, a method of forming the protective layer including an inorganic lamellar compound, such as a mica compound, and a water-soluble polymer compound, such as polyvinyl alcohol, will be described. A liquid dispersion in which the inorganic lamellar compound such as a mica compound is dispersed is prepared. The liquid dispersion is mixed with the water-soluble polymer compound, such as polyvinyl alcohol, (or with an aqueous solution in which the water-soluble polymer compound is dissolved) to obtain a coating solution for the protective layer (i.e. protective layer coating solution). This solution is applied onto the photosensitive layer, thereby forming a protective layer.

An example of the method of dispersing the inorganic lamellar compound (such as a mica compound) used in the protective layer is described herein. First, 5 to 10 parts by mass of the swellable mica compound, which has been described as an example of the mica compound, is added to 100 parts by mass of water, so that the mica compound sufficiently contacts with water and is swelled by the water. Thereafter, the mica compound is dispersed using a disperser. Examples of the disperser include various mills in which a material therein is directly dispersed by mechanical force of the mills, high-speed agitation dispersers having a large shear force, and dispersers utilizing an ultrasonic energy having a high intensity. Specific examples thereof include a ball mill, a sand grinder mill, a Visco Mill, a colloid mill, a homogenizer, a dissolver, a Polytron, a homomixer, a homoblender, a Kedy Mill, a jet agitator, a capillary tube type emulsifier, and emulsifiers having a liquid siren, an electric magneto-striction type ultrasonic generator, or a Paulman whistle. In general, a dispersion wherein the mica compound is dispersed by the method has a high viscosity or is in a gel form, and the storage stability thereof is extremely excellent. When this dispersion is used to prepare the protective layer coating solution, the solution may be prepared by diluting the dispersion with water, agitating the diluted dispersion sufficiently, and then incorporating thereinto a water-soluble polymer compound (or an aqueous solution wherein the water-soluble polymer compound is dissolved).

A known additive, such as a surfactant that improves the coating property or a water-soluble plasticizer that improves physical properties of the film to be obtained, may be added to the protective layer coating solution. Examples of the water-soluble plasticizer include propionamide, cyclohexanediol, glycerin, and sorbitol. A water-soluble (meth)acrylic polymer may be added thereto. Furthermore, a known additive may be added to the solution so as to improve the adhesiveness between the protective layer and the recording layer and the stability of the coating solution over time.

The coating amount of the protective layer coating solution is preferably from 0.1 to 4.0 g/m$^2$, and more preferably from 0.3 to 3.0 g/m$^2$ from the viewpoints of the film strength and the scratch resistance of the protective layer to be obtained, keeping the image quality, and ensuring an appropriate oxygen permeability for providing safelight suitability.

The method for forming a protective layer having a multi-layered structure by coating is not particularly limited, and may be a method of forming a multi-layered structure at once, or a method of successively forming sublayers of the multi-layered structure.

When the multi-layered structure is formed, the coating amount of a coating solution for a lower protective sublayer including an inorganic lamellar compound is preferably from 0.1 to 1.5 g/m$^2$, and more preferably from 0.2 to 1.0 g/m$^2$, and the coating amount of a coating solution for an upper protective sublayer including a filler is preferably from 0.1 to 4.0 g/m$^2$, and more preferably from 0.2 to 3.0 g/m$^2$. The ratio of the amount of the lower protective sublayer to that of the upper protective sublayer (lower protective sublayer/upper protective sublayer) is from 1/1 to 1/5.

In the negative-working photosensitive material of the invention, the back surface of the support is preferably modified to improve the scratch resistance. In the case of using, for example, an aluminum support, the method for modifying the support back surface is, for example, a method of forming an anodized layer uniformly on the entire back surface of the support in the same manner as the formation of an anodized layer on the recording layer side face of the support, or a method of forming a backcoat layer on the back surface. In the method of forming an anodized layer, the amount of the formed film is preferably 0.6 g/m$^2$ or more, and more preferably from 0.7 to 6 g/m$^2$. Of these methods, the method of forming a backcoat layer is more effective and preferable. The back surface treating method will be described hereinafter.

Method for Forming Backcoat Layer

The method for forming a backcoat layer on the back surface of an aluminum support is described herein. The backcoat layer in the invention may be a backcoat layer having any composition. Examples thereof include a backcoat layer including a colloidal silica sol and a metal oxide that is obtained by hydrolyzing and polycondensing an organometallic compound or inorganic metal compound, and a backcoat layer which is an organic resin coating film, each of which will be detailed below.

(1) Backcoat Layer Including Colloidal Silica Sol and Metal Oxide

A first preferable exemplary embodiment of the backcoat layer in the invention is a backcoat layer including a colloidal silica sol and a metal oxide.

More specifically, it is preferable to use a backcoat layer formed by hydrolyzing and polycondensing an organometallic metal compound or an inorganic metal compound in the presence of an acid or alkali catalyst in water and an organic solvent, that is, a backcoat layer formed from the so-called sol-gel reaction solution.

Examples of the organometallic metal compound or inorganic metal compound used to form the backcoat layer include metal alkoxides, metal acetylacetonates, metal acetates, metal oxalates, metal nitrates, metal sulfates, metal carbonates, metal oxychlorides, metal chlorides, and condensation products each obtained by hydrolyzing one or more of these compounds partially and forming an oligomer therefrom.

The metal alkoxides may each be represented by the following formula: M(OR)N wherein M represents a metal element, R represents an alkyl group, and n represents the oxidation number of the metal element. Specific examples thereof include $Si(OCH_3)_4$, $Si(OC_2H_5)_4$, $Si(OC_3H_7)_4$, $Si(OC_4H_9)_4$, $Al(OCH_3)_3$, $Al(OC_2H_5)_3$, $Al(OC_3H_7)_3$, $Al(OC_4H_9)_3$, $B(OCH_3)_3$, $B(OC_2H_5)_3$, $B(OC_3H_7)_3$, $B(OC_4H_9)_3$, $Ti(OCH_3)_4$, $Ti(OC_2H_5)_4$, $Ti(OC_3H_7)_4$, $Ti(OC_4H_9)_4$, $Zr(OCH_3)_4$, $Zr(OC_2H_5)_4$, $Zr(OC_3H_7)_4$, and $Zr(OC_4H_9)_4$. Other examples thereof include alkoxides each including Ge, Li, Na, Fe, Ga, Mg, P, Sb, Sn, Ta or V. Additional examples thereof include mono-substituted silicon alkoxides such as $CH_3Si(OCH_3)_3$, $C_2H_5Si(OCH_3)_3$, $CH_3Si(OC_2H_5)_3$, and $C_2H_5Si(OC_2H_5)_3$.

One of these organometallic compounds and inorganic metal compounds may be used alone, or two or more thereof may be used in combination. Of these organometallic compounds and inorganic metal compounds, metal alkoxides are preferable since the compounds have high reactivity and easily produce polymers having metal-oxygen bonds. Specifically, alkoxide compounds of silicon, such as $Si(OCH_3)_4$, $Si(OC_2H_5)_4$, $Si(OC_3H_7)_4$, and $Si(OC_4H_9)_4$ are preferable since they are inexpensive and easily available, and each of them provides an excellent coating layer of a metal oxide. Also, oligomers obtained by hydrolyzing these silicon alkoxides partially followed by condensation are preferably used. Examples thereof include ethyl silicate oligomers, which are pentamers on average, including 40% by mass of $SiO_2$.

It is also preferable to use, together with the metal alkoxides, a so-called silane coupling agent, in which one or two alkoxy groups of any one of the tetraalkoxy compounds of silicon are substituted with one or two alkyl groups or reactive groups. Examples of the silane coupling agent added to the backcoat layer in the invention include silane coupling agents each obtained by substituting one or two alkoxy groups of any one of the silicon tetraalkoxy compounds with one or two hydrophobic substituents such as long-chain alkyl groups having 4 to 20 carbon atoms, or fluorine-substituted alkyl groups. Particularly preferable are silane coupling agents having a fluorine-substituted alkyl group. Specific examples thereof include $CF_3CH_2CH_2Si(OCH_3)_3$, $CF_3CF_2CH_2CH_2Si(OCH_3)_3$, and $CF_3CH_2CH_2Si(OC_2H_5)_3$, and commercially available products such as LS-1090 (trade name, manufactured by Shin-Etsu Chemical Co., Ltd.). The amount of the silane coupling agent is preferably from 5 to 90% by mass, and more preferably from 10 to 80% by mass, with respect to the total solid content of the backcoat layer.

Examples of the catalyst that may be used for obtaining the sol-gel coating solution for the backcoat layer include organic and inorganic acids, and organic and inorganic alkalis. Specific examples thereof include: inorganic acids such as hydrochloric acid, sulfuric acid, sulfurous acid, nitric acid, nitrous acid, hydrofluoric acid, phosphoric acid, and phosphorous acid; organic acids such as formic acid, acetic acid, propionic acid, butyric acid, glycolic acid, chloroacetic acid, dichloroacetic acid, trichloroacetic acid, fluoroacetic acid, bromoacetic acid, methoxyacetic acid, oxalacetic acid, citric acid, oxalic acid, succinic acid, malic acid, tartaric acid, fumaric acid, maleic acid, malonic acid, ascorbic acid, benzoic acid, substituted benzoic acids such as 3,4-dimethoxybenzoic acid, phenoxyacetic acid, phthalic acid, picric acid, nicotinic acid, picolinic acid, pyrazine, pyrazole, dipicolinic acid, adipic acid, p-toluic acid, terephthalic acid, 1,4-cyclohexene-2,2-dicarboxylic acid, erucic acid, lauric acid, n-undecanoic acid, and ascorbic acid; and alkalis such as hydroxides of alkali metals and alkaline earth metals, ammonia, ethanolamine, diethanolamine, and triethanolamine.

Other examples of the catalyst include sulfonic acids, sulfinic acids, alkyl sulfates, phosphonic acids, phosphates, and organic acids. Specific examples thereof include p-toluenesulfonic acid, dodecylbenzenesulfonic acid, p-toluenesulfinic acid, ethylic acid, phenylphosphonic acid, phenyl phosphate, and diphenyl phosphate.

One of these catalysts may be used alone, or two or more thereof may be used in combination. The amount of the catalyst(s) is preferably from 0.001 to 10% by mass, and more preferably from 0.05 to 5% by mass, with respect to the metal compound as the starting material. When the amount of the catalyst is less than this range, the initiation of sol-gel reaction is delayed. When the amount is more than the range, the reaction advances rapidly and uneven sol-gel particles are generated, so that the obtained coating layer easily peels off.

An appropriate amount of water is required for initiating the sol-gel reaction. The addition amount of water is preferably from 0.05 to 50 times by mole, and more preferably from 0.5 to 30 times by mole the amount of water used to completely hydrolyze the metal compound as the starting material. When the amount of the water is smaller than this range, hydrolysis does not proceed readily. When the amount is larger than this range, the reaction also does not proceed readily, presumably because of the low concentration of the starting material in the mixture.

A solvent may be further added to the sol-gel reaction solution. The solvent may be any solvent as far as the solvent dissolves the metal compound as the starting material, and allows dissolution or dispersion of sol-gel particles generated by the reaction. Examples thereof include lower alcohols such as methanol, ethanol, propanol and butanol, and ketones such as acetone, methyl ethyl ketone, and diethyl ketone. To improve the surface quality of the backcoat layer, or the like, a mono- or di-alkyl ether of a glycol such as ethylene glycol, diethylene glycol, triethylene glycol, propylene glycol, or dipropylene glycol, or an acetic acid ester may be used. Of these solvents, the lower alcohols, which are miscible with water, are preferable. The concentration of the sol-gel reaction solution is adjusted, with the solvent, so as to be a suitable concentration for the application of the solution. However, when the entire amount of the solvent is added to the reaction solution at the start of the reaction, the hydrolysis does not advance easily; this may possibly be because of the dilution of starting material. Thus, it is preferred to add a portion of the solvent to the sol-gel reaction solution, and subsequently add the remainder thereto when the reaction advances to a certain extent.

The coating amount of the thus-prepared backcoat layer, which includes a metal oxide and a colloidal silica sol, is preferably from 0.01 to 3.0 $g/m^2$, and more preferably from 0.03 to 1.0 $g/m^2$.

(2) Backcoat Layer which is an Organic Resin Coating Film

Another example of the backcoat layer in the invention is a backcoat layer which is an organic resin coating film formed on the back surface of the support.

Examples of the resin which may form the backcoat layer in an exemplary embodiment of the invention include thermosetting resins such as urea resins, epoxy resins, phenol resins, melamine resins, or diallyl phthalate resins. Of the resins, phenol resins are preferred since the physical strength of a layer formed therefrom is high. Specific examples of the phenol resins include Novolak resins such as phenol formaldehyde resins, m-cresol formaldehyde resins, p-cresol formaldehyde resins, m-/p-cresol mixed formaldehyde resins, phenol/cresol mixed formaldehyde resins (in which cresol may be m- or p-cresol, or a m-/p-cresol mixture), and pyrogallol acetone resin.

Other examples of the phenol resins include t-butylphenol formaldehyde resins as described in U.S. Pat. No. 4,123,279, and condensed polymer made from phenol having a substituent having 3 to 8 carbon atoms and formaldehyde, such as octylphenol formaldehyde resins.

The weight-average molecular weight of the phenol resin is preferably 500 or more from the viewpoint of image forming performance, and is more preferably from 1,000 to 700,000. The number-average molecular weight thereof is preferably 500 or more, and more preferably from 750 to 650,000. The dispersivity (i.e. weight-average molecular weight/number-average molecular weight) of phenol resin is preferably from 1.1 to 10.

One of the phenol resins may be used alone, or two or more thereof may be used in combination. When two or more thereof is used in combination, it may be possible to additionally use at least one of the following: a condensed polymer made from phenol having an alkyl group having 3 to 8 carbon atoms as a substituent and formaldehyde, such as a condensed polymer made from t-butylphenol and formaldehyde or a condensed polymer made from octylphenol and formaldehyde, as described in U.S. Pat. No. 4,123,279; or an organic resin having a phenolic structure having an electron withdrawing group on an aromatic ring, which is described in JP-A No. 2000-241972.

A surfactant may additionally be added to the backcoat layer in the invention to improve the surface quality or control the surface physical property. Examples of the surfactant include anionic surfactants having any one of carboxylic acid, sulfonic acid, sulfate, and phosphate; cationic surfactants such as aliphatic amines and quaternary ammonium salts; betaine amphoteric surfactants; nonionic surfactants such as aliphatic esters of a polyoxy compound, polyalkyleneoxide condensed surfactants, and polyethyleneimide condensed surfactants; and fluorine-containing surfactants. Of those, fluorine-containing surfactants are particularly preferable.

The addition amount of the surfactant may be appropriately selected in accordance with the purpose. In general, the amount thereof may be from 0.1 to 10.0% by mass of the backcoat layer.

Particularly preferable examples of the fluorine-containing surfactants include fluorine-containing surfactants each having, in the molecule thereof, a perfluoroalkyl group. The fluorine-containing surfactants will be described in detail hereinafter Examples of the fluorine-containing surfactants, which are preferably used for the backcoat layer, include anionic surfactants such as perfluoroalkylcarboxylates, perfluoroalkylsulfonates, and perfluoroalkylphosphates; amphoteric surfactants such as perfluoroalkylbetaine; cationic surfactants such as perfluoroalkyltrimethylammonium salts; and nonionic surfactants such as perfluoroalkylamineoxide, perfluoroalkylethyleneoxide adducts, oligomers each including a perfluoroalkyl group and a hydrophilic group, oligomers each including a perfluoroalkyl group and a lipophilic group, oligomers each including a perfluoroalkyl group, a hydrophilic group and a lipophilic group, and urethanes each including a perfluoroalkyl group and a lipophilic group. Of these surfactants, the fluoroaliphatic group is preferably a group represented by the following formula (VII).

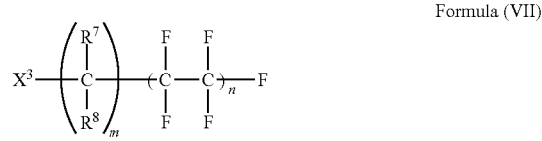

Formula (VII)

In the formula (VII), $R^7$ and $R^8$ each independently represent a hydrogen atom or an alkyl group having 1 to 4 carbon atoms; $X^3$ represents a single bond or a bivalent linking group, which may be selected from an alkylene group, an arylene group, and the like; m represents an integer of 0 or more; and n represents an integer of 1 or more.

When $X^3$ represents a bivalent linking group, the linking group, such as an alkylene or arylene group, may have a substituent. The linking group may further have, in the structure thereof, a linking group selected from ether, ester, amide groups and the like. Examples of the substituent that may be introduced into the alkylene or arylene group include: halogen atoms; and hydroxyl, mercapto, carboxyl, epoxy, alkyl and aryl groups. These substituents may further have a substituent. $X^3$ preferably represents an alkylene group, an arylene group, or an alkylene group having a linking group selected from ether, ester and amide groups, and the like, more preferably an unsubstituted alkylene group, an unsubstituted arylene group, or an alkylene group having therein an ether or ester group, and most preferably an unsubstituted alkylene group or an alkylene group having therein an ether or ester group.

The amount of such a fluorine-containing surfactant in the backcoat layer is preferably from about 0.5 to about 10% by mass.

When the backcoat layer is an organic resin coating film, it may be provided on the back surface of an aluminum support by various methods. Examples thereof include: a method in which fine particles made of silica gel or the like is optionally added to the components of the backcoat layer (specifically, respective starting materials, the main component of which is an organic resin), and a coating solution is prepared, for example, by dissolving the resultant into an appropriate solvent or preparing an emulsion dispersion of the resultant, and this coating solution is applied onto the back surface of the support, and then dried; a method of adhering an organic resin layer which has been formed into a film onto the aluminum support via an adhesive or by heating; and a method of forming a melted coating film with a melt extruder, and then adhering the film onto the support. The method of applying and drying the solution is the most preferable method from the viewpoint of easiness of the control of the coating amount. The solvent used in this method may be one of the organic solvents as described in JP-A No. 62-251739, or a mixture of the solvents.

Examples of a device for applying the backcoat layer coating solution onto the support surface include a bar coater, a roll coater, a gravure coater, a curtain coater, an extruder, a slide hopper, and other known metering coaters. Of those, noncontact metering coaters such as a curtain coater, an extruder, and a slide hopper are preferable since the back surface of the aluminum support is not scratched or injured.

Regarding each of the backcoat layer including a metal oxide and a colloidal silica sol and the backcoat layer which is an organic resin layer, the thickness of the backcoat layer formed in the invention is preferably from 0.1 to 8 μm. When the thickness is in this range, the surface sliding property of the aluminum support back surface is improved, and further a fluctuation in the thickness resulting from dissolution or swelling of the backcoat layer caused by a chemical agent used in the printing and before and after the printing, and a deterioration in print quality due to changes in printing pressure, resulting from the fluctuation, can be suppressed.

Of the backcoat layers, the backcoat layer which is an organic resin coating film is more preferable.

The negative-working photosensitive material of the invention is preferably used for a negative-working planographic printing plate precursor (hereinafter, in some cases, referred to as "planographic printing plate precursor of the invention").

Method of Making Plate

Hereinafter, the method of making a plate from the planographic printing plate precursor according to the invention will be described.

In an exemplary embodiment of the method of making a plate from the planographic printing plate precursor of the invention, a plurality of the planographic printing plate precursors described above are stacked such that the protective layer directly contacts with the back surface of the support; the stack of the planographic printing plate precursors is then set in a plate setter and the planographic printing plate precursors are automatically conveyed one by one; each precursor is imagewise exposed to light having a wavelengths of 750 to 1400 nm; and then the precursor is developed to remove the non-image portion so that the plate-making process is completed. Even when the planographic printing plate precursors according to the invention are stacked without inserting interleaving paper between the precursors, the adhesion between the planographic printing plate precursors and flaws on the protective layer can be suppressed, and therefore, the planographic printing plate precursor can be applied to the plate-making method described above. According to this plate-making method, since the stack of the planographic printing plate precursors in which the precursors are stacked without using interleaving paper between the precursors is used, the process of removing the interleaving paper is unnecessary, and thus the productivity in the plate-making process is improved.

As a matter of course, plate-making can be conducted using a stack in which the planographic printing plate precursors according to the invention and sheets of interleaving paper are stacked alternately.

Light Exposure

The method for light-exposing the planographic printing plate precursor of the invention may be freely selected from known methods.

The light source for light-exposing the photosensitive layer of the invention may be freely selected from known ones. Light sources having a wavelength of from 300 nm to 1200 nm may be used. Specifically various lasers may be used as the light source, and in particular a semiconductor laser emitting infrared rays having a wavelength of from 760 nm to 1200 nm is useful.

The light source is preferably a laser, and examples of available laser beam sources having a wavelength of from 350 nm to 450 nm include the followings:

gas lasers such as an Ar ion laser (364 mm, 351 nm, 10 mW to 1 W), a Kr ion laser (356 nm, 351 nm, 10 mW to 1 W), a He—Cd laser (441 nm, 325 nm, 1 mW to 100 mW); solid lasers such as a combination of Nd:YAG (YVO$_4$) and THG crystal×2 (355 nm, 5 mW to 1 W), and a combination of Cr:LiSAF and SHG crystal (430 nm, 10 mW); semiconductor lasers such as a KnbO3 ring resonator (430 nm, 30 mW), a combination of a waveguide type wavelength converting element and AlGaAs and InGaAs semiconductors (380 nm to 450 mm, 5 mW to 100 mW), a combination of a waveguide type wavelength converting element and AlGaInP and AlGaAs semiconductors (300 nm to 350 nm, 5 mW to 100 mW) and AlGaInN (350 nm to 450 nm, 5 mW to 30 mW); and pulse lasers such as a N$_2$ laser (337 nm, pulse 0.1 to 10 mJ), and a XeF laser (351 nm, pulse 10 to 250 mJ).

Among them, particularly an AlGaInN semiconductor laser (commercially available InGaN semiconductor laser from 400 to 410 nm, 5 to 30 mW) is preferable from the viewpoints of wavelength property and cost.

Other examples of available light sources having a wavelength of 450 nm to 700 nm include an Ar$^+$ laser (488 nm), YAG-SHG laser (532 nm), a He—Ne laser (633 nm), a He—Cd laser, a red semiconductor laser (650 to 690 nm), and preferable examples of available light sources having a wavelength of 700 nm to 1200 nm include a semiconductor laser (800 to 850 nm), and a Nd—YAG laser (1064 mm).

Other examples of useful light sources include mercury lamps of ultrahigh pressure, high pressure, middle pressure, or low pressure, chemical lamps, carbon arc lamp, xenon lamps, metal halide lamps, ultraviolet laser lamps (e.g. an ArF excimer laser, a KrF excimer laser), various visible laser lamps, fluorescent lamps, tungsten lamps, solar light, and radiations such as electron beams, X rays, ion beams, and far infrared rays.

Among them, the light source of the rays used for the imagewise exposure of the photosensitive layer according to the invention is preferably a light source having a luminescence wavelength in the near-infrared region to infrared region, and is particularly preferably a solid laser or a semiconductor laser.

The light exposure device may be any of internal drum system, external drum system, and flatbed system.

In particular, in the case where a light source having a wavelength of from 750 nm to 1400 nm is used for light exposure, the light source may be freely selected from those emitting rays having the wavelength. However, the imagewise exposure is preferably conducted by a solid laser or a semiconductor laser emitting infrared rays having a wavelength of from 750 nm to 1400 nm.

The laser preferably has an output of 100 mW or more, and preferably includes a multi-beam laser device for reducing the light exposure time. The light exposure time for one pixel is preferably 20μ seconds or shorter. The amount of radiation energy radiated per unit area of the planographic printing plate precursor is preferably from 10 to 300 mJ/cm$^2$.

The light exposure can be carried out by overlapping beams from a light source. The term "overlapping" means that exposure is conducted under such a condition that the sub-scanning pitch is smaller than the beam diameter. For example, when the beam diameter is expressed in terms of full-width at half-maximum (FWHM) of the beam intensity, overlapping can be quantitatively expressed in FWHM/sub-scanning pitch (overlapping coefficient). In the invention, the overlapping coefficient is preferably 0.1 or more.

The scanning system for a light source in the light exposure device is not particularly limited, and a drum outer surface scanning method, a drum inner surface scanning method, a flatbed scanning method, or the like can be used. The channel of the light source may be a single channel or a multi-channel, but in the case of the drum outer surface scanning method, a multi-channel is preferably used.

In plate-making, the planographic printing plate precursor according to the invention can be subjected to development treatment without carrying out special thermal treatment and/or water washing treatment usually conducted after exposure treatment. Because the thermal treatment is not carried out, image unevenness attributable to the thermal treatment can be prevented. Because the thermal treatment and/or water washing treatment are/is not carried out, stable high-speed treatment is possible in development treatment.

Development

The developer used for the development treatment conducted after the light exposure treatment is further described below.

Developer

The developer used in the invention is not particularly limited, and is usually an aqueous alkali solution containing an alkaline chemical and having a pH of 14 or lower, preferably a pH from 9.0 to 13.0.

Alkali Agent

Examples of the alkali agent used in the developer include inorganic alkali agents such as tertiary sodium phosphate, tertiary potassium phosphate, tertiary ammonium phosphate, sodium borate, potassium borate, ammonium borate, sodium hydroxide, potassium hydroxide, ammonium hydroxide and lithium hydroxide, and organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethylene imine, ethylene diamine, pyridine and tetramethyl ammonium hydroxide. One of the alkali agents may be used, or a combination of two or more of the alkali agents may be used.

Another example of the alkali agent is an alkali silicate. The alkali silicate may be used in combination with a base. The alkali silicate to be used may be a salt which exhibits alkalinity when dissolved in water. Examples thereof include sodium silicate, potassium silicate, lithium silicate, and ammonium silicate. One of these alkali silicates may be used alone, or two or more thereof may be used in combination.

When the alkali silicate is used, the developer properties can easily be adjusted into optimal ranges by adjusting the concentration of the silicate, and the blend ratio between silicon oxide $SiO_2$, which is a silicate component, and an alkali oxide $M_2O$, which is an alkali component, wherein M represents an alkali metal or an ammonium group. The blend ratio of silicon oxide $SiO_2$ to the alkali oxide $M_2O$ (the ratio by mole of $SiO_2/M_2O$) is preferably from 0.75 to 4.0, and more preferably from 0.75 to 3.5 from the viewpoints of suppressing stains generated by excessive dissolution (etching) of the anodized layer on the support, or suppressing the generation of insoluble gas generated from the formation of a complex from dissolved aluminum and the silicate, or the like.

Regarding the concentration of the alkali silicate in the developer, the amount of $SiO_2$ is preferably from 0.01 to 1 mol/L, more preferably from 0.05 to 0.8 mol/L, with respect to the mass of the developer from the viewpoints of: the developability; effects of suppressing the dissolution (etching) of the anodized layer on the support, suppressing the generation of precipitations or crystals, and preventing gelatinization of the developer in neutralization at the time of waste solution disposal; and the like.

Aromatic Anionic Surfactant

The developer preferably includes an aromatic anionic surfactant from the viewpoints of the development accelerating effect, stabilization of a dispersion of the negative-working polymerizable recording layer components and protective layer components in the developer, and stabilization of development treatment.

The aromatic anionic surfactant is not particularly limited, but is preferably a compound represented by the following Formula (VIII) or (IX).

Formula (VIII)

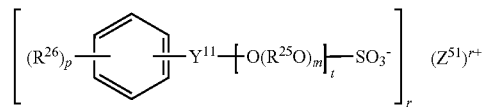

Formula (IX)

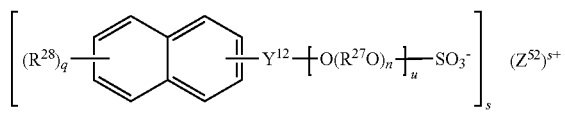

In the Formula (VIII) or (IX), $R^{25}$ and $R^{27}$ each independently represent a linear or branched alkylene group having 1 to 5 carbon atoms, and specific examples include an ethylene group, a propylene group, a butylene group and a pentylene group, among which an ethylene group and a propylene group are particularly preferable.

m and d each independently represent an integer from 1 to 100, and is preferably from 1 to 30, more preferably from 2 to 20. When m is 2 or greater, there are plural $R^{25}$s which may be the same as or different from each other. When n is 2 or greater, there are plural $R^{27}$s which may be the same as or different from each other.

t and u each independently represent 0 or 1.

$R^{26}$ and $R^{28}$ each independently represent a linear or branched alkyl group having 1 to 20 carbon atoms, and specific examples include a methyl group, an ethyl group, a propyl group, a butyl group, a hexyl group and a dodecyl group, among which a methyl group, an ethyl group, an iso-propyl group, an n-propyl group, an n-butyl group, an iso-butyl group and a tert-butyl group are particularly preferable.

Each of p and q represents an integer from 0 to 2. Each of $Y^{11}$ and $Y^{12}$ represents a single bond or an alkylene group having 1 to 10 carbon atoms and is preferably a single bond, a methylene group or an ethylene group, particularly preferably a single bond.

$(Z^{51})^{r+}$ and $(Z^{52})^{s+}$ each independently represent an alkali metal ion, an alkaline earth metal ion, unsubstituted ammonium ion or an ammonium ion substituted by an alkyl group. Specific examples include a lithium ion, a sodium ion, a potassium ion, a magnesium ion, a calcium ion, an ammonium ion, a secondary to quaternary ammonium ion substituted by an alkyl, aryl or aralkyl group having 20 or less carbon atoms. $(Z^{51})^{r+}$ and $(Z^{52})^{s+}$ each is particularly preferably a sodium ion. r and s each independently represent 1 or 2.

Specific examples of the aromatic anionic surfactant are shown below. However, the examples should not be construed as limiting the invention.

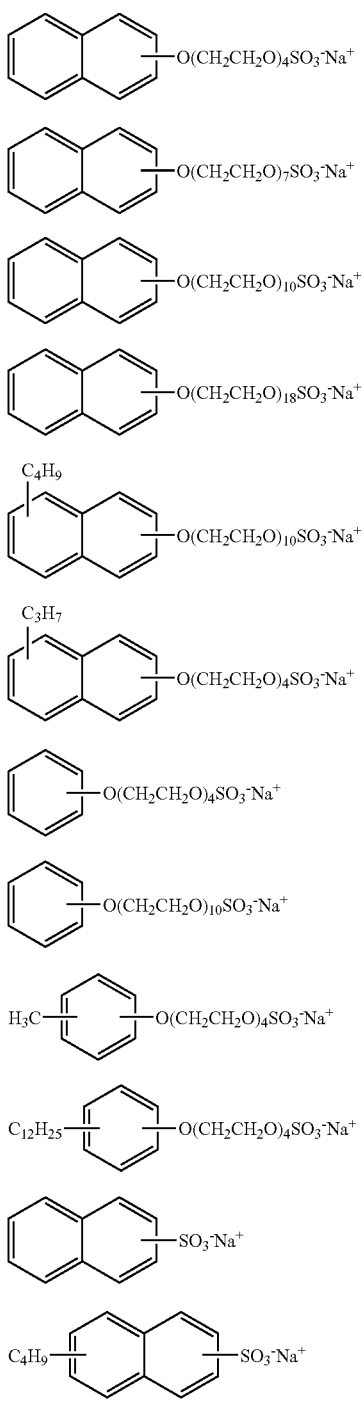

In an exemplary embodiment, only one aromatic anionic surfactant is used. In another exemplary embodiment, an arbitrary combination of two or more aromatic anionic surfactants is used. The amount of aromatic anionic surfactant to be added is not particularly limited. From the viewpoints of developability, the solubility of the photosensitive layer components and the specified protective layer components, and the printing durability of the resultant printing plate, the concentration of the aromatic anionic surfactant in the developer is preferably in a range of from 1.0 to 10 mass %, and more preferably in a range of from 2 to 10 mass %.

In the developer, the aromatic anionic surfactant may be used in combination with one or more other surfactants. Such other surfactants may be nonionic surfactants, and examples thereof include polyoxyethylene alkyl ethers such as polyoxyethylene naphthyl ether, polyoxyethylene alkyl phenyl ether, polyoxyethylene lauryl ether, polyoxyethylene cetyl ether, and polyoxyethylene stearyl ether, polyoxyethylene alkyl esters such as polyoxyethylene stearate, sorbitan alkyl esters such as sorbitan monolaurate, sorbitan monostearate, sorbitan distearate, sorbitan monooleate, sorbitan sesquioleate and sorbitan trioleate, and monoglyceride alkyl esters such as glycerol monostearate and glycerol monooleate.

The amount of such additional surfactant in the developer is preferably from 0.1 to 10 mass %.

Chelate Agent

For the purpose of preventing the influence from calcium ions etc. contained in hard water, for example, a chelate agent for divalent metals is preferably contained in the developer. Examples of the chelate agent for divalent metals include polyphosphates such as $Na_2P_2O_7$, $NasP_3O_3$, $Na_3P_3O_9$, $Na_2O_4P(NaO_3P)PO_3Na_2$, and Calgon (sodium polymetaphosphate), aminopolycarboxylic acids (for example, ethylenediaminetetraacetic acid, potassium salts thereof, and sodium salts thereof, amine salt thereof; diethylenetriaminepentaacetic acid, potassium salt thereof, sodium salt thereof; triethylenetetraminehexaacetic acid, potassium salt thereof, sodium salt thereof; hydroxyethylenediaminetriacetic acid, potassium salt thereof, sodium salt thereof; nitrilotriacetic acid, potassium salt thereof, sodium salt thereof; 1,2-diaminocyclohexanetetraacetic acid, potassium salt thereof, sodium salt thereof; 1,3-diamino-2-propanol tetraacetic acid, potassium salt thereof, sodium salt thereof); other polycarboxylic acids (for example, 2-phosphonobutane-1,2,4-tricarboxylic acid, potassium salt thereof, sodium salt thereof; 2-phosphonobutanone-2,3,4-tricarboxylic acid, potassium salt thereof, sodium salt thereof), organic phosphonic acids (for example, 1-phosphonoethane-1,2,2-tricarboxylic acid, potassium salt thereof, sodium salt thereof; 1-hydroxyethane-1,1-diphosphonic acid, potassium salt thereof, sodium salt thereof; and aminotri(methylene phosphonic acid), potassium salt thereof, and sodium salt thereof, among which ethylenediaminetetraacetic acid, potassium salt thereof, sodium salt thereof, amine salt thereof; ethylenediaminetetra (methylenephosphonic acid), ammonium salt thereof, potassium salt thereof; hexamethylenediaminetetra(methylenephosphonic acid), ammonium salt thereof, and potassium salt thereof are particularly preferable.

The optimum amount of the chelate agent varies depending on the hardness and amount of hard water used. In general, the chelate agent is included in an amount of 0.01 to 5 mass %, and more preferably from 0.01 to 0.5 mass %, in the developer at use.

In addition, an alkali metal salt of an organic acid and/or an alkali metal salt of an inorganic acid may be added as the development regulating agent to the developer. For example, sodium carbonate, potassium carbonate, ammonium carbonate, sodium citrate, potassium citrate or ammonium citrate, or a combination of two or more of such salts may be used.

In addition to the components described above, components such as the following can be simultaneously used if necessary in the developer: organic carboxylic acids such as benzoic acid, phthalic acid, p-ethylbenzoic acid, p-n-propylbenzoic acid, p-isopropylbenzoic acid, p-n-butylbenzoic acid, p-t-butylbenzoic acid, p-t-butylbenzoic acid, p-2-hydroxyethylbenzoic acid, decanoic acid, salicylic acid and 3-hydroxy-2-naphthoic acid, organic solvents such as propylene glycol, and other components such as a reducing agent, a dye, a pigment and a preservative.

From the viewpoints of developability of the non-image portion during development, reduction of damage to the image portion, and handling property of the developer, the pH of the developer at 25° C. is preferably in a range of pH 10 to 12.5, and more preferably in a range of pH 11 to 12.5.

The conductivity x of the developer is preferably more than 2 mS/cm but less than 30 mS/cm (i.e. x satisfies the inequality "2 mS/cm<x<30 mS/cm"), and more preferably from 5 mS/cm to 25 mS/cm. The conductivity may be adjusted by adding a conductivity adjustor such as an alkali metal salt of an organic acid, or an alkali metal salt of an inorganic acid.

The developer can be used as a developer and a replenisher for the light-exposed planographic printing plate precursor, and is preferably applied to an automatic developing machine. When the planographic printing plate precursor is developed with an automatic developing machine, the developer is exhausted depending on throughput. Therefore, processing power may be recovered by using a replenisher or a fresh developer. This replenishing system can be preferably used also in the plate-making method in the invention.

To restore the processing power of the developer in an automatic developing machine, replenishing can be conducted by a method described in U.S. Pat. No. 4,882,246. Developers described in JP-A No. 50-26601, JP-A No. 58-54341, JP-B No. 56-39464, JP-B No. 56-42860 and JP-B No. 57-7427 are also preferable.

The planographic printing plate precursor which was subjected to development treatment in this manner is post-treated with washing water, a surfactant-containing rinse, or a desensitizing gum solution including gum arabic or a starch derivative, as described in JP-A No. 54-8002, JP-A No. 55-115045 and JP-A No. 59-58431. Various combinations of these treatments may be used.

For the purpose of improving strength of image portion and printing durability, the entire surface of the image after development may be heated or exposed to light. Extremely severe conditions can be utilized for the heating after development, and the heating temperature is usually in a range of 200 to 500° C.

The planographic printing plate obtained by these treatments is loaded onto an offset printing machine, and used for printing on a large number of sheets.

At the time of printing, a plate cleaner used for removing dirt from the plate may be a PS plate cleaner conventionally known in the art, such as Multi-cleaners CL-1, CL-2, CP, CN-4, CN, CG-1, PC-1, SR and IC (trade names, all manufactured by Fuji Film Corporation).

In this way, by using a planographic printing plate obtained from the planographic printing plate precursor of the invention, a number of printed products can be obtained.

Hereinafter, exemplary embodiments of the present invention are described.

(1) A negative-working photosensitive material, comprising:

a support;

an undercoat layer; and a photosensitive layer including a polymerization initiator, a polymerizable compound, and a binder polymer, wherein:

the support, the undercoat layer, and the photosensitive layer are sequentially layered;

the undercoat layer includes a polymer including a structural unit (a) including at least one of a carboxylic acid or a carboxylic acid salt and a structural unit (b) including at least one carboxylic acid ester; and the content of the structural unit (a) in the polymer is from 30% to 90% by mole.

(2) The negative-working photosensitive material of item (1), wherein the polymer including the structural unit (a) and the structural unit (b) is substantially free from acid other than carboxylic acid.

(3) The negative-working photosensitive material of item (1), wherein the structural unit (a) is represented by the following formula (a):

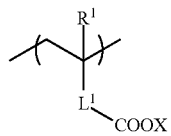

Formula (a)

wherein, in formula (a), $R^1$ represents a hydrogen atom, a substituent having 1 to 30 carbon atoms, or a halogen atom; X represents a hydrogen atom or a counter cation necessary to neutralize a charge; and $L^1$ represents a single bond or a divalent linking group.

(4) The negative-working photosensitive material of item (3), wherein the substituent which is represented by $R^1$ and has 1 to 30 carbon atoms is selected from the group consisting of a methyl group, an ethyl group, a propyl group, a butyl group, a pentyl group, a hexyl group, a cyclohexyl group, a methoxy group, an ethoxy group, a butoxy group, an acetoxy group, a propionyloxy group, a methoxycarbonyl group, an ethoxycarbonyl group, and a cyano group; and the halogen atom represented by $R^1$ is selected from the group consisting of a fluorine atom, a chlorine atom, a bromine atom, and an iodine atom.

(5) The negative-working photosensitive material of item (3), wherein the divalent linking group represented by $L^1$ is selected from the group consisting of an arylene group, a carbonyl group, $-CR_2-$, $-O-$, $-C=O-$, $-S-$, $-S=O-$, $-S(=O)_2-$, $-NR-$, a vinylene group, a phenylene group, a cycloalkylene group, a naphthylene group, a biphenylene group, and a combination of these structural units, wherein R represents a hydrogen atom or a substituent.

(6) The negative-working photosensitive material of item (3), wherein the counter cation which is represented by X and is necessary to neutralize a charge is an alkali metal ion, a group-II metal ion, a metal ion of metals other than the group-II metal, an ammonium ion, or an organic ammonium ion.

(7) The negative-working photosensitive material of item (1), wherein the structural unit (b) including at least one carboxylic acid ester is represented by the following formula (b):

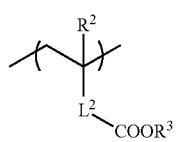

Formula (b)

wherein, in formula (b), $R^2$ represents a hydrogen atom, a substituent having 1 to 30 carbon atoms, or a halogen atom;

$R^3$ represents a substituent having 1 to 30 carbon atoms; and $L^2$ represents a single bond or a divalent linking group.

(8) The negative-working photosensitive material of item (7), wherein the substituent which is represented by $R^2$ and has 1 to 30 carbon atoms is selected from the group consisting of a methyl group, an ethyl group, a propyl group, a butyl group, a pentyl group, a hexyl group, a cyclohexyl group, a methoxy group, an ethoxy group, a butoxy group, an acetoxy group, a propionyloxy group, a methoxycarbonyl group, an ethoxycarbonyl group, and a cyano group; and the halogen atom represented by $R^2$ is selected from a fluorine atom, a chlorine atom, a bromine atom, and an iodine atom.

(9) The negative-working photosensitive material of item (7), wherein the substituent which is represented by $R^3$ and has 1 to 30 carbon atoms is an alkyl group or an aryl group.

(10) The negative-working photosensitive material of item (7), wherein the divalent linking group represented by $L^2$ is selected from the group consisting of an arylene group, a carbonyl group, —$CR_2$—, —O—, —C=O—, —S—, —S=O—, —S(=O)$_2$—, —NR—, a vinylene group, a phenylene group, a cycloalkylene group, a naphthylene group, a biphenylene group, and a combination of these structural units, wherein R represents a hydrogen atom or a substituent.

(11) The negative-working photosensitive material of item (1), wherein the photosensitive layer further includes an infrared absorbing agent.

(12) The negative-working photosensitive material of item (1), wherein the photosensitive layer further includes a sensitizing dye having an absorption peak in a wavelength range of from 300 nm to 850 nm.

(13) The negative-working photosensitive material of item (1), wherein the content of the structural unit (b) in the polymer is from 1% to 70% by mole.

(14) A negative-working planographic printing plate precursor, comprising a negative-working photosensitive material, the material including:

a support;

an undercoat layer; and a photosensitive layer including a polymerization initiator, a polymerizable compound, and a binder polymer, wherein:

the support, the undercoat layer, and the photosensitive layer are sequentially layered;

the undercoat layer includes a polymer including a structural unit (a) including at least one of a carboxylic acid or a carboxylic acid salt and a structural unit (b) including at least one carboxylic acid ester; and the content of the structural unit (a) in the polymer is from 30% to 90% by mole.

(15) The negative-working planographic printing plate precursor of item (14), further comprising a photosensitive layer, wherein:

a coating amount of the photosensitive layer is from about 0.1 g/m$^2$ to about 10 g/m$^2$ in terms of dry mass.

All publications, patent applications, and technical standards mentioned in this specification are herein incorporated by reference to the same extent as if each individual publication, patent application, or technical standard was specifically and individually indicated to be incorporated by reference.

EXAMPLES

Hereinafter, the invention will be described with reference to Examples. However, the invention is not restricted thereto. In Examples, unless otherwise stated, the term "%" means "% by mass".

Measurement of Average Molecular Weight by Gel Permeation Chromatography (GPC)

The weight-average molecular weight of a polymer was measured by the following method, with PEG (manufactured by Tosoh Corporation) as a reference sample.
Column: Shodex Ohpak SB-806M HQ 8×300 mm
  Shodex Ohpak SB-806M HQ 8×300 mm
  Shodex Ohpak SB-802.5 HQ 8×300 mm
Mobile phase: Solution of 50 mM disodium hydrogen phosphate (acetonitrile/water=1/9)
Flow rate: 0.8 ml/min
Detector: RI
Charge amount: 100 μl
Sample concentration: 0.1% by mass
(Shodex: registered trade mark, manufactured by Showa Denko K. K.)

Synthesis Example 1

Synthesis of Specified Polymer (Exemplified Compound: (a-1))

To a 200-ml three-necked flask, 11.01 g of MFG (=propylene glycol monomethyl ether) was added, followed by heating and agitating at 80° C. for 30 minutes under nitrogen ($N_2$) flow (80 ml/min). With the nitrogen flow rate and the temperature were maintained, a solution obtained by dissolving 3.87 g of methacrylic acid, 10.51 g of methyl methacrylate, and 0.76 g of dimethyl 2,2'-azobis(isobutyrate) in 44.04 g of MFG was added by dropping into the 200-ml three-necked flask over 2 hours, followed by heating and agitating for 4.5 hours. Furthermore, 0.38 g of dimethyl 2,2'-azobis(isobutyrate) was added thereto, followed by heating to 90° C. and agitating for 2 hours, whereby 70.8 g of a target polymer (Exemplified Compound: (a-1)) was obtained (solid content: 21.94%).

Synthesis Example 2

Synthesis of Specified Polymer (Exemplified Compound: (a-2))

To a 200-ml three-necked flask, 10.86 g of MFG was added, followed by heating and agitating at 80° C. for 30 minutes under nitrogen flow (80 ml/min). While the nitrogen flow rate and the temperature were maintained, a solution obtained by dissolving 5.17 g of methacrylic acid, 9.01 g of methyl methacrylate, and 0.76 g of dimethyl 2,2'-azobis (isobutyrate) in 43.44 g of MFG was added by dropping into the 200-ml three-necked flask over 2 hours, followed by heating and agitating for 4.5 hours. Furthermore, 0.38 g of dimethyl 2,2'-azobis(isobutyrate) was added thereto, followed by heating to 90° C. and by agitating for 2 hours, whereby 67.1 g of a target polymer (Exemplified Compound: (a-2)) was obtained (solid content: 22.82%).

Synthesis Example 3

Synthesis of Specified Polymer (Exemplified Compound: (a-3))

To a 200-ml three-necked flask, 10.71 g of MFG was added, followed by heating and agitating at 80° C. for 30 minutes under nitrogen flow (80 ml/min). While the nitrogen flow rate and the temperature were maintained, a solution obtained by dissolving 6.46 g of methacrylic acid, 7.51 g of methyl methacrylate, and 0.76 g of dimethyl 2,2'-azobis (isobutyrate) in 42.84 g of MFG was added by dropping into the 200-ml three-necked flask over 2 hours, followed by heating and agitating for 4.5 hours. Furthermore, 0.38 g of dimethyl 2,2'-azobis(isobutyrate) was added thereto, followed by heating to 90° C. and by agitating for 2 hours, whereby 65.8 g of a target polymer (Exemplified Compound: (a-3)) was obtained (solid content: 22.98%).

Synthesis Example 4

Synthesis of Specified Polymer (Exemplified Compound: (a-4))

To a 200-ml three-necked flask, 10.56 g of MFG was added, followed by heating and agitating at 80° C. for 30 minutes under nitrogen flow (80 ml/min). While the nitrogen flow rate and the temperature were maintained, a solution obtained by dissolving 7.75 g of methacrylic acid, 6.01 g of methyl methacrylate, and 0.76 g of dimethyl 2,2'-azobis (isobutyrate) in 42.25 g of MFG was added by dropping into the 200-ml three-necked flask over 2 hours, followed by heating and agitating for 4.5 hours. Furthermore, 0.38 g of dimethyl 2,2'-azobis(isobutyrate) was added thereto, followed by heating to 90° C. and by agitating for 2 hours, whereby 62.4 g of a target polymer (Exemplified Compound: (a-4)) was obtained (solid content: 24.19%).

Synthesis Example 5

Synthesis of Specified Polymer (Exemplified Compound: (a-5))

To a 200-ml three-necked flask, 10.41 g of MFG was added, followed by heating and agitating at 80° C. for 30 minutes under nitrogen flow (80 ml/min). While the nitrogen flow rate and the temperature were maintained, a solution obtained by dissolving 9.04 g of methacrylic acid, 4.51 g of methyl methacrylate, and 0.76 g of dimethyl 2,2'-azobis (isobutyrate) in 41.65 g of MFG was added by dropping into the 200-ml three-necked flask over 2 hours, followed by heating and agitating for 4.5 hours. Furthermore, 0.38 g of dimethyl 2,2'-azobis(isobutyrate) was added thereto, followed by heating to 90° C. and by agitating for 2 hours, whereby 62.4 g of a target polymer (Exemplified Compound: (a-5)) was obtained (solid content: 23.52%).

Synthesis Example 6

Synthesis of Specified Polymer (Exemplified Compound: (a-6))

To a 200-ml three-necked flask, 10.26 g of MFG was added, followed by heating and agitating at 80° C. for 30 minutes under nitrogen flow (80 ml/min). While the nitrogen flow rate and the temperature were maintained, a solution obtained by dissolving 10.33 g of methacrylic acid, 3.00 g of methyl methacrylate, and 0.76 g of dimethyl 2,2'-azobis (isobutyrate) in 41.05 g of MFG was added by dropping into the 200-ml three-necked flask over 2 hours, followed by heating and agitating for 4.5 hours. Furthermore, 0.38 g of dimethyl 2,2'-azobis(isobutyrate) was added thereto, followed by heating to 90° C. and by agitating for 2 hours, whereby 62.2 g of a target polymer (Exemplified Compound: (a-6)) was obtained (solid content: 23.25%).

Synthesis Example 7

Synthesis of Specified Polymer (Exemplified Compound: (a-7))

To a 200-ml three-necked flask, 10.11 g of MFG was added, followed by heating and agitating at 80° C. for 30 minutes under nitrogen flow (80 ml/min). While the nitrogen flow rate and the temperature were maintained, a solution obtained by dissolving 11.62 g of methacrylic acid, 1.50 g of methyl methacrylate, and 0.76 g of dimethyl 2,2'-azobis (isobutyrate) in 40.46 g of MFG was added by dropping into the 200-ml three-necked flask over 2 hours, followed by heating and agitating for 4.5 hours. Furthermore, 0.38 g of dimethyl 2,2'-azobis(isobutyrate) was added thereto, followed by heating to 90° C. and by agitating for 2 hours, whereby 59.7 g of a target polymer (Exemplified Compound: (a-7)) was obtained (solid content: 23.87%).

Synthesis Example 8

Synthesis of Specified Polymer (Exemplified Compound (a-8))

To a 200-ml three-necked flask, 14.01 g of MFG was added, followed by heating and agitating at 80° C. for 30 minutes under nitrogen flow (80 ml/min). While the nitrogen flow rate and the temperature were maintained, a solution obtained by dissolving 11.11 g of vinyl benzoate, 7.51 g of methyl methacrylate, and 0.76 g of dimethyl 2,2'-azobis (isobutyrate) in 56.05 g of MFG was added by dropping into the 200-ml three-necked flask over 2 hours, followed by heating and agitating for 4.5 hours. Furthermore, 0.38 g of dimethyl 2,2'-azobis(isobutyrate) was added thereto, followed by heating to 90° C. and by agitating for 2 hours, whereby 89.8 g of a target polymer (Exemplified Compound: (a-8)) was obtained (solid content: 22.06%).

Synthesis Example 9

Synthesis of Specified Polymer (Exemplified Compound: (a-9))

To a 200-ml three-necked flask, 10.71 g of MFG was added, followed by heating and agitating at 80° C. for 30 minutes under nitrogen flow (80 ml/min). While the nitrogen flow rate and the temperature were maintained, a solution obtained by dissolving 6.46 g of methacrylic acid, 7.51 g of methyl methacrylate, and 0.76 g of dimethyl 2,2'-azobis (isobutyrate) in 42.84 g of MFG was added by dropping into the 200-ml three-necked flask over 2 hours, followed by heating and agitating for 4.5 hours. Furthermore, 0.38 g of dimethyl 2,2'-azobis(isobutyrate) was added thereto, followed by heating to 90° C. and by agitating for 2 hours. Thereafter, the resultant solution was cooled in an ice bath, and 15 ml of an aqueous solution of NaOH (2N) was added by dropping thereto while the temperature of the mixture was controlled so as not to exceed 10° C. Then, the mixture was agitated so as to be homogeneous, and after that, the mixture was allowed to be room temperature, whereby 78.0 g of a target polymer (Exemplified Compound: (a-9)) was obtained (solid content: 19.38%).

Synthesis Example 10

Synthesis of Specified Polymer (Exemplified Compound: (a-10))

To a 200-ml three-necked flask, 10.71 g of MFG was added, followed by heating and agitating at 80° C. for 30 minutes under nitrogen flow (80 ml/min). While the nitrogen flow rate and the temperature were maintained, a solution obtained by dissolving 6.46 g of methacrylic acid, 7.51 g of methyl methacrylate, and 0.76 g of dimethyl 2,2'-azobis(isobutyrate) in 42.84 g of MFG was added by dropping into the 200-ml three-necked flask over 2 hours, followed by heating and agitating for 4.5 hours. Furthermore, 0.38 g of dimethyl 2,2'-azobis(isobutyrate) was added thereto, followed by heating to 90° C. and by agitating for 2 hours. Thereafter, the resultant solution was cooled in an ice bath, and 37.5 ml of an aqueous solution of NaOH (2N) was added by dropping thereto while the temperature of the mixture was controlled so as not to exceed 10° C. Then, the mixture was agitated so as to be homogeneous, and after that, the mixture was allowed to be room temperature, whereby 106.3 g of a target polymer (Exemplified Compound: (a-10)) was obtained (solid content: 15.80%).

Synthesis Example 11

Synthesis of Comparative Polymer (c-1)

To a 200-ml three-necked flask, 6.00 g of MFG and 4.00 g of MeOH were added, followed by heating and agitating at 80° C. for 30 minutes under nitrogen flow (80 ml/min). While the nitrogen flow rate and the temperature were maintained, a solution obtained by dissolving 12.91 g of methacrylic acid and 0.76 g of dimethyl 2,2'-azobis(isobutyrate) in a mixture of 23.92 g of MFG and 15.94 g of MeOH was added by dropping into the 200-ml three-necked flask over 2 hours, followed by heating and agitating for 4.5 hours. Furthermore, 0.38 g of dimethyl 2,2'-azobis(isobutyrate) was added thereto, followed by heating to 85° C. and by agitating for 6 hours, whereby 57.2 g of a polymer (c-1) having the following structure was obtained (solid content: 24.57%). The polymer had a weight-average molecular weight determined by the GPC method of 29,000.

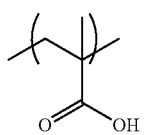

(c-1)

Synthesis Example 12

Synthesis of Comparative Polymer (c-2)

To a 200-ml three-necked flask, 11.31 g of MFG was added, followed by heating and agitating at 80° C. for 30 minutes under nitrogen flow (80 ml/min). While the nitrogen flow rate and the temperature were maintained, a solution obtained by dissolving 1.29 g of methacrylic acid, 13.52 g of methyl methacrylate, and 0.76 g of dimethyl 2,2'-azobis(isobutyrate) in 45.23 g of MFG was added by dropping into the 200-ml three-necked flask over 2 hours, followed by agitating for 4.5 hours. Furthermore, 0.38 g of dimethyl 2,2'-azobis(isobutyrate) was added thereto, followed by heating to 90° C. and agitating for 2 hours, whereby 71.3 g of a polymer (c-2) having the following structure was obtained (solid content: 22.37%). The polymer had a weight-average molecular weight determined by the GPC method of 30,000.

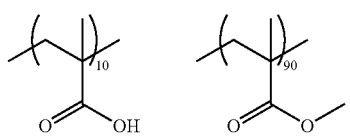

(c-2)

Synthesis Example 13

Synthesis of Comparative Polymer (c-3)

To a 200-ml three-necked flask, 11.16 g of MFG was added, followed by heating and agitating at 80° C. for 30 minutes under nitrogen flow (80 ml/min). While the nitrogen flow rate and the temperature were maintained, a solution obtained by dissolving 2.58 g of methacrylic acid, 12.01 g of methyl methacrylate, and 0.76 g of dimethyl 2,2'-azobis(isobutyrate) in 44.64 g of MFG was added by dropping into the 200-ml three-necked flask over 2 hours, followed by agitating for 4.5 hours. Furthermore, 0.38 g of dimethyl 2,2'-azobis(isobutyrate) was added thereto, followed by heating to 90° C. and agitating for 2 hours, whereby 69.8 g of a polymer (c-3) having the structure was obtained (solid content: 22.56%). The polymer had a weight-average molecular weight determined by the GPC method of 31,000.

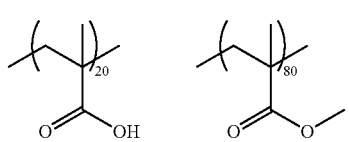

(c-3)

Synthesis Example 14

Synthesis of Comparative Polymer (c-4)

To a 200-ml three-necked flask, 11.46 g of MFG was added, followed by heating and agitating at 80° C. for 30 minutes under nitrogen flow (80 ml/min). While the nitrogen flow rate and the temperature were maintained, a solution obtained by dissolving 15.02 g of methacrylic acid and 0.76 g of dimethyl 2,2'-azobis(isobutyrate) in 45.83 g of MFG was added by dropping into the 200-ml three-necked flask over 2 hours, followed by agitating for 4.5 hours. Furthermore, 0.38 g of dimethyl 2,2'-azobis(isobutyrate) was added thereto, followed by heating to 90° C. and agitating for 2 hours, whereby 73.2 g of a polymer (c-4) having the following structure was obtained (solid content: 22.08%). The polymer had a weight-average molecular weight determined by the GPC method of 35,000.

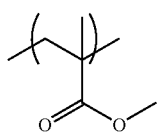

(c-4)

Synthesis Example 15

Synthesis of Comparative Polymer (c-5)

To a 200-ml three-necked flask, 11.87 g of MFG was added, followed by heating and agitating at 80° C. for 30 minutes under nitrogen flow (80 ml/min). While the nitrogen flow rate and the temperature were maintained, a solution obtained by dissolving 1.29 g of methacrylic acid, 5.17 g of methacrylic acid, 6.01 g of methyl methacrylate, 0.76 g of dimethyl 2,2'-azobis(isobutyrate), and an aqueous solution obtained by dissolving 3.11 g of 2-acrylamido-2-methylpropane sulfonic acid in 10 g of water, in 37.42 g of MFG was added by dropping into the 200-ml three-necked flask over 2 hours, followed by agitating for 4.5 hours. Furthermore, 0.38 g of dimethyl 2,2'-azobis(isobutyrate) was added thereto, followed by heating to 90° C. and agitating for 2 hours, whereby 75.2 g of a polymer (c-5) having the following structure was obtained (solid content: 22.22%). The polymer had a weight-average molecular weight determined by the GPC method of 38,000.

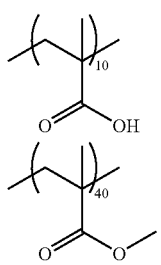

(c-5)

Synthesis Example 16

Synthesis of Comparative Polymer (c-6)

To a 200-ml three-necked flask, 13.29 g of MFG was added, followed by heating and agitating at 80° C. for 30 minutes under nitrogen flow (80 ml/min). While the nitrogen flow rate and the temperature were maintained, a solution obtained by dissolving 1.29 g of methacrylic acid, 5.01 g of methacrylic acid, 0.76 g of dimethyl 2,2'-azobis(isobutyrate), and an aqueous solution obtained by dissolving 12.44 g of 2-acrylamido-2-methylpropane sulfonic acid in 10 g of water in 43.15 g of MFG was added by dropping into the 200-ml three-necked flask over 2 hours, followed by heating and agitating for 4.5 hours. Furthermore, 0.38 g of dimethyl 2,2'-azobis(isobutyrate) was added thereto, followed by heating to 90° C. and agitating for 2 hours, whereby 85.16 g of a polymer (c-6) having the following structure was obtained (solid content: 22.02%). The polymer had a weight-average molecular weight determined by the GPC method of 40,000.

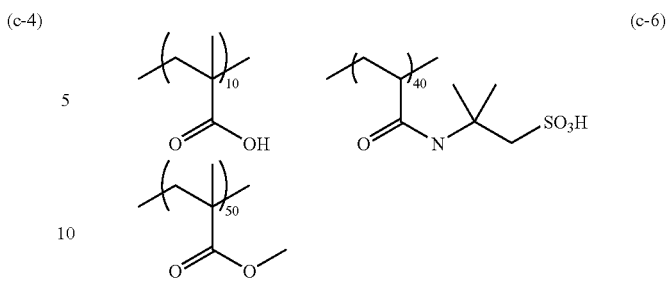

(c-6)

Examples 1 to 10 and Comparative Examples 1 to 6

Preparation of Support

An aluminum plate (JIS A 1050) having a thickness of 0.30 mm and a width of 1,030 mm was subjected to surface treatment as described below.

Surface Treatment

Surface treatment was carried out by performing the following treatments (a) to (f) successively. After the treatments and water washing, nip rollers were used to remove liquids.

(a) An aluminum plate was etched with an etching solution (concentration of sodium hydroxide: 26% by mass; concentration of aluminum ions: 6.5% by mass) at 70° C., dissolving the aluminum plate by 5 g/m². Thereafter, the plate was washed with water.

(b) The plate was subjected to a desmutting treatment with a 1% by mass aqueous solution of nitric acid (including 0.5% by mass of aluminum ions) at 30° C. by use of a spray, followed by washing with water.

(c) An alternating voltage having a frequency of 60 Hz was used to subject the plate continuously to electrochemical surface-roughening treatment. The electrolyte used during this treatment was a 1% by mass aqueous solution of nitric acid (including 0.5% by mass of aluminum ions and 0.007% by mass of ammonium ions), the temperature of which was 30° C. A time TP until the current value reaches a peak from zero was 2 msec, the duty ratio was 1/1, the alternating voltage was in a trapezoidal form, and a carbon electrode was used as a counter electrode in the electrochemical surface-roughening treatment. Ferrite was used as an auxiliary anode. The current density was 25 A/dm² at a peak. The total electricity quantity when the aluminum plate serves as the anode was 250 C/cm². Five percent of the current from the power source was branched to the auxiliary anode. Thereafter, the plate was washed with water.

(d) A solution including 26% by mass of sodium hydroxide and 6.5% by mass of aluminum ions and having a temperature of 35° C. was sprayed onto the aluminum plate to conduct etching treatment to dissolve the aluminum plate by 0.2 g/m², thereby removing smut components consisting mainly of aluminum hydroxide which had been generated when the alternating voltage was used to conduct the electrochemical surface-roughening, and dissolving edge regions of generated pits to make the edge regions smooth. Thereafter, the plate was washed with water.

(e) The plate was subjected to desmutting treatment with a 25% by mass aqueous solution of sulfuric acid (including 0.5% by mass of aluminum ions) at 60° C. by use of a spray. Thereafter, the plate was washed with a water spray.

(f) The plate was subjected to an anodizing treatment for 50 seconds using sulfuric acid (including 0.5% by mass of aluminum ions) at a concentration of 170 g/L, at temperature of 33° C. and a current density of 5 A/dm². Thereafter, the plate was washed with water. At this time, the weight of the anodized layer was 2.7 g/m².

The surface roughness Ra of the thus-obtained aluminum support was 0.27 μm (measurement apparatus: SURFCOM (trade name) manufactured by Tokyo Seimitsu Co., Ltd.; probe tip diameter: 2 μm).

Undercoat Layer

Undercoat layer coating solutions having the compositions described below were prepared by using the specified polymers or comparative polymers shown in Table 1. Each of the resultant undercoat layer coating solutions was applied onto the surface-treated aluminum support by means of a wire bar, followed by drying at 90° C. for 30 minutes. The amount of the coating solution applied onto the support was 8 mg/m².

| Undercoat Layer Coating Solution | |
|---|---|
| Specified polymer or Comparative Polymer (shown in Table 1) | 0.04 g |
| Methanol | 27 g |
| Ion exchange water | 3 g |

Photosensitive Layer

A photosensitive layer coating solution described below was prepared and then applied, by means of a wire bar, onto the aluminum support on which the undercoat layer had been formed. The resultant was dried with a hot-wind dryer at 115° C. for 34 seconds. The coating amount after the drying was from 1.4 to 2.0 g/m².

| Photosensitive Layer Coating Solution | |
|---|---|
| Infrared absorbing agent (IR-1) | 0.074 g |
| Polymerization initiator (P-1) | 0.300 g |
| Co-sensitizer (AM-1) | 0.161 g |
| Polymerizable compound (trade name: A-BPE-4, manufactured by Shinnakamura Kagaku) | 1.00 g |
| Binder polymer (BT-1; Mw = 80,000) | 1.00 g |
| Colorant (CL-1) | 0.04 g |
| Fluorine-containing surfactant (trade name: MEGAFAC F-780-F, manufactured by Dainippon Ink & Chemicals, Inc., a 30% by mass solution in methyl isobutyl ketone (MIBK)) | 0.016 g |
| Methyl ethyl ketone | 10.4 g |
| Methanol | 5.16 g |
| 1-methoxy-2-propanol | 10.4 g |

Structures of the polymerization initiator (P-1), infrared absorbing agent (IR-1), additive (AM-1), binder polymer (BT-1), and colorant (CL-1) are shown below.

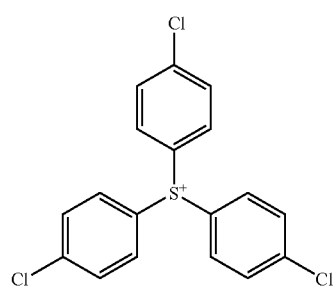
(P-1)

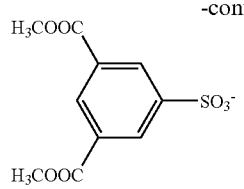
(IR-1)

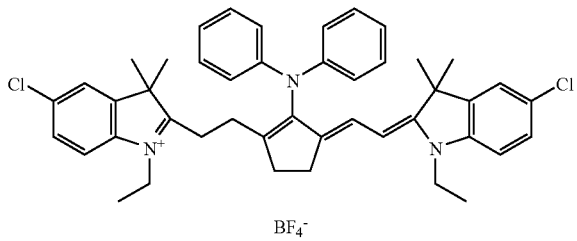

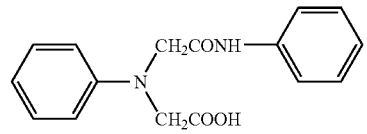
(AM-1)

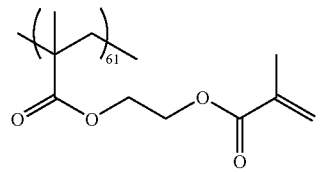
(BT-1)

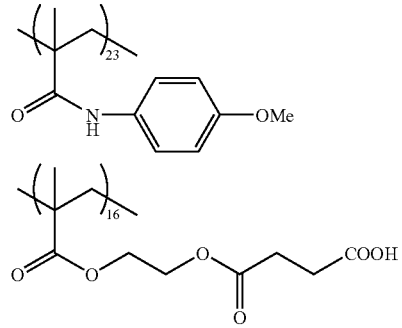

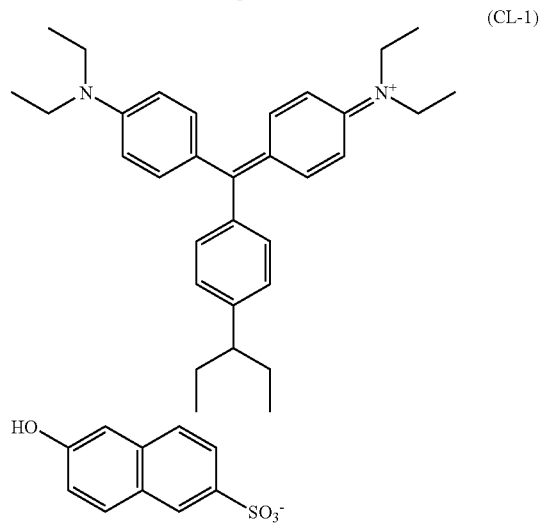
(CL-1)

Protective Layer (Overcoat Layer)

Onto the surface of the photosensitive layer, an aqueous mixture of polyvinyl alcohol (saponification degree: 98% by mole and polymerization degree of 500) and polyvinyl pyrrolidone (registered name: LUVISKOL K-30, manufactured by BASF Inc.) was applied by means of a wire bar, followed by drying with a hot-wind dryer at 125° C. for 75 sec, thereby obtaining a planographic printing plate precursor. The content ratio, polyvinyl alcohol/polyvinyl pyrrolidone, was 4/1 in terms of % by mass, and the coating amount (i.e. coating amount after drying) was 2.30 g/m².

Evaluation of Planographic Printing Plate Precursor (1) Evaluation of Sensitivity With an exposure device (TRENDSETTER 3244VX (trade name, manufactured by Creo Inc.) equipped with a water-cooled 40 W infrared semiconductor laser), each of the resultant planographic printing plate precursors was exposed to light under the following conditions: the resolution was 175 lpi, the rotation speed of the outer face drum was 150 rpm, the output was in the range of from 0 to 8 W, the output being changed in increments of 0.15 as a value of log e within the above output range, the temperature was 25° C., and the relative humidity was 50%. After the exposure, washing with tap water was conducted to remove the protective layer, followed by development at 30° C. for 12 seconds by use of a LP-1310HII (trade name, by Fuji Photo Film Co., Ltd.). The developer used in the development was a solution obtained by diluting a developing agent DV-2 (trade name, manufactured by Fuji Photo Film Co., Ltd.) with water at a dilution ratio of 1:4, and the finisher used in the development was a solution obtained by diluting a finisher agent GN-2K (trade name, manufactured by Fuji Photo Film Co., Ltd.) with water at a dilution ratio 1:1.

Regarding the density of the image portion of a planographic printing plate obtained by the development, a Macbeth reflection densitometer (trade name: RD-918) was used to measure the cyan density of the image portion through a red filter equipped on the densitometer. The reciprocal number of the exposure dose necessary for making the measured density 0.8 was used as an index of sensitivity. The sensitivity of the plate of Example 1 was regarded as 100, and the sensitivity of each of the other planographic printing plates was represented in terms of a relative value thereto. A larger value indicates a higher sensitivity. The evaluation results are shown in Table 1.

(2) Evaluation of Unprocessed Storability (Evaluation of Stability with Time)

Each of the unexposed planographic printing plate precursors was stored at 45° C. and 75% RH for 3 days, and subjected exposure and development as described below, followed by measurement of the density of a non-image portion by use of a Macbeth reflection densitometer RD-918. Furthermore, each of the planographic printing plate precursors just after the preparation was also subjected to exposure and development in a similar manner, followed by measurement of the density of a non-image portion. In the example, the difference Δ between the density of the non-image portion of the unexposed planographic printing plate precursor and the density of the non-image portion of the planographic printing plate precursor just after the preparation was obtained and used as an index of the unprocessed storability. A smaller value Δ indicates better unprocessed storability. A value of 0.02 or less is a practically non-problematic level. Results are shown in Table 1.

Exposure and Development

Each of the resultant planographic printing plate precursors was mounted on the exposure device (TRENDSETTER 3244VX (trade name, manufactured by Creo Inc.) equipped with a water-cooled 40 W infrared semiconductor laser), and exposed to a solid density image having a resolution of 175 lpi under an output of 8 W, a rotation speed of the outer face drum of 206 rpm, and a plate surface energy of 100 mJ/cm². After the exposure, washing with tap water was conducted to remove the protective layer, followed by development according to the same method as that of the development process used in the (1) Evaluation of sensitivity section.

(3) Evaluation of Printing Durability and Stain Resistance

Each of the resultant planographic printing plate precursors was mounted on the exposure device (TRENDSETTER 3244VX (trade name, manufactured by Creo Inc.), and exposed to a 80% flat tint image having a resolution of 175 lpi under an output of 8 W, a rotation speed of the outer face drum of 206 rpm, and a plate surface energy of 100 mJ/cm². After the exposure, washing with tap water was conducted to remove the protective layer, followed by development according to the same method as that of the development process used in the (1) Evaluation of sensitivity section. The resultant planographic printing plate was used for printing with a printer LITHRON (trade name, manufactured by Komori Corporation), and ink that was present on the surface of the plate was removed repeatedly every 10,000 prints, with a multi-cleaner (trade name, manufactured by Fuji Photo Film Co, Ltd.). The number of printed sheets was used as an index of the printing durability. Results are shown in Table 1.

At the time of the evaluation of the printing durability, the stain resistance (before forced time-lapse test) was evaluated by visually observing ink stains of the non-image portion and evaluating it on a ten-point scale. Furthermore, stain resistance (after forced time-lapse test) was also evaluated in a similar manner by using each of the planographic printing plate precursors that had been subjected to the forced time-lapse test under 45° C. and 75% RH for 3 days. A larger numerical value indicates a higher stain resistance. An 8 or higher on the ten-point scale indicates a practical level, and a 6 on the ten-point scale indicates an allowable lower limit. Results are shown in Table 1.

TABLE 1

| | | | | | Stain Resistance | |
| --- | --- | --- | --- | --- | --- | --- |
| | Specified Polymer or Comparative Polymer | Sensitivity | Unprocessed Storability Δfog | Printing Durability (sheets) | Before Forced Time-lapse Test | After Forced Time-lapse Test |
| Example 1 | Exemplified Compound: (a-1) | 100 | 0 | 100,000 | 8 | 8 |
| Example 2 | Exemplified Compound: (a-2) | 100 | 0 | 100,000 | 9 | 8 |

TABLE 1-continued

|  | Specified Polymer or Comparative Polymer | Sensitivity | Unprocessed Storability Δfog | Printing Durability (sheets) | Stain Resistance Before Forced Time-lapse Test | Stain Resistance After Forced Time-lapse Test |
|---|---|---|---|---|---|---|
| Example 3 | Exemplified Compound: (a-3) | 100 | 0 | 100,000 | 10 | 10 |
| Example 4 | Exemplified Compound: (a-4) | 100 | 0 | 100,000 | 10 | 10 |
| Example 5 | Exemplified Compound: (a-5) | 100 | 0 | 100,000 | 10 | 10 |
| Example 6 | Exemplified Compound: (a-6) | 100 | 0 | 100,000 | 10 | 10 |
| Example 7 | Exemplified Compound: (a-7) | 100 | 0 | 90,000 | 10 | 10 |
| Example 8 | Exemplified Compound: (a-8) | 100 | 0 | 110,000 | 8 | 7 |
| Example 9 | Exemplified Compound: (a-9) | 100 | 0 | 120,000 | 10 | 10 |
| Example 10 | Exemplified Compound: (a-10) | 100 | 0 | 100,000 | 10 | 10 |
| Comparative Example 1 | (c-1) | 100 | 0 | 50,000 | 6 | 5 |
| Comparative Example 2 | (c-2) | 100 | 0 | 100,000 | 5 | 5 |
| Comparative Example 3 | (c-3) | 100 | 0 | 100,000 | 6 | 5 |
| Comparative Example 4 | (c-4) | 100 | 0 | 100,000 | 3 | 2 |
| Comparative Example 5 | (c-5) | 100 | 0 | 80,000 | 4 | 3 |
| Comparative Example 6 | (c-6) | 100 | 0 | 50,000 | 3 | 3 |

As is apparent from Table 1, the planographic printing plate precursors of the invention had excellent printing durability and excellent stain resistance.

Examples 11 to 20 and Comparative Examples 7 to 12

Support

The same support as prepared in Example 1 was used.

Undercoat Layer

The following undercoat layer coating solutions were prepared using the specified polymers or comparative polymers shown in Table 2. Each of the resultant undercoat layer coating solutions was applied onto the surface-treated aluminum support by means of a wire bar, followed by drying at 90° C. for 30 minutes. The amount of the coating solution applied onto the support was 8 mg/m$^2$.

| Undercoat Layer Coating Solution | |
|---|---|
| Specified polymer or Comparative Polymer (shown in Table 2) | 0.04 g |
| Methanol | 27 g |
| Ion exchange water | 3 g |

Photosensitive Layer

A photosensitive layer coating solution described below was prepared and then applied, by means of a wire bar, onto the aluminum support on which the undercoat layer had been formed. The resultant was dried with a hot-wind dryer at 100° C. for 60 seconds. The coating amount after the drying was 1.3 g/m$^2$.

| | |
|---|---|
| Sensitizing dye (X-1) | 0.20 g |
| Polymerization initiator (P-2) | 0.18 g |
| Polymerizable compound (glycerin methacrylate hexamethylene diisocyanate urethane prepolymer, manufactured by Kyoei Kagaku Kogyo) | 1.8 g |
| Binder polymer (allylmethacrylate/methacrylic acid/N-isopropylacrylamide; copolymerization molar ratio = 67/13/20; weight-average molecular weight determined by GPC = 13,000) | 1.9 g |
| Additive (S-1) | 0.22 g |
| Plasticizer (T-1) | 0.06 g |
| Fluorine-containing surfactant (trade name: MEGAFAC F-177, manufactured by Dainippon Ink & Chemicals, Inc., a 30% by mass solution in methyl isobutyl ketone (MIBK)) | 0.06 g |
| Thermal polymerization inhibitor (N-nitrosophenyl hydroxylamine aluminum salt) | 0.05 g |
| Pigment dispersion having the following composition | 1.7 g |
| Methyl ethyl ketone | 29.5 g |
| Propyleneglycolmonomethyl ether | 29.5 g |

Structures of the polymerization initiator (P-2), sensitizing dye (X-1), additive (S-1), and plasticizer (T-1) are shown below.

| Composition of pigment dispersion | |
|---|---|
| Pigment Blue 15:6 | 15 parts by mass |
| Allymethacryalte/methacrylic acid copolymer (copolymerization molar ratio = 83/17) | 10 parts by mass |
| Cyclohexanone | 15 parts by mass |
| Methoxypropyl acetate | 20 parts by mass |
| Propyleneglycolmonomethyl ether | 40 parts by mass |

-continued

Composition of pigment dispersion

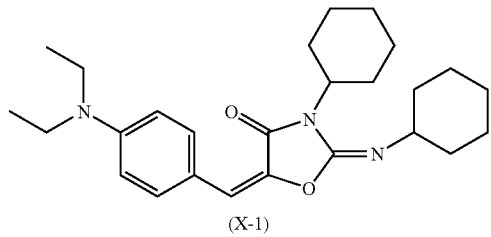

(X-1)

λ max = 385 nm

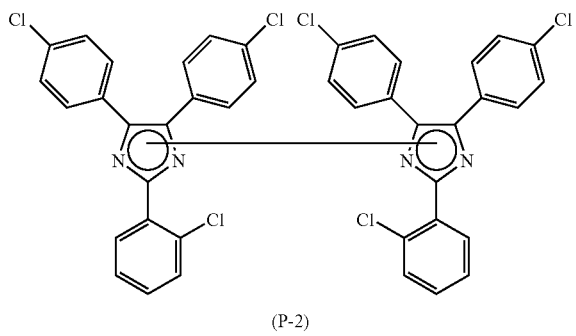

(P-2)

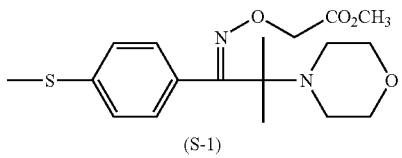

(S-1)

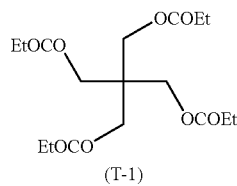

(T-1)

Protective Layer (Overcoat Layer)

Onto the surface of the photosensitive layer, an aqueous mixture of polyvinyl alcohol (saponification degree: 98% by mole and polymerization degree of 500) and polyvinyl pyrrolidone (registered name: LUVISKOL K-30, manufactured by BASF Inc.) was applied by means of a wire bar, followed by drying with a hot-wind dryer at 125° C. for 75 sec, thereby obtaining a planographic printing plate precursor. The content ratio, polyvinyl alcohol/polyvinyl pyrolidone, was 4/1 in terms of mass %, and the coating amount (i.e. coating amount after drying) was 2.30 g/m².

Evaluation of Planographic Printing Plate Precursor (1) Evaluation of Sensitivity Sensitivity of each of the resultant planographic printing plate precursors was evaluated by exposure to light with a semiconductor laser having a wavelength of 400 nm. Specifically, each of the precursors was exposed to solid image light, or exposed to halftone dot image light in which the number of dot lines was 175 lines per inch and the density of halftone dots was increased per inch from 1 to 99% with a 1% increment. Each of the exposed photosensitive materials was immersed in a developer at 25° C. for 10 seconds for development. The sensitivity under the respective exposure conditions was calculated in units of mJ/cm² from the minimum exposure light dose with which an image could be formed, and the reciprocal number of the obtained value of the sensitivity was used as an index of sensitivity. A larger value indicates a higher sensitivity. In Table 2, the sensitivity of the plate of Example 11 was regarded as 100, and the sensitivity of each of the other planographic printing plates was represented in terms of a relative value thereto. A larger value indicates a higher sensitivity. The evaluation results are shown in Table 2.

Composition of Developer

An aqueous solution having the following composition and a pH of 12.0 was used as the developer.

| | |
|---|---|
| Potassium hydroxide | 0.2 g |
| 1 K potassium silicate (SiO₂/K₂O = 1.9) | 2.4 g |
| The following compound A | 5.0 g |
| Ethylenediamine tetraacetate•4Na salt | 0.1 g |
| Water | 91.3 g |

Compound A

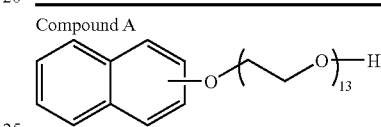

(2) Evaluation of Unprocessed Storability (Evaluation of Storage Stability)

Values of halftone dot areas of the printing plates, which had been subjected to the evaluation of sensitivity, were determined using a ccDOT (trade name, manufactured by Centurfax) under conditions in which the image setting of an exposure device was 20%, 30%, 40%, and 50%, respectively, and the average value $X_0$ thereof was obtained. Moreover, after the same printing plates were stored at a high temperature condition of 60° C. for 10 days, the printing plates were subjected to laser light exposure under the same exposure conditions (i.e. image setting of an exposure device at 20%, 30%, 40%, and 50%, respectively) and then subjected to development as described above, whereby values of the halftone dot areas of the printing plates after high temperature storage were determined, and the average value $X_{10}$ thereof was obtained. The difference between the average value $X_0$ before the high temperature storage and the average value $X_{10}$ after the high temperature storage (i.e. $X_0-X_{10}$) was obtained. A smaller $(X_0-X_{10})$ value indicates higher storage stability, and it is preferable that the $(X_0-X_{10})$ value is 5 or less from the viewpoint of storage stability. Results are shown in Table 2.

(3) Evaluation of Printing Durability and Stain Resistance

Each of the resultant planographic printing plate precursors was exposed to light using a semiconductor laser having a wavelength of 400 nm, at a plate surface energy of 100 μJ/cm². After the exposure, washing with tap water was conducted to remove the protective layer, followed by development similar to that used in section (1), Evaluation of sensitivity. The resultant planographic printing plate was used for printing with a printer LITHRON (trade name, manufactured by Komori Corporation), and ink that was present on the surface of the plate was removed every 10,000 prints, with a multi-cleaner (trade name, manufactured by Fuji Photo Film Co., Ltd.). The number of printed sheets was used as an index of the printing durability. Results are shown in Table 2.

At the time of the evaluation of the printing durability, the stain resistance (before a forced time-lapse test) was evaluated by visually observing ink stains of the non-image portion and evaluating according to a ten-point scale. Furthermore, stain resistance (after a forced time-lapse test) was also evaluated in a similar manner using each of the planographic printing plate precursors that had been subjected to the forced time-lapse test at 45° C. and 75% RH for 3 days. A larger numerical value indicates higher stain resistance. An 8 or higher on the ten-point scale indicates a practical level, and a 6 on the ten-point scale indicates an allowable lower limit. Results are shown in Table 2.

TABLE 2

|  | Specified Polymer or Comparative Polymer | Sensitivity | Unprocessed Storability $X_0$-$X_{10}$ | Printing Durability (sheets) | Stain Resistance Before Forced Time-lapse Test | Stain Resistance After Forced Time-lapse Test |
|---|---|---|---|---|---|---|
| | | | | | Evaluation Results | |
| Example 11 | Exemplified Compound: (a-1) | 100 | 0 | 100,000 | 8 | 8 |
| Example 12 | Exemplified Compound: (a-2) | 100 | 0 | 100,000 | 9 | 8 |
| Example 13 | Exemplified Compound: (a-3) | 100 | 0 | 100,000 | 10 | 10 |
| Example 14 | Exemplified Compound: (a-4) | 100 | 0 | 100,000 | 10 | 10 |
| Example 15 | Exemplified Compound: (a-5) | 100 | 0 | 100,000 | 10 | 10 |
| Example 16 | Exemplified Compound: (a-6) | 100 | 0 | 100,000 | 10 | 10 |
| Example 17 | Exemplified Compound: (a-7) | 100 | 0 | 90,000 | 10 | 10 |
| Example 18 | Exemplified Compound: (a-8) | 100 | 0 | 110,000 | 8 | 7 |
| Example 19 | Exemplified Compound: (a-9) | 100 | 0 | 120,000 | 10 | 10 |
| Example 20 | Exemplified Compound: (a-10) | 100 | 0 | 100,000 | 10 | 10 |
| Comparative Example 7 | (c-1) | 100 | 0 | 50,000 | 6 | 5 |
| Comparative Example 8 | (c-2) | 100 | 0 | 100,000 | 5 | 5 |
| Comparative Example 9 | (c-3) | 100 | 0 | 100,000 | 6 | 5 |
| Comparative Example 10 | (c-4) | 100 | 0 | 100,000 | 3 | 2 |
| Comparative Example 11 | (c-5) | 100 | 0 | 80,000 | 4 | 3 |
| Comparative Example 12 | (c-6) | 100 | 0 | 50,000 | 3 | 3 |

As is apparent from Table 2, the planographic printing plate precursors of the invention had excellent printing durability and excellent stain resistance.

What is claimed is:

1. A negative-working photosensitive material, comprising:
    a support;
    an undercoat layer; and
    a photosensitive layer including a polymerization initiator, a polymerizable compound, and a binder polymer,
    wherein:
    the support, the undercoat layer, and the photosensitive layer are sequentially layered;
    the undercoat layer includes a polymer including a structural unit (a) including at least one of a carboxylic acid or a carboxylic acid salt and a structural unit (b) including at least one carboxylic acid ester; and
    the content of the structural unit (a) in the polymer is from 30% to 90% by mole.

2. The negative-working photosensitive material of claim 1, wherein the polymer including the structural unit (a) and the structural unit (b) is substantially free from acid other than carboxylic acid.

3. The negative-working photosensitive material of claim 1, wherein the structural unit (a) is represented by the following formula (a):

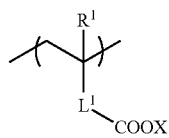

Formula (a)

wherein, in formula (a), $R^1$ represents a hydrogen atom, a substituent having 1 to 30 carbon atoms, or a halogen atom; X represents a hydrogen atom or a counter cation necessary to neutralize a charge; and $L^1$ represents a single bond or a divalent linking group.

4. The negative-working photosensitive material of claim 3, wherein the substituent which is represented by $R^1$ and has 1 to 30 carbon atoms is selected from the group consisting of a methyl group, an ethyl group, a propyl group, a butyl group, a pentyl group, a hexyl group, a cyclohexyl group, a methoxy group, an ethoxy group, a butoxy group, an acetoxy group, a propionyloxy group, a methoxycarbonyl group, an ethoxycarbonyl group, and a cyano group; and the halogen atom represented by $R^1$ is selected from the group consisting of a fluorine atom, a chlorine atom, a bromine atom, and an iodine atom.

5. The negative-working photosensitive material of claim 3, wherein the divalent linking group represented by $L^1$ is selected from the group consisting of an arylene group, a carbonyl group, —$CR_2$—, —O—, —C=O—, —S—, —S=O—, —S(=O)$_2$—, —NR—, a vinylene group, a phenylene group, a cycloalkylene group, a naphthylene group, a biphenylene group, and a combination of these structural units, wherein R represents a hydrogen atom or a substituent.

6. The negative-working photosensitive material of claim 3, wherein the counter cation which is represented by X and is necessary to neutralize a charge is an alkali metal ion, a group-II metal ion, a metal ion of metals other than the group-II metal, an ammonium ion, or an organic ammonium ion.

7. The negative-working photosensitive material of claim 1, wherein the structural unit (b) including at least one carboxylic acid ester is represented by the following formula (b):

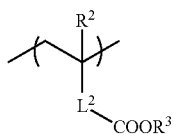

Formula (b)

wherein, in formula (b), $R^2$ represents a hydrogen atom, a substituent having 1 to 30 carbon atoms, or a halogen atom; $R^3$ represents a substituent having 1 to 30 carbon atoms; and $L^2$ represents a single bond or a divalent linking group.

8. The negative-working photosensitive material of claim 7, wherein the substituent which is represented by $R^2$ and has 1 to 30 carbon atoms is selected from the group consisting of a methyl group, an ethyl group, a propyl group, a butyl group, a pentyl group, a hexyl group, a cyclohexyl group, a methoxy group, an ethoxy group, a butoxy group, an acetoxy group, a propionyloxy group, a methoxycarbonyl group, an ethoxycarbonyl group, and a cyano group; and the halogen atom represented by $R^2$ is selected from a fluorine atom, a chlorine atom, a bromine atom, and an iodine atom.

9. The negative-working photosensitive material of claim 7, wherein the substituent which is represented by $R^3$ and has 1 to 30 carbon atoms is an alkyl group or an aryl group.

10. The negative-working photosensitive material of claim 7, wherein the divalent linking group represented by $L^2$ is selected from the group consisting of an arylene group, a carbonyl group, —$CR_2$—, —O—, —C=O—, —S—, —S=O—, —S(=O)$_2$—, —NR—, a vinylene group, a phenylene group, a cycloalkylene group, a naphthylene group, a biphenylene group, and a combination of these structural units, wherein R represents a hydrogen atom or a substituent.

11. The negative-working photosensitive material of claim 1, wherein the photosensitive layer further includes an infrared absorbing agent.

12. The negative-working photosensitive material of claim 1, wherein the photosensitive layer further includes a sensitizing dye having an absorption peak in a wavelength range of from 300 nm to 850 nm.

13. The negative-working photosensitive material of claim 1, wherein the content of the structural unit (b) in the polymer is from 1% to 70% by mole.

14. A negative-working planographic printing plate precursor, comprising a negative-working photosensitive material, the material including:
   a support;
   an undercoat layer; and
   a photosensitive layer including a polymerization initiator, a polymerizable compound, and a binder polymer, wherein:
   the support, the undercoat layer, and the photosensitive layer are sequentially layered;
   the undercoat layer includes a polymer including a structural unit (a) including at least one of a carboxylic acid or a carboxylic acid salt and a structural unit (b) including at least one carboxylic acid ester; and
   the content of the structural unit (a) in the polymer is from 30% to 90% by mole.

15. The negative-working planographic printing plate precursor of claim 14, further comprising a photosensitive layer, wherein:
   a coating amount of the photosensitive layer is from about 0.1 g/m$^2$ to about 10 g/m$^2$ in terms of dry mass.

* * * * *